(12) United States Patent
Sasaki et al.

(10) Patent No.: US 7,915,723 B2
(45) Date of Patent: Mar. 29, 2011

(54) TRANSISTOR ARRAY, MANUFACTURING METHOD THEREOF AND IMAGE PROCESSOR

(75) Inventors: Kazuhiro Sasaki, Sagamihara (JP); Hiroshi Matsumoto, Machida (JP); Shinobu Sumi, Tama (JP)

(73) Assignee: Casio Computer Co., Ltd., Tokyo (JP)

( * ) Notice: Subject to any disclaimer, the term of this patent is extended or adjusted under 35 U.S.C. 154(b) by 28 days.

(21) Appl. No.: 11/046,380

(22) Filed: Jan. 28, 2005

(65) Prior Publication Data

US 2005/0176194 A1 Aug. 11, 2005

(30) Foreign Application Priority Data

Jan. 29, 2004 (JP) ................... 2004-020968
Feb. 12, 2004 (JP) ................... 2004-035622
Feb. 17, 2004 (JP) ................... 2004-039371

(51) Int. Cl.
*H01L 23/02* (2006.01)
(52) U.S. Cl. .................. 257/686; 257/777; 438/197
(58) Field of Classification Search .................. 438/197; 257/686, 777
See application file for complete search history.

(56) References Cited

U.S. PATENT DOCUMENTS 5,574,292 A * 11/1996 Takahashi et al.
5,815,223 A * 9/1998 Watanabe et al.
6,097,453 A * 8/2000 Okita
6,627,953 B1 * 9/2003 Vu et al.
6,835,586 B2 * 12/2004 Yamazaki et al.
6,911,675 B2 * 6/2005 Kato et al.
7,037,752 B2 * 5/2006 Kuwabara et al.
(Continued)

FOREIGN PATENT DOCUMENTS

JP 05-009794 1/1993
(Continued)

OTHER PUBLICATIONS

A Japanese Office Action dated Mar. 31, 2008 (and English translation thereof) issued in counterpart Japanese Patent Application 2004-020968.

*Primary Examiner* — Andy Huynh
*Assistant Examiner* — David Goodwin
(74) *Attorney, Agent, or Firm* — Holtz, Holtz, Goodman & Chick, PC

(57) ABSTRACT

An image processor by way of a transistor array in which a plurality of transistors are formed on a substrate comprising a plurality of polysilicon thin-film transistors using a first semiconductor layer composed of polysilicon formed on the substrate and functional devices having a plurality of amorphous silicon thin-film transistors using a second semiconductor layer composed of amorphous silicon which are formed in an upper layer more superior than the first semiconductor layer. The polysilicon thin-film transistors and functional devices include a plurality of electrode layers composed of a conductor layer, for instance, the functional devices at least of any one of the electrode layers are formed in the same layer as any one the electrode layers of the polysilicon thin-film transistors.

1 Claim, 35 Drawing Sheets

U.S. PATENT DOCUMENTS

| | | | |
|---|---|---|---|
| 7,067,926 B2 * | 6/2006 | Yamazaki et al. | |
| 7,067,929 B2 * | 6/2006 | Hanaoka et al. | 257/784 |
| 7,078,274 B2 * | 7/2006 | Yamada | |
| 7,105,422 B2 * | 9/2006 | Utsunomiya | |
| 2003/0141504 A1 * | 7/2003 | Kuwabara et al. | 257/66 |
| 2003/0169380 A1 * | 9/2003 | Arao | 349/43 |
| 2004/0029338 A1 * | 2/2004 | Yamazaki et al. | |
| 2004/0130020 A1 * | 7/2004 | Kuwabara et al. | |
| 2006/0214306 A1 * | 9/2006 | Yamazaki et al. | |

FOREIGN PATENT DOCUMENTS

| | | |
|---|---|---|
| JP | 06-125084 A | 5/1994 |
| JP | 08-008414 | 1/1996 |
| JP | 08-256292 A | 10/1996 |
| JP | 2001-03060 A | 2/2001 |
| JP | 2001-094722 A | 4/2001 |
| JP | 2003-149665 | 5/2003 |
| JP | 2003-298036 A | 10/2003 |

* cited by examiner

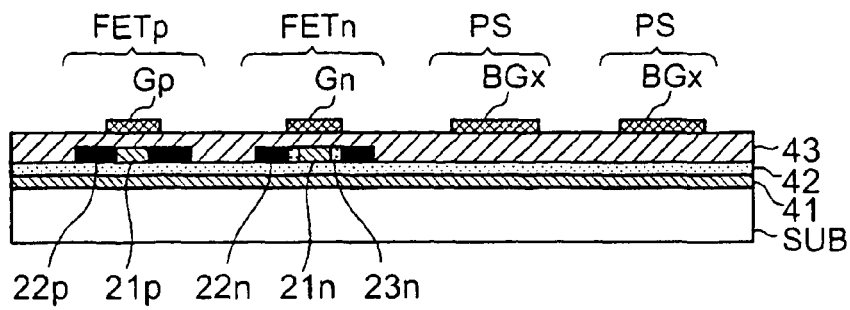
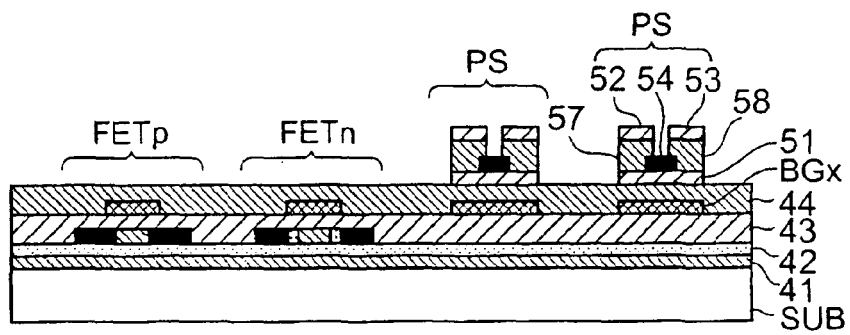
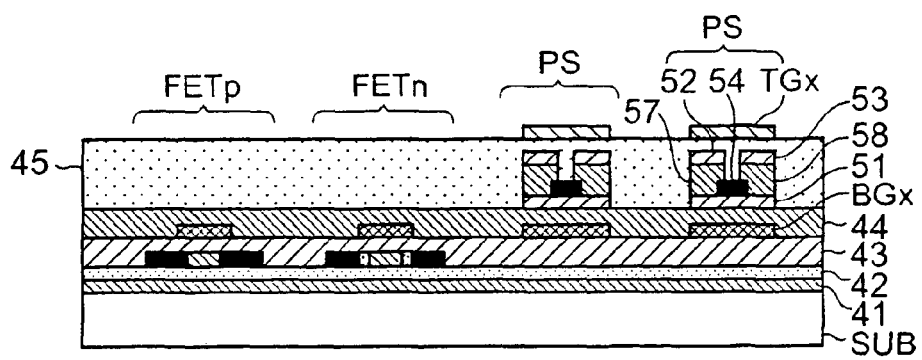
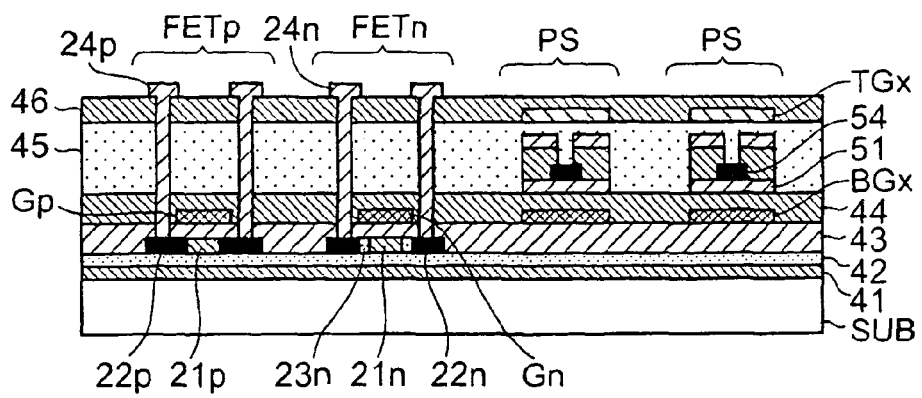

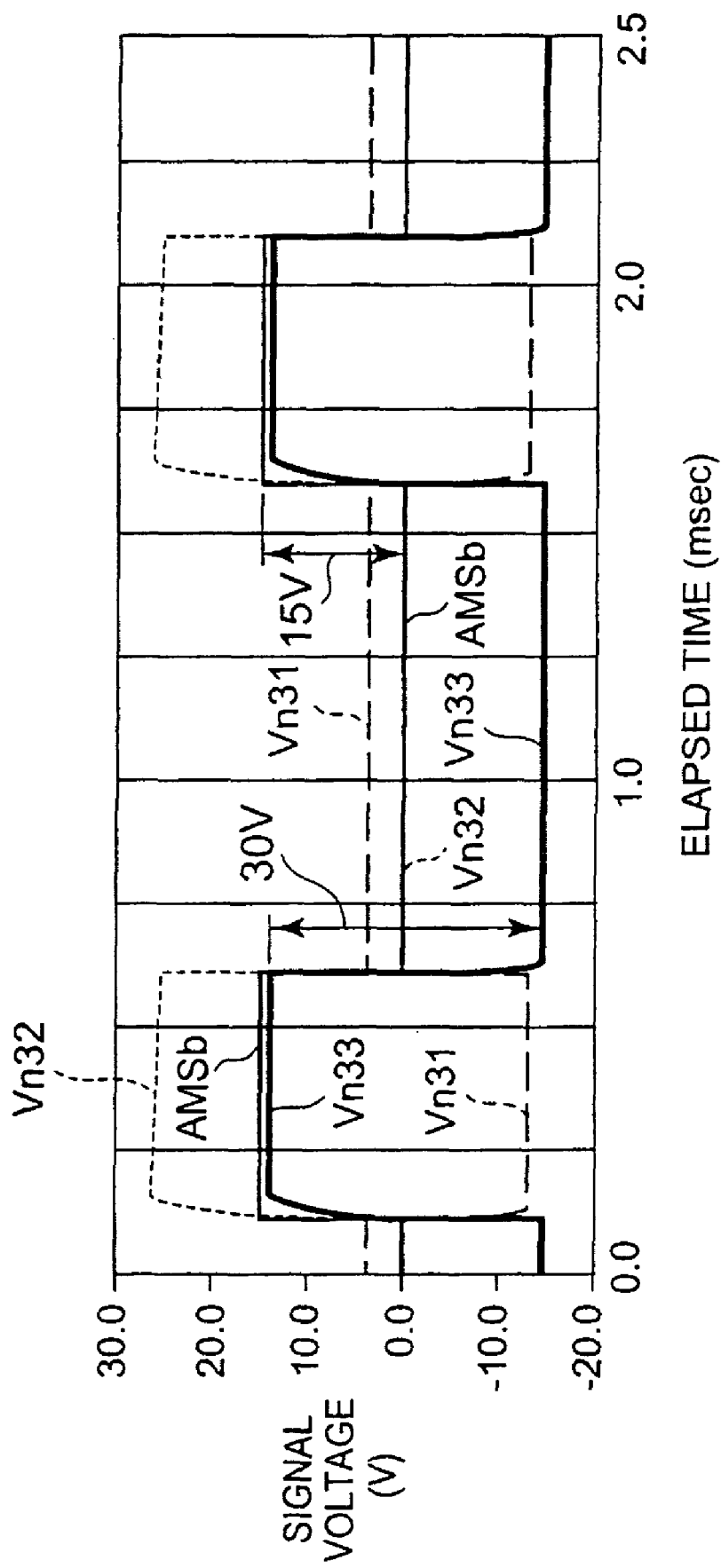

TRANSISTOR ARRAY, MANUFACTURING METHOD THEREOF AND IMAGE PROCESSOR

CROSS-REFERENCE TO RELATED APPLICATIONS

This application is based upon and claims the benefit of priority from the prior Japanese Patent Applications No. 2004-020968, filed Jan. 29, 2004; No. 2004-035622, filed Feb. 12, 2004; and No. 2004-039371, filed Feb. 17, 2004, the entire contents of which is incorporated herein by reference.

BACKGROUND OF THE INVENTION

1. Field of the Invention

The present invention relates to a transistor array, the manufacturing method thereof and an image processor which uses the same. More particularly, the present invention relates to the element structure of a transistor array configuration comprising polysilicon thin-film transistors and amorphous silicon thin-film transistors, the associated manufacturing method and an image processor that applies the aforesaid transistor array.

2. Description of the Related Art

Recently, Research and Development (R&D) has become more highly advanced for applying personal authentication technology (biometric technology) to identify a specific individual using a "living characteristic" of a person's body data including fingerprint scans. Due to the public's ever-increasing security and privacy concerns, personal authentication has become essential in providing secure services such as electronic banking, credit card transactions, etc.

Meanwhile in past few years, Liquid Crystal Displays (LCDs) and plasma displays have experienced phenomenal growth in use as displays and video device monitors for such items as personal computers, televisions, etc. Furthermore, R&D is rapidly moving toward proliferation and full-scale utilization of a display which applies self-luminescence devices as the next generation of display devices such as organic electroluminescent devices (hereinafter, denoted as "organic EL devices"), Light Emitting Diodes (LEDs), etc.

As applied to the personal authentication technology (fingerprint authentication technology) mentioned above, an image processor, an LCD, or an image display device composed of an organic EL display for example is formed on the substrate insulation of a glass substrate. Also, the pixel array is composed of display pixels or photosensor reading pixels in a two-dimensional array and has a configuration comprising a driver circuit for driving the pixel array.

Here, for instance, to promote lower cost or miniaturization of image display devices, development of an image display device with a hybrid driver circuit is actively being designed and put in practical use which integrates the driver circuit on the same substrate as the integral display pixels. In an LCD with such a hybrid driver circuit, a configuration is known in which the driver circuit composes polysilicon thin-film transistors; whereas the driver elements in the display pixels compose amorphous silicon thin-film transistors. In this case, while acquiring relatively favorable operating characteristics by using polysilicon thin-film transistors for the driver circuit, stabilized driver element operating characteristics can be obtained by using amorphous silicon thin-film transistors for the driver elements in the display pixels.

However, in the image processor and/or the image display device stated above, both apparatus have disadvantages as defined in the following justification. Namely, in the preceding configuration wherein the driver circuit is composed using polysilicon thin-film transistors and the driver elements in the display pixels of the pixel array are composed using amorphous silicon thin-film transistors with the polysilicon thin-film transistors and the amorphous silicon thin-film transistors formed together on a common substrate. In this case, the polysilicon thin-film transistors are fabricated in a polysilicon layer by crystallizing, for example by laser irradiation, the amorphous silicon film formed on the substrate. Because these☐ @devices (components) are formed using this polysilicon layer, insofar as fabricating the amorphous silicon thin-film transistors and the polysilicon thin-film transistors on a single substrate, the polysilicon thin-film transistors are formed by selectively crystallizing only the driver circuit formation areas after the amorphous silicon film is formed on the substrate. Thus a☐ @separate processing step is needed to partially create the polysilicon layer. For this reason, during crystallization of the amorphous silicon film by laser irradiation for instance, it is necessary to selectively crystallize the amorphous silicon film using a thin laser beam scan while controlling the laser radiator position with high precision. Accordingly, there is a disadvantage in needing highly accurate manufacturing equipment which requires a relative lengthy period to accomplish the crystallizing process and ultimately adds to the production costs.

Furthermore, when annealing the amorphous silicon film, it is difficult to separate distinctly between the areas to crystallize and the areas not to crystallize as this process is performed by preheating the amorphous silicon film to a temperature in the order of 600 degrees Celsius. Accordingly, there is a disadvantage in that it is difficult to arrange the driver circuit composed of polysilicon thin-film transistors and the pixel array composed of amorphous silicon thin-film transistors within sufficient proximity on the substrate.

SUMMARY OF THE INVENTION

The transistor array comprising polysilicon thin-film transistors and amorphous silicon thin-film transistors of the present invention and an image processor using the transistor array have several advantages such as providing a sophisticated element structure with highly reliable operating characteristics as well as its unique manufacturing method. Furthermore, the present invention☐ @reduces the component count, shortens the manufacturing process and attains a more compact size and thin-shaped design.

The first transistor array in the present invention for acquiring the above-stated advantages is a transistor array provided with a plurality of transistors formed on a single insulating substrate comprising at least a plurality of polysilicon thin-film transistors using a first semiconductor layer composed of polysilicon formed on the substrate; functional devices having a plurality of amorphous silicon thin-film transistors structures using a second semiconductor layer composed of amorphous silicon formed on the substrate; and the second semiconductor layer is formed in an upper layer more superior than the first semiconductor layer based on the substrate.

The polysilicon thin-film transistors and the functional devices one another have a plurality of electrode layers composed of a conductor layer; and wherein at least any one of the electrode layers of the functional devices are formed in the same layer as any one of the electrode layers of the polysilicon thin-film transistors.

The transistor array comprises a plurality of interlayer connection wiring composed of a plurality of conductor layers for connecting these to one another of the plurality of polysilicon thin-film transistors, one another of the functional devices, and one another of the plurality of polysilicon thin-film transistors and the plurality of functional devices; and the plurality of interlayer connection wiring contain at least one common conductor layer.

The transistor array comprises a pixel array which performs a two-dimensional array of a plurality of pixels composed of the functional devices which are situated in predetermined areas on the substrate; and a driver circuit formed in an adjacent area which adjoins the pixel array and formed at least having the polysilicon thin-film transistors. The driver circuit comprises at least an output circuit section which generates and outputs a drive control signal having a predetermined signal level to the pixels; wherein the output circuit section includes at least an input stage inverter circuit in which a first input signal having a first voltage amplitude and a second input signal which is an inverted signal of the first input signal is inputted separately, and generates a third input signal which is an inverted signal of the first input signal; an output stage inverter circuit in which a signal voltage based on the first input signal and the third input signal is inputted separately, and generates an output signal having a second voltage amplitude greater than the first voltage amplitude; and @a bootstrap circuit section which holds the potential difference of the first input signal and the output signal as a voltage component, and boosts the signal voltage inputted into the output stage inverter circuit; and wherein at least the input stage inverter circuit, the output stage inverter circuit and the bootstrap circuit section configuration includes only the amorphous silicon thin-film transistors which have single channel polarity.

Each of the plurality of the pixels includes a double-gate type thin-film transistor structured photosensor comprising a source electrode and drain electrode which are each other formed across the channel region composed of the second semiconductor layer; a first gate electrode and a second gate electrode which are each other formed in the upper side and lower side of the channel region via an insulating layer; wherein the driver circuit comprises a first scanning driver circuit provided with the output circuit section which applies at least a reset pulse to the first gate electrode for initializing the photosensors; and the output circuit section configuration includes only the amorphous silicon thin-film transistors. The driver circuit further comprises a second scanning driver circuit which applies a read-out pulse to the second gate electrode; and the second scanning driver circuit configuration includes only the polysilicon thin-film transistors.

The second transistor array in the present invention for acquiring the above-stated advantages is a transistor array with a plurality of transistors formed on a single insulating substrate comprising at least a driver circuit which comprises a configuration which includes polysilicon thin-film transistors using a first semiconductor layer composed of polysilicon and amorphous silicon thin-film transistors using a second semiconductor layer composed of amorphous silicon. The second semiconductor layer is formed in an upper layer more superior than the first semiconductor layer based on the substrate. The above-mentioned transistor array, further a pixel array performs a two-dimensional array on the substrate; and the driver circuit operates each pixel by a preferred drive state. @The driver circuit comprises at least an output circuit section which generates and outputs a drive control signal having a predetermined signal level to the pixels. The output circuit has an output circuit section which generates the drive control signal. The output circuit section of the configuration includes only the amorphous silicon thin-film transistors.

The third transistor array in the present invention for acquiring the above-stated advantages is a transistor array with a plurality of transistors formed on a single insulating substrate. A driver circuit which comprises a level shift circuit which generates a signal having a predetermined signal level and a configuration which includes only amorphous silicon thin-film transistors which use a semiconductor layer composed of amorphous silicon and have single channel polarity; wherein the output circuit section includes at least an input stage inverter circuit in which a first input signal having a first voltage amplitude and a second input signal which is an inverted signal of the first input signal is inputted separately, and generates a third input signal which is an inverted signal of the first input signal; an output stage inverter circuit in which a signal voltage based on the first input signal and the third input signal is inputted separately, and generates an output signal having a second voltage amplitude greater than the first voltage amplitude; and a bootstrap circuit section which holds the potential difference of the first input signal and the output signal as a voltage component, and boosts the signal voltage inputted into the output stage inverter circuit. The input stage inverter circuit comprises at least a first switching element in which the second input signal is inputted into a control terminal and a second switching element in which the first input signal is inputted into a control terminal with the current path connected in series between a first power supply voltage and a second power supply voltage, wherein the electric potential at a connection contact of the first switching element and the second switching element is outputted as the third input signal. The output stage inverter circuit comprises at least a third switching element in which the signal voltage based on the first input signal is inputted into a control terminal and a fourth switching element in which the third input signal is inputted into a control terminal with the current path connected in series between the first power supply voltage and the second power supply voltage, wherein the output signal is outputted as a scanning signal from a connection contact of the third switching element and the fourth switching element. The bootstrap circuit section in which a capacitative element which stores the voltage component is formed between the control terminal of the third switching element and connection contacts of the third switching element and the fourth switching element, and a fifth switching element which is connected to the third switching element control terminal and impedes migration of an electric charge held in the capacitative element.

The image processor in the present invention for acquiring the above-stated advantages comprises at least a driver circuit which comprises a configuration which includes polysilicon thin-film transistors using a first semiconductor layer composed of polysilicon; a pixel array which performs a two-dimensional array of a plurality of pixels composed of amorphous silicon thin-film transistors formed using a second semiconductor layer composed of amorphous silicon; and the driver circuit and each of the pixels are formed in one unit on a single insulating substrate. The second semiconductor layer is formed in an upper layer more superior than the first semiconductor layer based on the substrate. The polysilicon thin-film transistors and the pixels have each other a plurality of electrode layers composed of a conductor layer; and wherein at least of any one of the electrode layers of the pixels are formed in the same layer as any one of the electrode layers of the polysilicon thin-film transistors. The image processor which further comprises a wiring connection area composed of a plurality of interlayer connection wiring containing a plurality of conductor layers for connecting these to one another of the plurality of polysilicon thin-film transistors and the plurality of the pixels, and wherein the plurality of interlayer connection wiring comprises at least one common conductor layer. The pixels are display pixels which display desired image information. The driver circuit comprises a scanning driver circuit which outputs a scanning signal for setting the pixels in the pixel array to a selection state; the scanning driver circuit comprises at least a level shift circuit which outputs the scanning signal; and the level shift circuit is formed using a second semiconductor layer of only the amorphous silicon thin-film transistors.

Additionally, each of the plurality of the pixels includes a double-gate type thin-film transistor structured photosensor comprising a first gate electrode and a second gate electrode which are each other formed in the upper side and lower side of the channel region via an insulating layer and a detection surface on which an image of a detectable object is placed; the driver circuit comprises at least a first scanning driver circuit provided with a level shift circuit which applies a reset pulse for initializing the photosensors to the first gate electrode and the level shift circuit configuration includes only the amorphous silicon thin-film transistors using the second semiconductor layer. The driver circuit further comprises a second scanning driver circuit which applies a read-out pulse to the second gate electrode; and the second scanning driver circuit configuration includes only the polysilicon thin-film transistors.

The level shift circuit includes at least an input stage inverter circuit in which a first input signal having a first voltage amplitude and a second input signal which is an inverted signal of the first input signal is inputted separately, and generates a third input signal which is an inverted signal of the first input signal; an output stage inverter circuit in which a signal voltage based on the first input signal and the third input signal is inputted separately, and generates an output signal having a second voltage amplitude greater than the first voltage amplitude; and a bootstrap circuit section which holds the potential difference of the first input signal and the output signal as a voltage component, and boosts the signal voltage inputted into the output stage inverter circuit; and wherein at least the input stage inverter circuit, the output stage inverter circuit and the bootstrap circuit section configuration includes only the amorphous silicon thin-film transistors which have single channel polarity.

A manufacturing method of the transistor array in the present invention for acquiring the above-stated advantages is a transistor array with a plurality of transistors formed on a single insulating substrate includes the following at least a process which forms a first semiconductor layer composed of polysilicon on the substrate; a process which forms the polysilicon thin-film transistors using the first semiconductor layer; a process which forms a second semiconductor layer composed of amorphous silicon on an upper layer side more superior than the first semiconductor layer; and a process which forms functional devices having an amorphous silicon thin-film transistor structure using the second semiconductor layer. The manufacturing method of the above mentioned transistor array includes a process which forms a driver circuit for operating the functional devices at least using the polysilicon thin-film transistors. The manufacturing method of the above-mentioned transistor array includes a process which forms amorphous silicon thin-film transistors using the second semiconductor layer; and wherein the process which forms the driver circuit, includes the process which forms the driver circuit using the polysilicon thin-film transistors and the amorphous silicon thin-film transistors. The process which forms the first semiconductor layer is accomplished below a first temperature condition; and the process which forms the second semiconductor layer is accomplished below a second temperature condition whose highest temperature is lower than the first temperature condition. The process which forms the polysilicon thin-film transistors and the process which forms the functional devices, includes the process which forms one another of a plurality of electrode layers composed of a conductor layer; and wherein the process which forms the plurality of electrode layers includes a process which simultaneously forms at least any one of the electrode layers of the functional devices and at least any one of the electrode layers of the polysilicon thin-film transistors.

The functional devices are amorphous silicon thin-film transistors which use the second semiconductor layer, and the process which simultaneously forms the electrode layers simultaneously forms the gate electrode of the amorphous silicon transistors with the gate electrode of the polysilicon thin-film transistors. Otherwise, the functional devices have a double-gate type thin-film transistor structure comprising a first gate electrode and a second gate electrode which are each other formed on the upper side and lower side of the second semiconductor layer via an insulating layer; and the process which simultaneously forms the electrode layers, simultaneously forms the second gate electrode with the gate electrode of the polysilicon thin-film transistors.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIGS. 11A~D are process cross-sectional diagrams showing the transistor array manufacturing method having the element structure related to the fourth embodiment;

FIG. 35 is a simulation result showing conversion of the signal voltage in each terminal and contact of the level shift circuit section related to the example configuration.

DETAILED DESCRIPTION OF THE PREFERRED EMBODIMENTS

Figure 1:
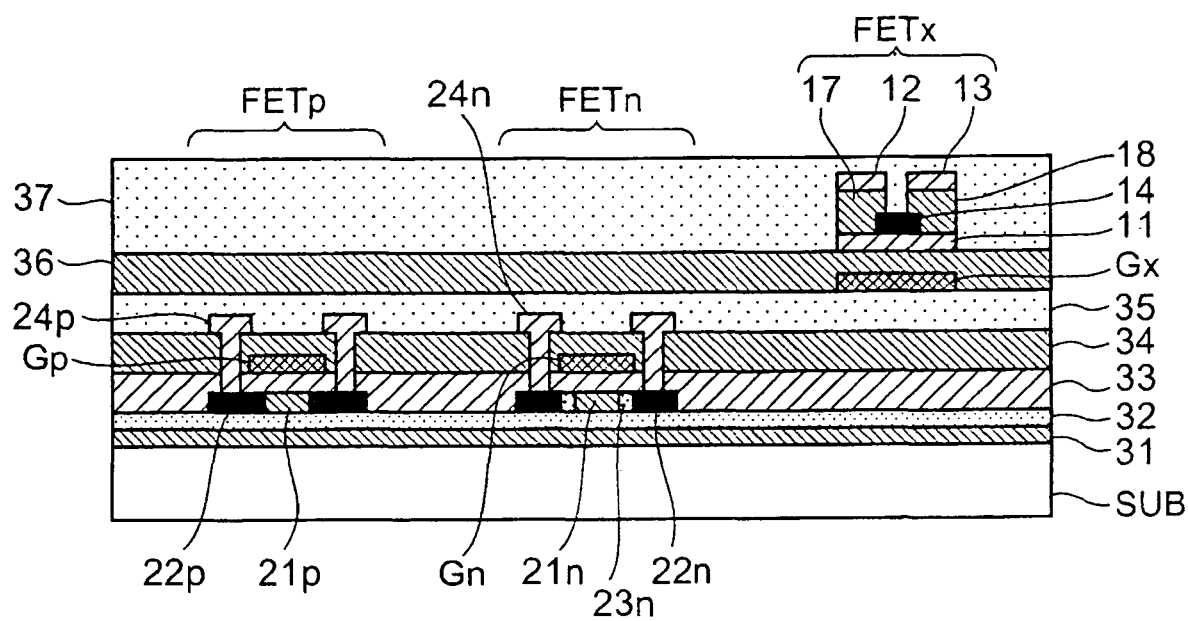
FIG. 1 is an outline cross-sectional diagram showing the first embodiment of a transistor array element structure related to the present invention.

Hereinafter, a transistor array, its manufacturing method and an image processor related to the present invention will be explained in detail based on the preferred embodiments shown in the drawings.

First Embodiment

Initially, the transistor array related to the present invention and its manufacturing method will be explained.
(Element Structure)

FIG. 1 is an outline cross-sectional diagram showing the first embodiment of a transistor array element structure related to the present invention.

Here, FIG. 1 only shows one or several of each field effect transistor (thin-film transistor) using a polysilicon semiconductor layer and an amorphous silicon semiconductor layer in order to simplify explanation. Also, omitted from the drawing is the wiring layer which connects them to one another and the external connection wiring, etc. for connecting with a peripheral device.

The transistor array element structure related to the first embodiment, as shown in FIG. 1 for example, has a configuration formed in one unit intermingled with P-channel and N-channel types of field effect transistors FETp, FETn (low-temperature polysilicon thin-film transistors) using a semiconductor layer composed of low-temperature polysilicon (polysilicon semiconductor layer; first semiconductor layer), as well as N-channel type field effect transistors FETx (amorphous silicon thin-film transistors; functional devices) using a semiconductor layer composed of amorphous silicon (amorphous silicon semiconductor layer; second semiconductor layer) in predetermined areas on the surface side of a single insulating substrate SUB (baseplate).

Specifically, as shown in FIG. 1 for example, the P-channel field effect transistors FETp have a configuration of a semiconductor layer $21p$, an impurity layer $22p$, a gate electrode Gp and an electrode layer $24p$ among an insulating layer 31, 32, 33, 34. The semiconductor layer $21p$ defines a p-type channel region which is composed of low-temperature polysilicon on the upper side of the insulating layer 31 of Silicon Nitride (SiN) film, etc. and the insulating layer 32 of Silicon Oxide ($SiO_2$) film, etc. each formed on the surface side of the substrate SUB. The impurity layer $22p$ (ohmic contact layer) is composed of p+ silicon implanted on both sides of the semiconductor layer $21p$. The gate electrode Gp contains a conductor layer composed of an electrically conductive material selected from chromium, chromium alloy, aluminum, aluminum alloy, etc. which is implanted on the upper side of the semiconductor layer $21p$ (drawing upper part) via the insulating layer 33 (gate insulating film). The electrode layer $24p$ (source electrode and drain electrodes) contains a conductor layer composed of an electrically conductive material selected from chromium, chromium alloy, aluminum, aluminum alloy, etc. which is connected to each impurity layer $22p$ via contact holes formed in the insulating layer 34 laminated on the upper side of the gate electrode Gp and the above-mentioned insulating layer 33.

Further, as shown in FIG. 1 for example, the N-channel field effect transistors FETn have a configuration of a semiconductor layer 21n, an impurity layer 22n, an impurity layer 23n, a gate electrode Gn and an electrode layer 24n. The semiconductor layer 21n defines an N-type channel region composed of low-temperature polysilicon which is implanted on the upper side of the previously mentioned insulating layer 31, 32 formed on the surface side of the substrate SUB. The impurity layer 22n (ohmic contact layer) is composed of n+ silicon implanted on both sides (outer n+ sides) as well as the impurity layer 23n which is composed of n− silicon implanted on both sides (inner n− sides) of the semiconductor layer 21n. The gate electrode Gn contains a conductor layer composed of an electrically conductive material selected from chromium, chromium alloy, aluminum, aluminum alloy, etc. which is implanted on the upper side of the semiconductor layer 21n via the same previously mentioned insulating layer 33 (gate insulating film). The electrode layer 24n (source and drain electrodes) is composed of an electrically conductive material selected from chromium, chromium alloy, aluminum, aluminum alloy, etc. connected to each impurity layer 22n via contact holes formed in the same previously mentioned insulating layer 34 laminated on the upper side of the gate electrode Gn and the insulating layer 33.

Moreover, as shown in FIG. 1 for example, the field effect transistors FETx have a configuration of a gate electrode Gx, a semiconductor layer 11, an impurity layer 17, 18, an electrode layer 12, 13, among an insulating layer 35, 36, a block insulating layer 14 and an insulating layer 37. The gate electrode Gx contains a conductor layer composed of an electrically conductive material selected from chromium, chromium alloy, aluminum, aluminum alloy, etc. implanted on the upper side of the insulating layer 35 (Silicon Nitride (SiN) film) which covers the electrode layer 24p, 24n (source and drain electrodes) provided in the above-mentioned field effect transistors FETp, FETn within the laminated structure on the surface side of the above-stated substrate SUB. The semiconductor layer 11 (amorphous silicon semiconductor layer) defines a channel region composed of amorphous silicon which is implanted on the upper side of the gate electrode Gx via the insulating layer 36. The block insulating layer 14 (stopper film) is formed on the upper side of the semiconductor layer 11 with Silicon Nitride (SiN) film. The impurity layer 17, 18 (ohmic contact layer) composed of n+ silicon are implanted on both sides of the block insulating layer 14 on the upper side of the semiconductor layer 11. The electrode layer 12, 13 (the source electrode 12 and the drain electrode 13) contains a conductor layer composed of an electrically conductive material selected from chromium, chromium alloy, aluminum, aluminum alloy, etc. The insulating layer 37 (protective insulating layer) is laminated on the upper side of the insulating layer 36 including the semiconductor layer 11, the block insulating layer 14 as well as the source electrode 12 and the drain electrode 13.

Namely, in the element structure as shown in FIG. 1, the field effect transistors FETx are formed independently of one another without sharing the same electrode layer relative to the field effect transistors FETp, FETn. Also, the field effect transistors FETx have a configuration fabricated in an upper layer more superior than the field effect transistors FETp, FETn based on the substrate SUB.

In other words, this refers to having a configuration provided with an upper layer of at least the semiconductor layer 11 (channel region) applied to the field effect transistors FETx composed of amorphous silicon as opposed to the semiconductor layer 21p, 21n (channel region) composed of low-temperature polysilicon applied to the P-channel and N-channel field effect transistors FETp, FETn criteria (substrate SUB).

(Manufacturing Method)

Next, the manufacturing method of the transistor array having the element structure described above will be explained with reference to the drawings.

FIGS. 2A~D, FIGS. 3A~D and FIGS. 4A~C are process cross-sectional diagrams showing the transistor array manufacturing method having the element structure related to the first embodiment.

Additionally, in the following description the annotations of the "$1^{st}$ process" through the "$11^{th}$ process" are used for convenience in the explanation and there may be optional supplemental processes in the interim. Also, there can be a modification to other processes where substitution is possible which are not directly related to the actual manufacturing process.

Figure 2A:
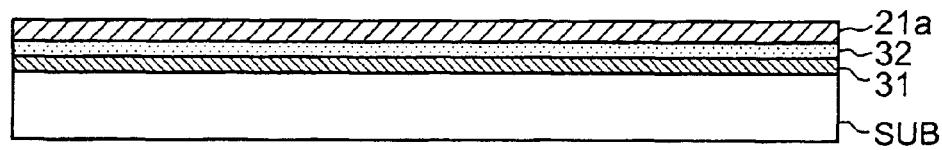
FIGS. 2A~D, FIGS. 3A~D and FIGS. 4A~C are process cross-sectional diagrams showing the transistor array manufacturing method having the element structure related to the first embodiment.

Initially, in the $1^{st}$ process as shown in FIG. 2A, a sequentially laminated structure consisting of the insulating layer 31 (Silicon Nitride (SiN) film) composed of Silicon Nitride, the insulating layer 32 (Silicon Oxide ($SiO_2$) film) composed of Silicon Oxide and an amorphous silicon film 21a is fabricated on the insulating substrate SUB surface side of a transparent isotropic-like glass substrate, such as using a depositing method called plasma Chemical Vapor Deposition (CVD), etc. Here, the process fabricates the amorphous silicon film 21a (second semiconductor layer) which is accomplished at a temperature condition (second temperature condition) with a maximum temperature of generally about 300 degrees Celsius (572 degrees Fahrenheit).

Figure 2B:
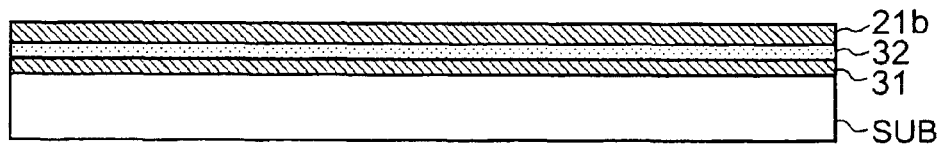

Subsequently, in the $2^{nd}$ process as shown in FIG. 2B, annealing treatment and dehydrogenation treatment are performed relative to the amorphous silicon film 21a. Then, the dehydrogenated amorphous silicon film is transformed into polysilicon (represented by a polycrystals) and a polysilicon film 21b (first semiconductor layer) is formed using a crystallization treatment with a pulsed excimer laser beam, etc. Here, the process of transforming the amorphous silicon into polysilicon to create the polysilicon film is accomplished at a temperature condition (first temperature condition) with a maximum temperature of generally about 600 degrees Celsius (1,112 degrees Fahrenheit).

Figure 2C:
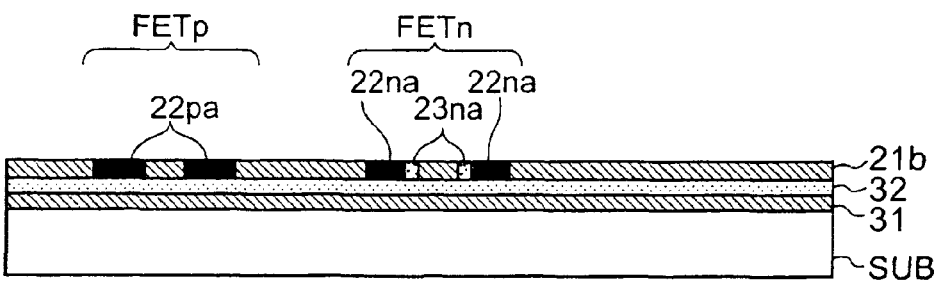

Next, in the $3^{rd}$ process as shown in FIG. 2C for example, P-type impurity ions ("acceptor") such as Boron (B)ions, etc. are doped on the polysilicon film 21b and a p+ silicon layer 22pa is implanted in adjacent areas on both sides of the semiconductor layer (polysilicon film 21b) which serve as the channel region in the field effect transistors FETp using a photoresist mask (a photoresist pattern used as an etcher mask for etching predetermined circuit pattern shapes in a photolithographic technique).

Similarly, N-type impurity ions ("donor") such as Phosphorous (P) ions, etc. are doped on the polysilicon film 21b and an n− silicon layer 23na is implanted in adjacent areas on both sides of the semiconductor layer (polysilicon film 21b) which serve as the channel region in the field effect transistors FETn as well as an n+ silicon layer 22na is implanted in adjacent areas on both sides of this n− silicon layer 23na using a photoresist mask.

At this point, the implant sequence of the p+ silicon layer 22pa, the n− silicon layer 23na and the n+ silicon layer 22na fabricated in this $3^{rd}$ process is not restricted and implanting can be set to an optional sequence.

Figure 2D:
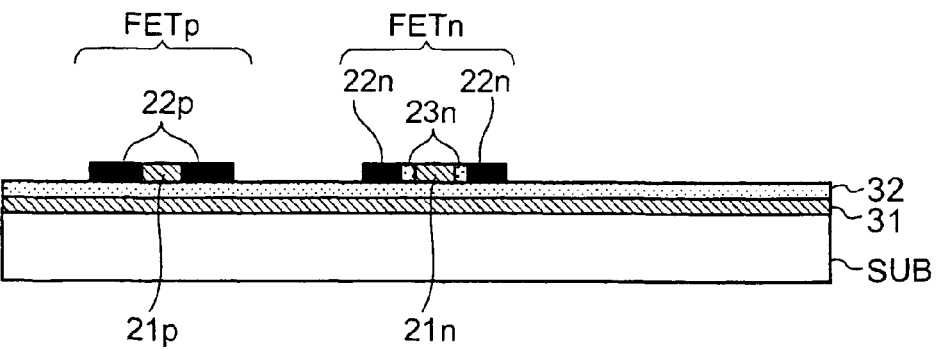

Next, in the $4^{th}$ process as shown in FIG. 2D, the polysilicon film 21b undergoes patterning (etching) so that only the semiconductor layer 21p and the p+ silicon layer 22pa (the impurity layer 22p composed of p+ silicon; ohmic contact layer) implanted in the above-mentioned $3^{rd}$ process remain in tact, namely, the formation areas of the field effect transistors FETp. Similarly, patterning is accomplished so that only the semiconductor layer 21n, the n− silicon layer 23na (the impurity layer 23n composed of n− silicon), and the n+ silicon layer 22na (the impurity layer 22n composed of n+ silicon; ohmic contact layer) remain in tact, namely, the formation areas of the field effect transistors FETn using a photoresist mask.

Figure 3A:
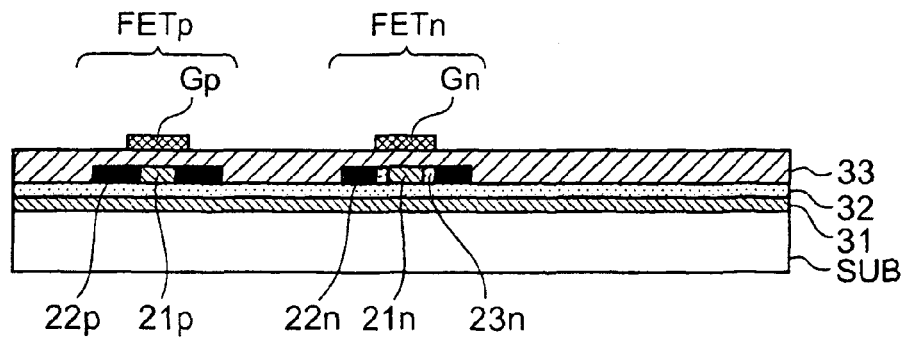

Subsequently, in the $5^{th}$ process as shown in FIG. 3A, after fabricating the insulating layer 33 (gate insulating film) composed of Silicon Oxide ($SiO_2$) using a plasma CVD method, etc. over the areas including at least the above-described semiconductor layer 21p with the impurity layer 22p as well as the semiconductor layer 21n with the impurity layer 23n and the impurity layer 22n, furthermore a laminated structure of metal film such as aluminum alloy, chromium alloy, etc. is fabricated using a deposition method such as a sputtering technique, an evaporation technique, etc. Then, the gate electrode Gp and Gn for the field effect transistors FETp, FETn are simultaneously fabricated in the same process by patterning this metal film into predetermined electrode shapes using a photoresist mask.

Figure 3B:
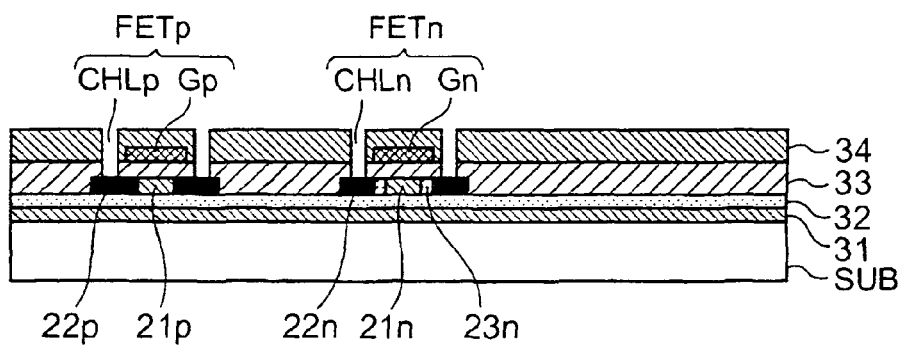

Next, in the $6^{th}$ process as shown in FIG. 3B, after fabricating the insulating layer 34 composed of Silicon Nitride (SiN) using a plasma CVD method, etc. over the areas including at least the above-described gate electrode Gp and Gn, the insulating layer 34, 35 at least are bored from the upper surface of this insulating layer 34 using a photoresist mask. The contact holes CHLp and CHLn (source contact holes and drain contact holes) are created which reach the impurity layer 22p composed of p+ silicon of the field effect transistors FETp and the impurity layer 22n composed of n+ silicon of the field effect transistors FETn.

Figure 3C:
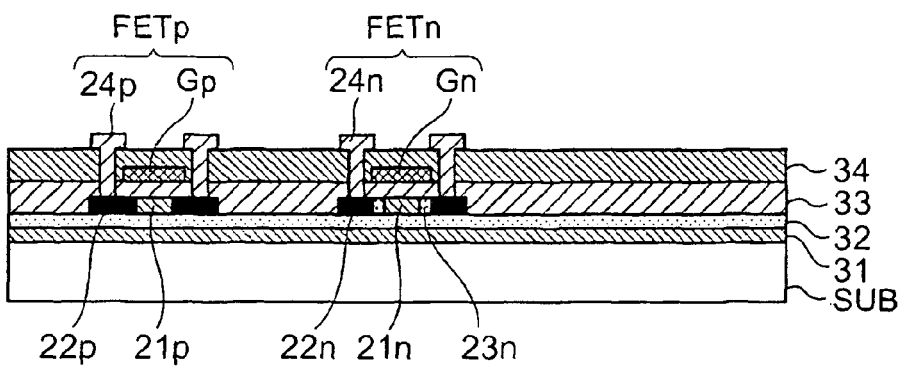

Then, in the $7^{th}$ process as shown in FIG. 3C, after fabricating a laminated structure on the upper side of the insulating layer 34 and while embedding metal film such as aluminum alloy or chromium alloy in the inner section of the above-stated contact holes CHLp and CHLn using a sputtering technique for example, the electrode wiring 24p, 24n is implanted which functions as the source and drain electrodes for the field effect transistors FETp, FETn by patterning this metal film into predetermined electrode shapes using a photoresist mask.

Accordingly, a functional circuit is fabricated which composes a plurality of field effect transistors FETp, FETn (low-temperature polysilicon) at least in the left area of the drawings.

Figure 3D:
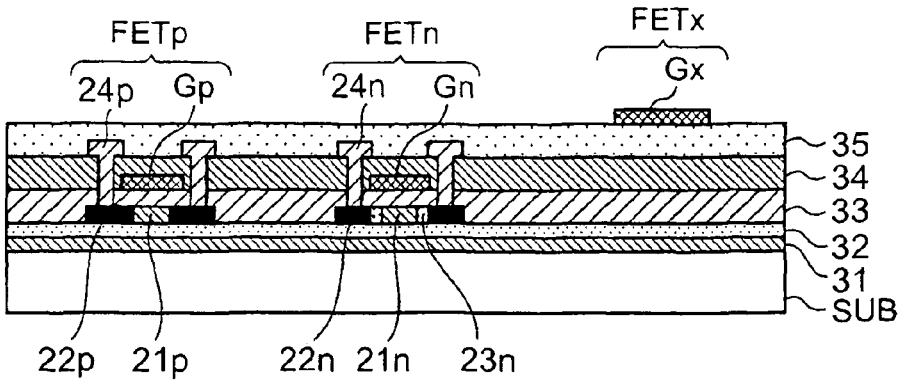

Next, in the $8^{th}$ process as shown in FIG. 3D for example, after forming the insulating layer 35 composed of Silicon Nitride (SiN) which covers the above-mentioned electrode wiring 24p, 24n on the entire surface side the substrate SUB using a plasma CVD method, etc., a laminated structure of metal film such as aluminum alloy or chromium alloy, etc. is formed using a sputtering technique or an evaporation technique. Afterwards, the gate electrode Gx is implanted in the formation areas for the field effect transistors FETx by patterning this metal film into predetermined electrode shapes using a photoresist mask.

Figure 4A:
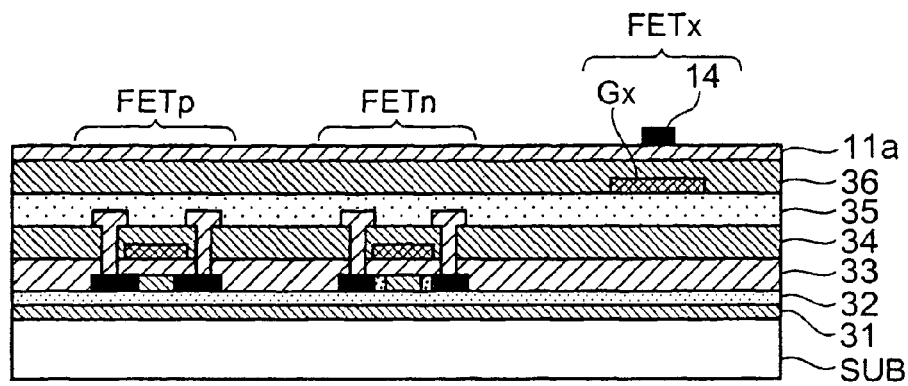

Next, in the $9^{th}$ process as shown in FIG. 4A, after forming the insulating layer 36 (gate insulating film) composed of Silicon Nitride (SiN) over the areas including at least the above-mentioned gate electrode Gx using a plasma CVD method, etc., a laminated structure is sequentially formed of the amorphous silicon film 11a (second semiconductor layer) and the insulating layer composed of Silicon Nitride. In addition, this insulating layer composed of Silicon Nitride is patterned using a photoresist mask and the block insulating layer 14 (stopper film) is implanted on the upper side of the amorphous silicon film 11a corresponding to the formation areas of the gate electrode Gx. Furthermore, like the above $1^{st}$ process the amorphous silicon film 11a is accomplished at a temperature condition (second temperature condition) of generally about 300 degrees Celsius (572 degrees Fahrenheit).

Here, the block insulating layer 14 is for protecting the channel region (semiconductor layer 11 described later) composed of amorphous silicon film 11a from damage in subsequent processes. Since the interface state of this block insulating layer 14 and the amorphous silicon film 11a (semiconductor layer 11) exert a significant effect on the element characteristics of the field effect transistors FETx, preferably the amorphous silicon film 11a and the block insulating layer 14 are consecutively formed within a vacuum to prevent interface deterioration.

Figure 4B:
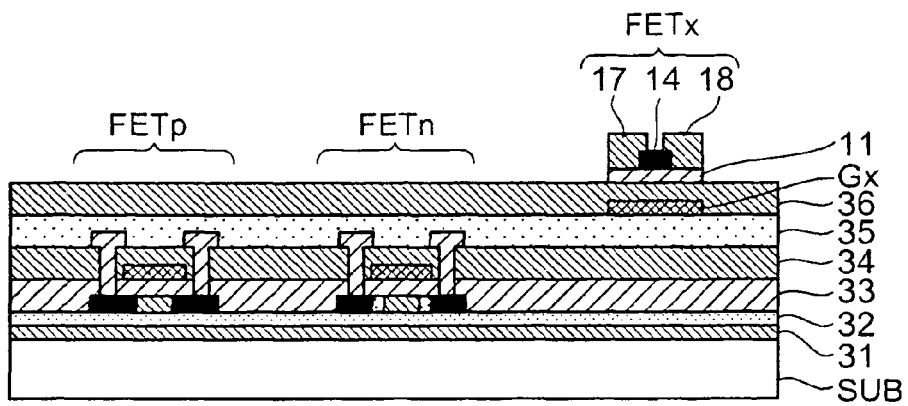

Subsequently, in the $10^{th}$ process as shown in FIG. 4B for example, after forming the amorphous silicon film using a plasma CVD method, etc. over the areas including the amorphous silicon film 11a and the block insulating layer 14 as well as implanting an impurity layer composed of n+ silicon by doping N-type impurity ions such as Phosphorous(P) ions, etc. on this amorphous silicon film, the impurity layer and the amorphous silicon film 11a are patterned using a photoresist mask to correspond with the formation areas (generally, the formation areas of the gate electrode Gx mentioned above) of the field effect transistors FETx. Next, the impurity layer 17, 18 composed of n+ silicon as an ohmic contact layer is formed in the semiconductor layer 11 formation areas of the field effect transistors FETx and implanted on both sides on the upper side of the block insulating layer 14 of this semiconductor layer 11.

The impurity layer 17, 18 provides an excellent electrical connection (ohmic connection) through the source electrode 12 and the drain electrode 13 in addition to the semiconductor layer 11 described later. The impurity layer 17, 18 is implanted in order to prevent excessive leakage current in are versed electric field. Furthermore, like the above $1^{st}$ process the amorphous silicon film for implanting the impurity layer 17, 18 is also accomplished at a temperature condition of generally about 300 degrees Celsius (572 degrees Fahrenheit).

Figure 4C:
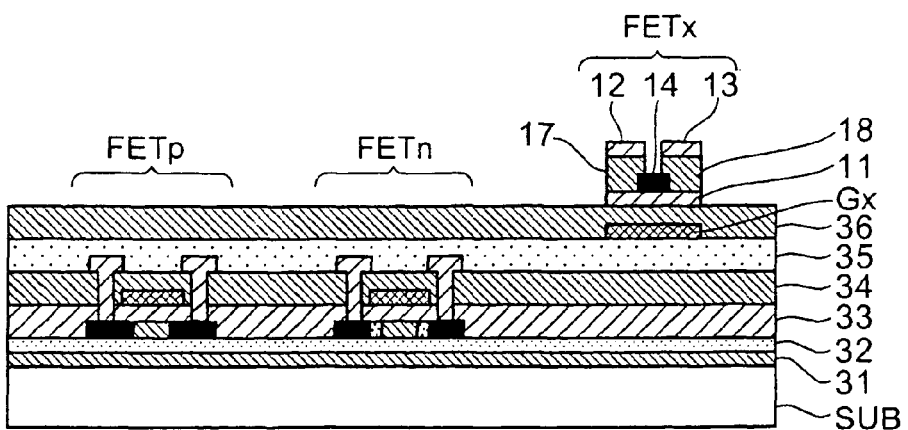

Next, in the $11^{th}$ process as shown in FIG. 4C, a laminated structure of metal film such as aluminum alloy, chromium alloy, etc. is fabricated over the areas which include at least the previously described impurity layer 17, 18. Then, the source electrode 12 and the drain electrode 13 are formed which extend above at least the above-stated impurity layer 17, 18 by patterning this metal film into predetermined electrode shapes using a photoresist mask.

Accordingly, a functional circuit is fabricated which composes field effect transistors FETx (amorphous silicon transistors) at least in the right area of the drawings.

Lastly, the transistor array having the element structure as shown in FIG. 1 is completed by forming a laminated structure of the insulating layer 37 composed of Silicon Nitride (SiN) using a plasma CVD method, etc. at least on the entire surface side of the substrate SUB.

Consequently, according to the transistor array which has such an element structure and manufacturing method, since the field effect transistors FETp, FETn using a low-temperature polysilicon semiconductor layer and the field effect transistors FETx using an amorphous silicon semiconductor layer can be intermingled and formed in one unit within a thin-film transistor structure on the single insulating substrate SUB, a compact and thin shaped transistor array can be achieved.

Moreover, based on the element structure and manufacturing method of the transistor array related to this embodiment, at least the amorphous silicon semiconductor layer (semiconductor layer 11) configuration that constitutes the field effect transistors FETx is formed in an upper layer more superior than the configuration of the low-temperature polysilicon semiconductor layer (the semiconductor layer 21$p$ and the impurity layer 22$p$ composed of p+ silicon, as well as the semiconductor layer 21$n$, the impurity layer 22$n$ composed of n+ silicon and the impurity layer 23$n$ composed of n− silicon) used for the field effect transistors FETp, FETn. In the sequence of the manufacturing processes above, because the processes ($9^{th}$ and $10^{th}$ processes above) which form the amorphous silicon semiconductor layer are applied after the processes ($2^{nd}$ and $3^{rd}$ processes above) which form the low-temperature polysilicon semiconductor layer, each element characteristic of the field effect transistors FETp, FETn and the field effect transistors FETx can be adequately sustained.

Specifically, for example, the process which fabricates the low-temperature polysilicon semiconductor layer is accomplished at a relatively high (generally, about 600 degrees Celsius) temperature condition during film (membrane) formation as described in the $2^{nd}$ and $3^{rd}$ processes. Afterwards the process which fabricates the amorphous silicon semiconductor layer is accomplished at a relatively low (generally, about 300 degrees Celsius) temperature condition during film (membrane) formation as described in the $9^{th}$ and $10^{th}$ processes. Since dehydrogenation develops in a previously formed amorphous silicon semiconductor layer, a phenomenon can be observed in which it becomes impossible to actualize sufficient electron mobility in the field effect transistors FETx as a result of deterioration in the element characteristics.

Consequently, in this embodiment the amorphous silicon semiconductor layer is formed in a latter process at relatively low temperature after the low-temperature polysilicon semiconductor layer is formed in a previous process which requires a relatively high temperature condition. Thus, while the element characteristics of the field effect transistors using a low-temperature polysilicon semiconductor layer are maintained favorably, the element characteristics of the field effect transistors using an amorphous silicon semiconductor layer can also be satisfactorily maintained. In this manner, a transistor array with advanced operating characteristics can be achieved.

Also, as for the manufacturing method in this embodiment, in the formation process of the polysilicon semiconductor layer in the $2^{nd}$ process, since the entire surface of the amorphous silicon film formed on the substrate is crystallized, this makes it possible to implant a polysilicon semiconductor layer. Thus, the process in conventional prior art which selectively crystallizes only specific areas is unnecessary. Also, the manufacturing process can be made less complicated and the manufacturing equipment simplified to ultimately result in lowered production costs.

Besides, given that the amorphous silicon semiconductor layer is formed in the upper layer of a polysilicon semiconductor layer as well as the amorphous silicon thin-film transistors and the polysilicon thin-film transistors are separately implanted in different layers, the polysilicon thin-film transistors and amorphous silicon thin-film transistors can be arranged sufficiently close to one another. For that reason, a driver circuit can be positioned adjacent to the pixel array, the size of the transistor array can be reduced and a miniaturized device structure can be produced.

Furthermore, the transistor array related to the preferred embodiment is applied to a driver circuit described later. The output circuit section (level shift circuit section) of this driver circuit is configured with field effect type transistors (field effect type transistors FETx) using an amorphous silicon semiconductor layer and the other internal circuit sections of this driver circuit are configured with field effect type transistors (field effect type transistors FETp, FETn) using a polysilicon semiconductor layer. In the internal circuit sections, since the "ON" current flow in field effect type transistors (polysilicon thin-film transistors) is relatively high and the electron mobility is relatively high, circuit operation such as signal generation, etc. can be performed relatively fast. On the other hand, in the output circuit section, since amorphous silicon thin-film transistors having relatively high withstand voltage characteristics are applied, a scanning signal having relatively high voltage amplitude is satisfactorily generable.

Second Embodiment

Next, the transistor array element structure related to the present invention and the second embodiment of its manufacturing method will be explained with reference to the drawings.

(Element Structure)

Figure 5:
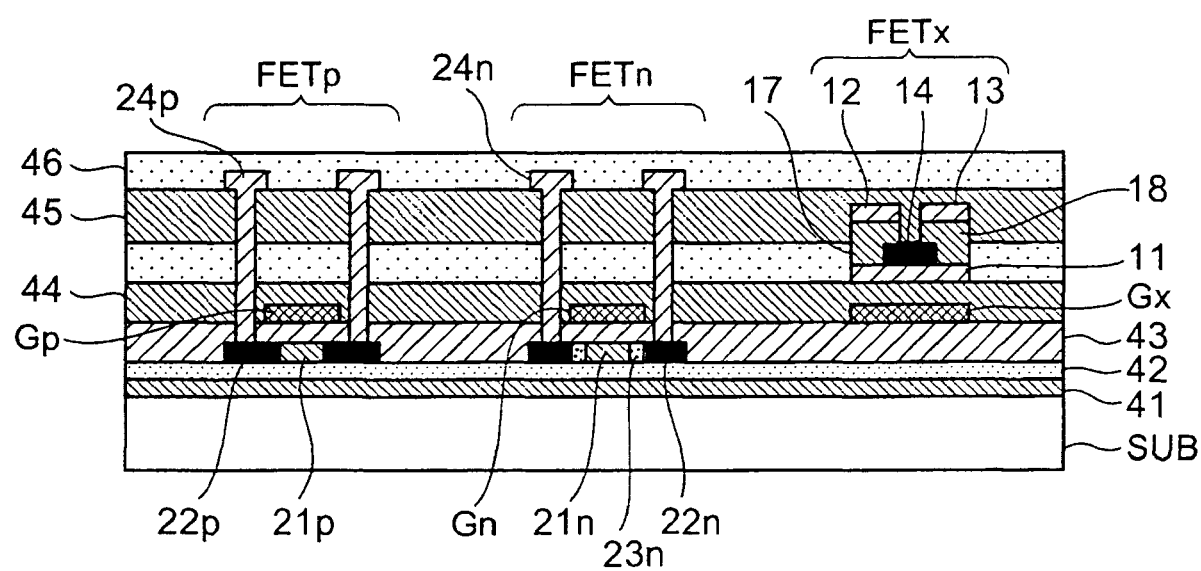
FIG. 5 is an outline cross-sectional diagram showing the second embodiment of the transistor array element structure related to the present invention.

FIG. 5 is an outline cross-sectional diagram showing the second embodiment of the transistor array element structure related to the present invention.

Here, with respect to any configuration equivalent to the first embodiment (refer to FIG. 1) described above, the equivalent or same nomenclature is appended and further detailed explanation is abbreviated or omitted. Also, FIG. 5 only shows one or several of each field effect transistor (thin-film transistor) using a polysilicon semiconductor layer and an amorphous silicon semiconductor layer in order to simplify explanation. Also, omitted from the drawing is the wiring layer which connects these to one another and the external connection wiring, etc. for connecting a peripheral device.

In the element structure and its manufacturing method related to the above first embodiment, the field effect transistors FETp, FETn and the field effect transistors FETx have a configuration in which each other are separately implanted, but do not share a common conductor layer. That is, the field effect transistors FETp, FETn are implanted in the lower layer side (substrate side) and the field effect transistors FETx are implanted in the upper layer. In this embodiment, a portion of the conductor layer (gate electrodes) of the field effect transistors FETp, FETn is implanted in the same layer and has a configuration which shares a conductor layer.

Specifically as shown in FIG. 5, the field effect transistors FETp, FETn configuration has a semiconductor layer 21$p$ and 21$n$, an impurity layer 22$p$, an impurity layer 22$n$, 23$n$, a gate electrode Gp, Gn, an electrode layer 24$p$, 24$n$ among a silicon nitride film 41, a silicon oxide film 42, and an insulating layer 43, 44, 45, 46. The semiconductor layer 21$p$, 21$n$ (channel region) composed of low-temperature polysilicon are implanted on the upper side of the silicon nitride film 41 and the silicon oxide film 42 (equivalent to the above-mentioned insulating layer 31, 32 respectively) on the entire surface side of the substrate SUB. The impurity layer 22$p$ composed of p+ silicon is implanted on both sides of this semiconductor layer 21$p$. The impurity layer 22$n$ composed of n+ silicon and the impurity layer 23$n$ composed of n− silicon are implanted on both sides of the semiconductor layer 21$n$. The gate electrode Gp and Gn is implanted on the upper side of each semiconductor layer 21p, 21n via the insulating layer 43 (gate insulating film; equivalent to the insulating layer 33 mentioned above) which contains a conductor layer composed of an electrically conductive material selected from chromium, chromium alloy, aluminum, aluminum alloy, etc. The electrode layer 24p, 24n (source electrodes and drain electrodes) is connected to each of the impurity layer 22p, 22n via contact holes created by boring into the above-mentioned insulating layer 43, 44, 45 laminated on the upper side of the gate electrode Gp, Gn. The insulating layer 46 (protective insulating layer) is laminated on the upper side of the electrode layer 24p, 24n.

As shown in FIG. 5, the field effect transistors FETx configuration has a gate electrode Gx, a semiconductor layer 11, a block insulating layer 14, an impurity layer 17, 18, a source electrode 12 and a drain electrode 13 among the insulating layer 45, 46. The gate electrode Gx contains a conductor layer composed of an electrically conductive material selected from chromium, chromium alloy, aluminum, aluminum alloy, etc. which is implanted over the above-described silicon nitride film 41, the silicon oxide film 42 and the insulating layer 43 in a laminated structure on the entire surface side of substrate SUB. The semiconductor layer 11 (channel region) is implanted over this gate electrode Gx via the same insulating layer 44 (gate insulating film) as described above and composed of amorphous silicon. The block insulating layer 14 (stopper film) is implanted over the semiconductor layer 11. The impurity layer 17, 18 is implanted on both sides of the block insulating layer 14 (stopper film) formed over the semiconductor layer 11. The source electrode 12 and the drain electrode 13 are implanted over the impurity layer 17, 18. The same insulating layer 45, 46 as described above are laminated over the semiconductor layer 11 and the block insulating layer 14 as well as the source electrode 12 and the drain electrode 13.

Specifically, the element structure as shown in FIG. 5 like the above first embodiment has a configuration wherein at least the semiconductor layer 11 (channel region) composed of amorphous silicon as applied to the field effect transistors FETx are formed in an upper layer more superior than the semiconductor layer 21p, 21n (channel region) composed of low-temperature polysilicon as applied to P-channel and N-channel types of the field effect transistors FETp, FETn. Also, the element structure has a configuration with the gate electrode Gx of the field effect transistors FETx as well as the gate electrode Gp, Gn of the field effect transistors FETp, FETn implanted in the same layer.

(Manufacturing Method)

Next, the manufacturing method of the transistor array having the element structure described above will be explained with reference to the drawings.

FIGS. 6A~D and FIGS. 7A~B are process cross-sectional diagrams showing the transistor array manufacturing method having the element structure related to the second embodiment.

Additionally, in the following description the annotations of the "1st process" through the "$10^{th}$ process" are used for convenience in the explanation and there may be optional supplemental processes in the interim. Also, there can be a modification to other processes where substitution is possible which are not directly related to the actual manufacturing process.

Initially, as illustrated in the $1^{st}$ through $4^{th}$ processes (FIGS. 2A~D) in the first embodiment described above, a sequentially laminated structure is fabricated with the insulating layer 41 (Silicon Nitride (SiN) film), the insulating layer 42 (Silicon Oxide ($SiO_2$) film) and the amorphous silicon film 21a on the entire surface of the transparent insulating substrate SUB. Afterwards, an impurity ion is doped onto predetermined areas of the polysilicon film 21b for transforming the amorphous silicon film 21a into a polysilicon structure. The p+ silicon layer 22pa along with the n− silicon layer 23na and n+ silicon layer 22na are implanted on both side areas of each semiconductor layer 21p, 21n configuration of the field effect transistors FETp, FETn.

Then, the polysilicon film 21b undergoes patterning (etching) so that only the semiconductor layer 21p and the impurity layer 22p composed of p+ silicon, as well as the semiconductor layer 21n, the impurity layer 23n composed of n− silicon and the impurity layer 22n composed of n+ silicon corresponding to the formation areas of the field effect transistors FETp, FETn remain intact.

Figure 6A:
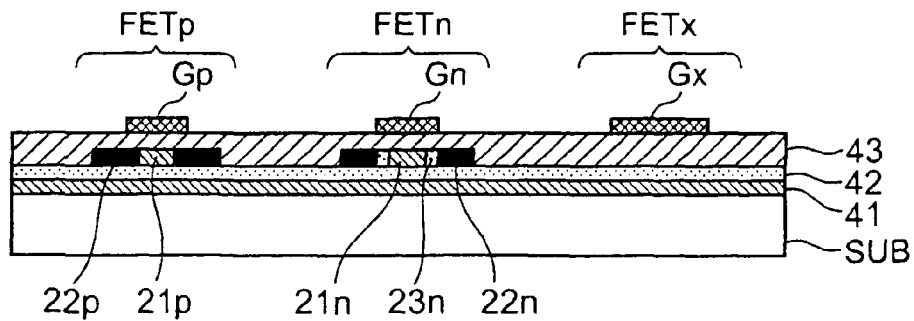
FIGS. 6A~D and FIGS. 7A~B are process cross-sectional diagrams showing the transistor array manufacturing method having the element structure related to the second embodiment.

Subsequently, in the $5^{th}$ process as shown in FIG. 6A, after constructing the insulating layer 43 (gate insulating film) composed of Silicon Oxide ($SiO_2$) using a plasma CVD method, etc. over the areas including at least the above-described semiconductor layer 21p with the impurity layer 22p as well as the semiconductor layer 21n with the impurity layer 23n and the impurity layer 22n, a laminated structure of metal film such as aluminum alloy, chromium alloy, etc. is formed using a sputtering technique, an evaporation technique, etc. Then, the gate electrode Gp and Gn for the field effect transistors FETp, FETn along with the gate electrode Gx for the field effect transistors FETx are simultaneously fabricated in the same process by patterning this metal film into predetermined electrode shapes using a photoresist mask.

Figure 6B:
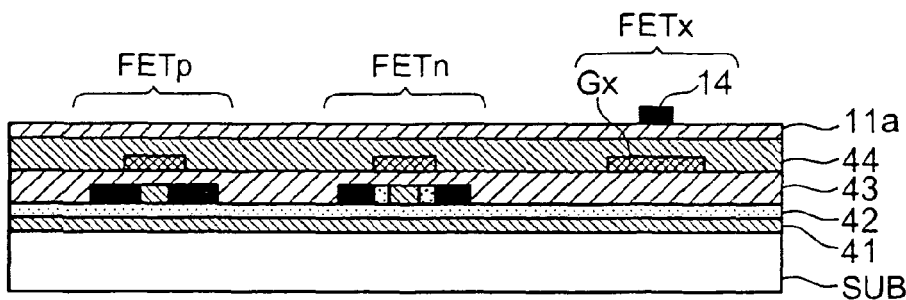

Next, in the $6^{th}$ process as shown in FIG. 6B, after fabricating a sequentially laminated structure of the insulating layer 44 (gate insulating film) composed of Silicon Nitride (SiN) and the amorphous silicon film 11a using a plasma CVD method, etc. over areas including at least the above-described gate electrode Gp, Gn and Gx, the block insulating layer 14 (stopper film) is implanted over the amorphous silicon film 11a corresponding to the formation areas of the gate electrode Gx.

Figure 6C:
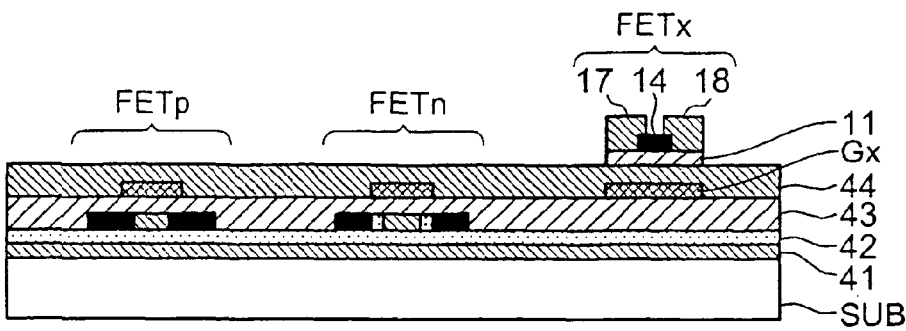

Next, in the $7^{th}$ process as shown in FIG. 6C, after fabricating the amorphous silicon film using a plasma CVD method, etc. over the areas including at least the amorphous silicon film 11a and the block insulating layer 14 and implanting an impurity layer by doping N-type impurity ions composed of n+ silicon on this amorphous silicon film, the semiconductor layer 11 and the impurity layer 17, 18 composed of n+ silicon are formed by patterning the impurity layer and the amorphous silicon film 11a to correspond with the formation areas (generally, the formation areas of the above-mentioned gate electrode Gx) of the field effect transistors FETx.

Figure 6D:
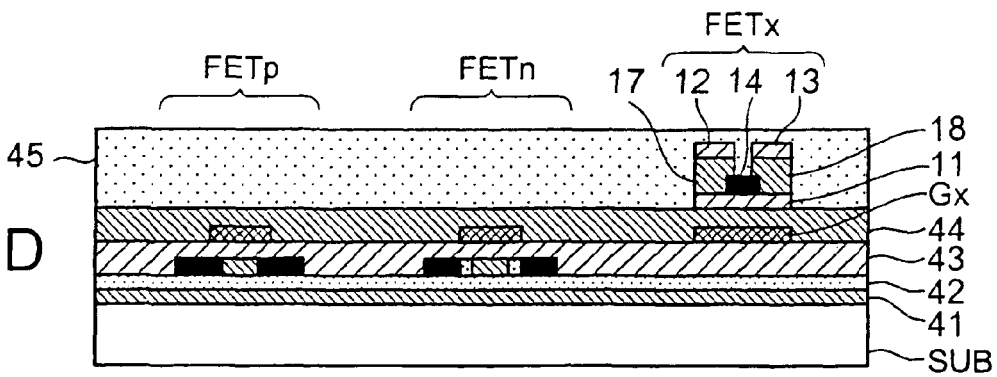

Subsequently, in the $8^{th}$ process as shown in FIG. 6D, after fabricating a laminated structure of metal film over at least the impurity layer 17, 18, this metal film is patterned into predetermined electrode shapes. The source electrode 12 and the drain electrode 13 of the field effect transistors FETx are implanted and then the insulating layer 45 is fabricated onto the laminated structure on the entire surface side of the substrate SUB.

Accordingly, a functional circuit is fabricated which composes field effect transistors FETx (amorphous silicon transistors) at least in the right area of the drawings.

Figure 7A:
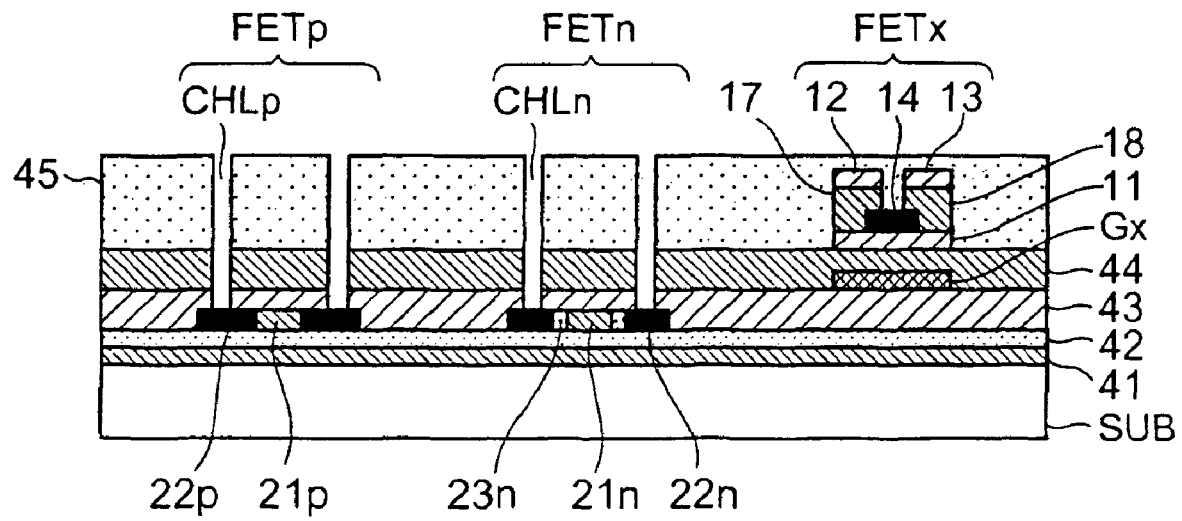

Next, in the $9^{th}$ process as shown in FIG. 7A, the insulating layer 45, 44, 43 at least are bored from the upper surface of this insulating layer 45. The contact holes CHLp and CHLn (source contact holes and drain contact holes) are created which reach the impurity layer 22p and 22n of the field effect transistors FETp, FETn.

Figure 7B:
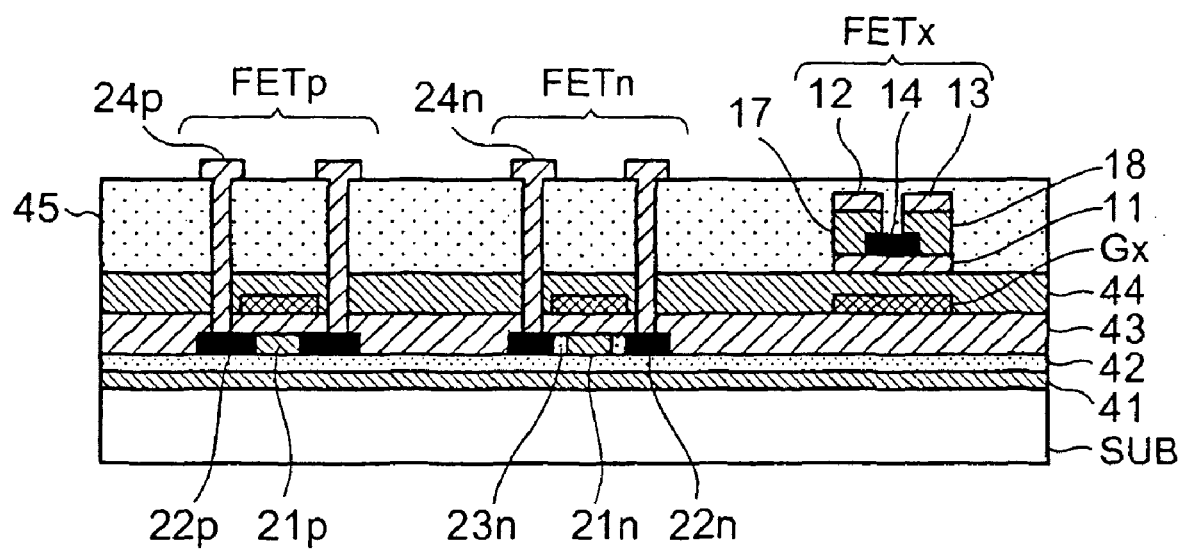

Following, in the 10th process as shown in FIG. 7B, after fabricating a laminated structure over the insulating layer 45 and while embedding metal film such as aluminum alloy or chromium alloy in the inner section of the above-stated contact holes CHLp and CHLn using a sputtering technique for example, the electrode wiring 24p, 24n which functions as the source and drain electrodes for the field effect transistors FETp, FETn is formed by patterning this metal film into predetermined electrode shapes.

Accordingly, a functional circuit is fabricated which composes a plurality of field effect transistors FETp, FETn (low-temperature polysilicon thin-film transistors) at least in the left area of the drawings.

Lastly, the transistor array having the element structure as shown in FIG. 5 is completed by forming a laminated structure of the insulating layer 46 (protective insulating film) on the entire surface side of the substrate SUB.

Consequently, according to the image processor which has such an element structure and manufacturing method like the above first embodiment, since the field effect transistors FETp, FETn using a low-temperature polysilicon semiconductor layer and the field effect transistors FETx using an amorphous silicon semiconductor layer can be intermingled and formed in one unit within a thin-film structure on the single insulating substrate SUB, a compact and thin shaped transistor array can be achieved.

Furthermore, the low-temperature polysilicon semiconductor layer used for the field effect transistors FETp, FETn are formed in a lower layer more inferior than the amorphous silicon semiconductor layer configuration of the field effect transistors FETx. In the sequence of manufacturing processes above, because the processes which implant the amorphous silicon semiconductor layer are applied after the processes which implant the low-temperature polysilicon semiconductor layer, each element characteristic of the field effect transistors FETp, FETn and the field effect transistors FETx can be satisfactorily sustained.

Additionally, as for the feature effect of this embodiment, since the configuration is formed in the same layer as applied to at least the conductor layer portion (gate electrode Gp, Gn and the gate electrode Gx) of the field effect transistors FETp, FETn and the field effect transistors FETx, this conductor layer can be simultaneously fabricated in the same process (shared process), thus shortening the manufacturing process and a reduction in the production costs can be achieved.

Third Embodiment

Next, the transistor array element structure related to the present invention and the third embodiment of its manufacturing method will be briefly explained with reference to the drawings.

(Element Structure)

Figure 8:
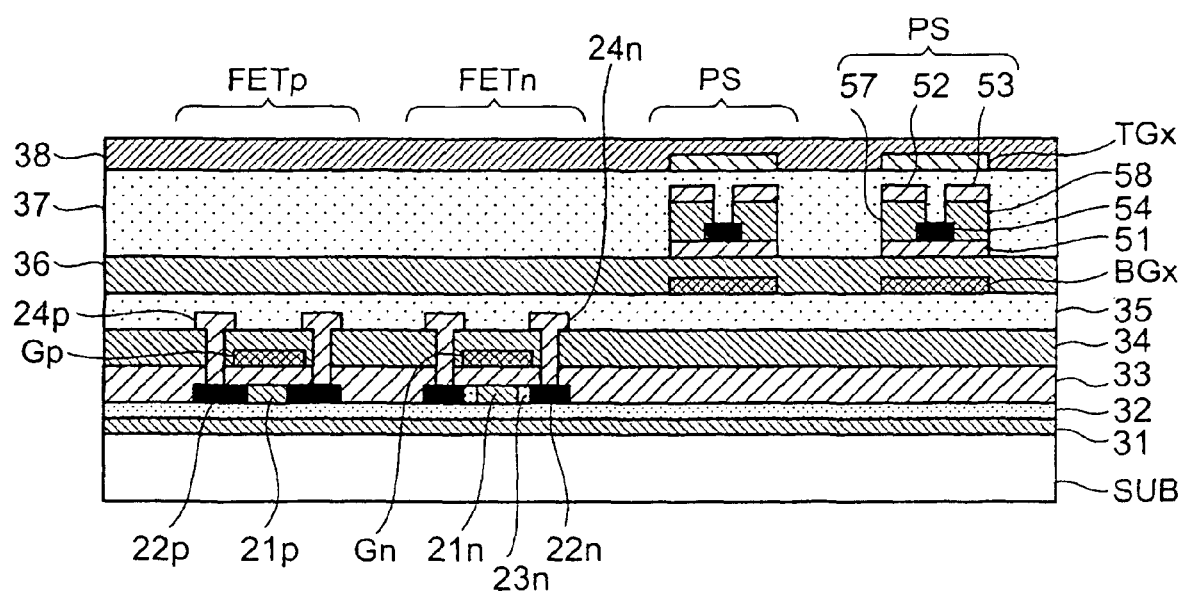
FIG. 8 is an outline cross-sectional diagram showing the third embodiment of the transistor array element structure related to the present invention.

FIG. 8 is an outline cross-sectional diagram showing the third embodiment of the transistor array element structure related to the present invention.

Here, with respect to any configuration equivalent to the first embodiment (refer to FIG. 1) described above, the equivalent or same nomenclature is appended and further detailed explanation is abbreviated or omitted. In addition, FIG. 8 only shows one or several of each field effect transistor using a polysilicon semiconductor layer and photosensor in order to simplify explanation. Also, omitted from the diagram is the wiring layer which connects these to one another and the external connection wiring, etc. for connecting with a peripheral device.

In the element structure and its manufacturing method related to the above first embodiment, a configuration is described wherein the field effect transistors FETp, FETn and the field effect transistors FETx are implanted and intermingled on a single substrate SUB without sharing a conductor layer. However, in this embodiment a plurality of functional devices (photosensors) which use an amorphous silicon layer are substituted instead of the above-stated field effect transistors FETx in a configuration formed in one unit on the single substrate SUB without sharing the conductor layer of the field effect transistors FETp, FETn.

Here, since the field effect type transistors FETp, FETn applicable to this embodiment shown in FIG. 8 have an equivalent element structure to the transistor array (refer to FIG. 1) described in the above first embodiment, a detailed explanation is omitted.

The photosensors PS applicable to the transistor array related to the embodiment, as shown in FIG. 8 for example, have a configuration of a bottom gate electrode BGx, a semiconductor layer 51, a block insulating layer 54, an impurity layer 57, 58, an electrode layer 52, 53, a top gate electrode TGx and an insulating layer 38. The bottom gate electrode BGx (second gate electrode) is opaque and impervious to visible light which contains a conductor layer composed of an electrically conductive material selected from chromium, chromium alloy, aluminum, aluminum alloy, etc. and implanted over the silicon nitride film 35 so that the electrode layer 24p, 24n consisting of the above-stated P-channel type field effect transistors FETp and the N-channel type field effect transistors FETn are covered in a laminated structure fabricated on the entire surface side of the substrate SUB. The semiconductor layer 51 defines a channel region composed of amorphous silicon which is implanted over the bottom gate electrode BGx via the same insulating layer 36 (lower gate insulating film) mentioned above. The block insulating layer 54 (stopper film) is implanted over this semiconductor layer 51 (drawing upper part) with Silicon Nitride (SiN) film for example. The impurity layer 57, 58 (ohmic contact layer) is composed of n+ silicon implanted on both sides of the block insulator layer 54 over the semiconductor layer 51. The electrode layer 52, 53 (source electrode 52 and drain electrode 53) is opaque and impervious to visible light which contains a conductor layer composed of an electrically conductive material selected from chromium, chromium alloy, aluminum, aluminum alloy, etc. and implanted over the impurity layer 57, 58. The top gate electrode TGx (first gate electrode) shows permeability to visible light which contains a conductor layer composed of a transparent electrode layer such as tin oxide film, Indium Oxide (ITO) film (Indium—stannic acidified film), etc. and is implanted over the semiconductor layer 51 and the block insulating layer 54 via the same insulating layer 37 (upper gate insulating layer) as the above. The insulating layer 38 (protective insulating film) is laminated over the insulating layer 37 including the top gate electrode TGx.

Here, in this embodiment all of the insulating layers 31~38 (insulating layers) mentioned above are formed of a transparent insulating layer containing the transparency of Silicon Nitride (SiN) film, Silicon Oxide (SiO$_2$) film, etc.

In this manner, the photosensors PS related to this embodiment have a configuration which adds the top gate electrode TGx over the amorphous silicon semiconductor layer 51 via the insulating layer 37 (top gate insulating layer) with regard to the element structure of the field effect transistors FETx using the amorphous silicon layer described in the above first embodiment. Accordingly, the photosensors PS concerning this embodiment contain what is termed as a double-gate thin-film transistor structure. Each has separate gate electrodes (top gate electrode TGx and the bottom gate electrode BGx) formed in an upper gate and lower gate pattern in relation to the semiconductor layer 51 (channel region) that are mutually composed of amorphous silicon and wherein an electron-hole pair is induced upon incidence of photoexcitation light (here, visible light).

Here, the photosensors PS like the above first embodiment have a configuration wherein at least the semiconductor layer 51 as applied to the photosensors are formed in an upper layer more superior than the semiconductor layer 21p, 21n composed of low-temperature polysilicon as applied to P-channel and N-channel type field effect transistors FETp, FETn. Also, the photosensors PS and the field effect transistors FETp, FETn have a configuration formed independently of one another without mutually sharing a conductor layer.

(Manufacturing Method)

Next, the manufacturing method of the transistor array having the element structure described above will be explained with reference to the drawings.

Figure 9A:
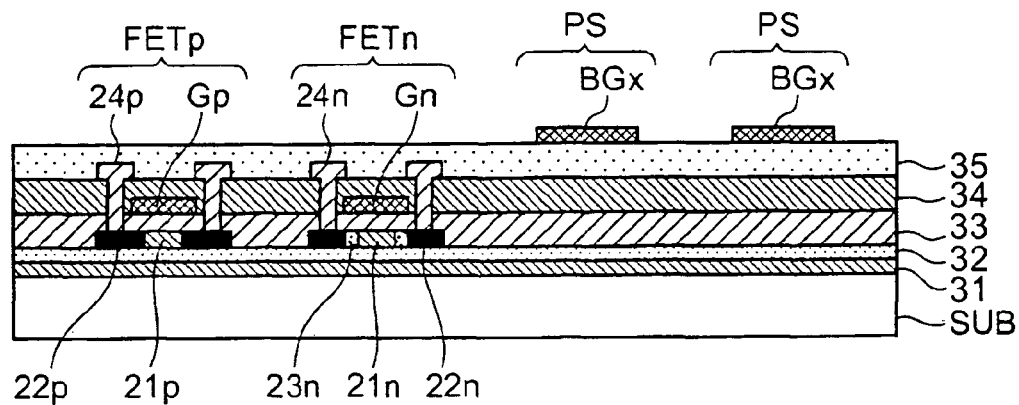
FIGS. 9A~C are process cross-sectional diagrams showing the transistor array manufacturing method having the element structure related to the third embodiment.
Figure 9B:
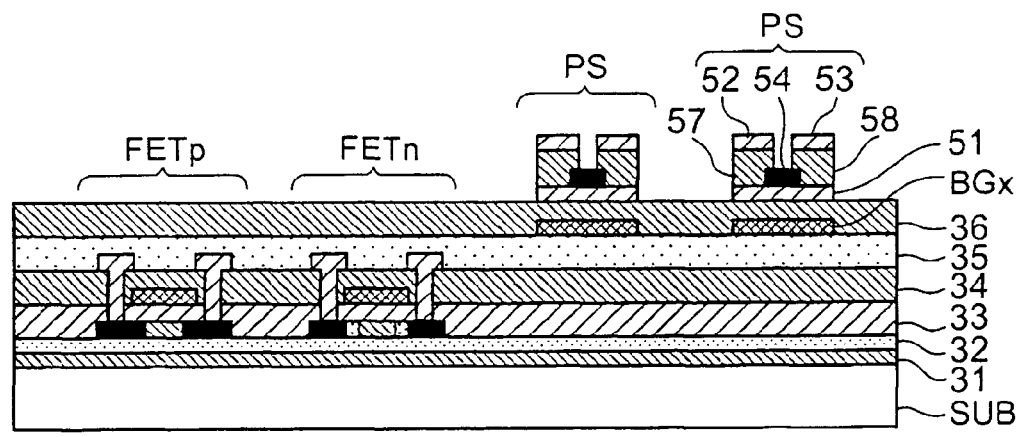
Figure 9C:
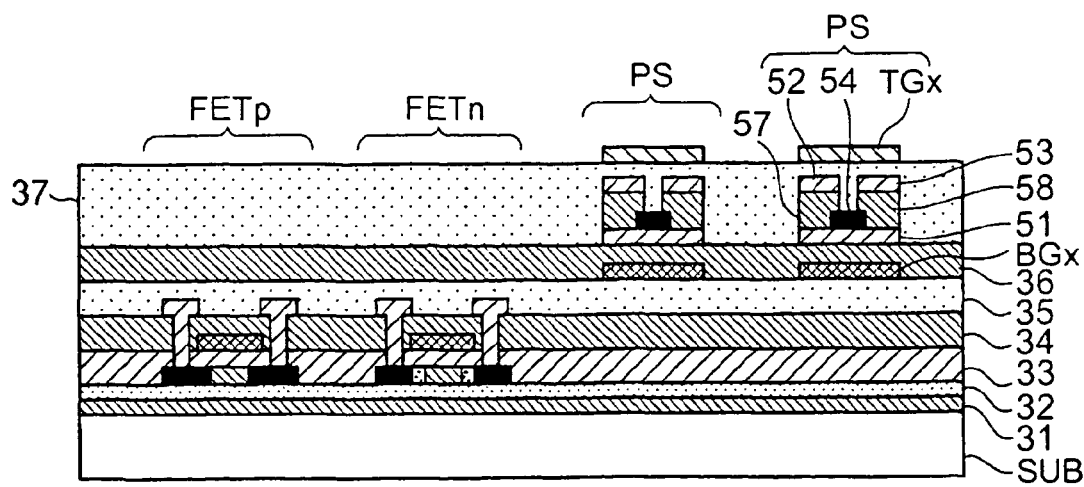

FIGS. 9A~C are process cross-sectional diagrams showing the transistor array manufacturing method having the element structure related to the third embodiment.

With regard to the photosensors PS above, since the element structure is equivalent to the field effect transistors FETx described earlier in the first embodiment, the manufacturing method applies the equivalent process of each process step from the gate electrode Gx until implanting the source electrode 12 and the drain electrode in the field effect transistors FETx further detailed explanation is abbreviated or omitted. Additionally, in the following description the annotations of the "$1^{st}$ process" through the "$10^{th}$ process" are used for convenience in the explanation and are not directly related to the actual manufacturing process.

Initially, like the manufacturing method in the $1^{st}$ through $7^{th}$ processes (FIGS. 2A~D and FIGS. 3A~C) described in the above first embodiment, a plurality of the field effect transistors FETp, FETn (low-temperature polysilicon thin-film transistors) are fabricated using a polysilicon semiconductor layer in the left area of the drawings over the insulating layer 31, 32 in a laminated structure formed on the entire surface side of the substrate SUB.

Next, in the $8^{th}$ process as shown in FIG. 9A, after forming the insulating layer 35 which covers the electrode wiring 24p, 24n on the entire surface side of the substrate SUB, the bottom gate electrode BGx is fabricated in the formation areas for each of the photosensors PS in a laminated structure of metal film which has a light blocking effect composed of aluminum alloy, chromium alloy, etc. and this metal film is patterned into predetermined electrode shapes.

Subsequently, in the $9^{th}$ process as shown in FIG. 9B, like the $9^{th}$ and $10^{th}$ processes in the previous first embodiment, a laminated structure is fabricated in predetermined electrode shapes of the semiconductor layer 51 (equivalent to the semiconductor layer 11 stated above), the block insulating layer 54 (equivalent to the block insulating layer 14 stated above) and the impurity layer 57, 58 as an ohmic contact layer over the bottom gate electrode BGx via the insulating layer 36 (lower gate insulating film) and furthermore the source electrode 52 and the drain electrode 53 (equivalent to the source electrode 13 and the drain electrode 13 stated above) are formed which extend over the impurity layer 57, 58 (equivalent to the impurity layer 17, 18 stated above). Here, like the above first manufacturing method the depositing process of the amorphous silicon film 51a for fabricating the semiconductor layer 51 is accomplished at a temperature condition of generally about 300 degrees Celsius.

Next, in the $10^{th}$ process as shown in FIG. 9C, after forming a laminated structure of the insulating layer 37 (upper gate insulating layer) on the entire surface side of the substrate SUB and furthermore depositing the transparent electrode layer composed of tin oxide film, Indium Oxide (ITO) film, etc. using an evaporation technique, etc., the top gate electrode TGx is fabricated by patterning to correspond with the above-described semiconductor layer 51 (channel region) using a photoresist mask.

Accordingly, at least a plurality of the photosensors PS are fabricated which contain what is termed as a double-gate thin-film transistor (amorphous silicon thin-film transistor) structure in the right area of the drawings.

Lastly, the transistor array having the element structure as shown in FIG. 8 is completed by forming a laminated structure of the insulating layer 38 (protective insulating film) composed of Silicon Nitride (SiN) using a plasma CVD method, etc. at least on the entire surface side of the substrate SUB.

Consequently, according to the transistor array which has such an element structure and manufacturing method like the above first embodiment, since the field effect transistors FETp, FETn using a low-temperature polysilicon semiconductor layer and the photosensors PS using an amorphous silicon semiconductor layer can be intermingled and formed in one unit within a thin-film transistor structure on the single insulating substrate SUB, a compact and thin shaped transistor array can be achieved.

Furthermore, the low-temperature polysilicon semiconductor layer used for the field effect transistors FETp, FETn are formed in a lower layer more inferior than the amorphous silicon semiconductor layer configuration of the photosensors PS. In the sequence of the above manufacturing processes, because the processes which implant the amorphous silicon semiconductor layer are applied after the processes which implant the low-temperature polysilicon semiconductor layer, each element characteristic of the field effect transistors FETp, FETn and the field effect transistors FETx can be satisfactorily sustained.

Additionally as for the characteristic effect of this embodiment, since the photosensors PS contain a double-gate thin-film transistor structure, both a photo sensing function and a selection transistor function are realizable with each of the photosensors PS which will be described later. Therefore, when these photosensors are configured in a two-dimensional photosensor array, while reducing the number of transistors which constitute each of the reading pixels and achieving a more miniaturized photosensor array or increasing the number of pixels, a thin shape design can be achieved.

Fourth Embodiment

Next, the transistor array element structure related to the present invention and the fourth embodiment of its manufacturing method will be briefly explained with reference to the drawings.

(Element Structure)

Figure 10:
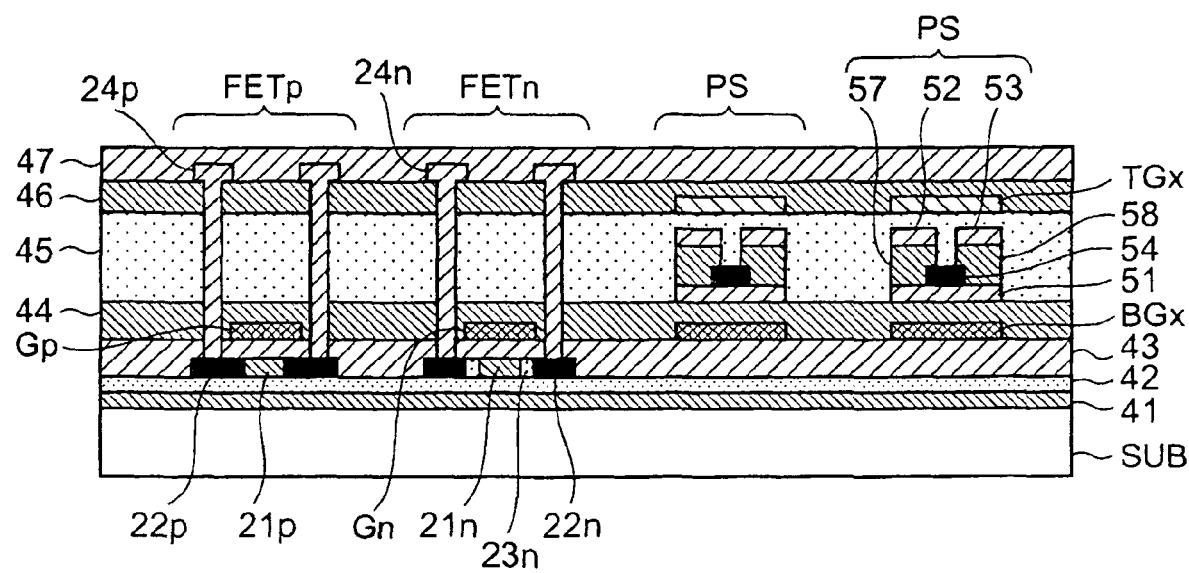
FIG. 10 is an outline cross-sectional diagram showing the fourth embodiment of the transistor array element structure related to the present invention.

FIG. 10 is an outline cross-sectional diagram showing the fourth embodiment of the transistor array element structure related to the present invention.

Here, with respect to any configuration equivalent to the second embodiment (refer to FIG. 5) described above, the equivalent or same nomenclature is appended and further detailed explanation is abbreviated or omitted. In addition, FIG. 10 only shows one or several of each field effect transistor using a polysilicon semiconductor layer and photosensor in order to simplify explanation. Also, omitted from the diagram is the wiring layer which connects these to one another and the external connection wiring, etc. for connecting with a peripheral device.

In the element structure and its manufacturing method related to the above second embodiment, a configuration is described wherein each of the gate electrodes Gp, Gn, Gx of the field effect transistors FETp, FETn and the field effect transistors FETx share a conductor layer and are formed intermingled on a single substrate SUB. However, in this embodiment the bottom gate electrode BGx of the photosensors which has an element structure as described in the third embodiment are substituted instead of the above-mentioned field effect transistors FETx and share a conductor layer with each of the gate electrodes Gp, Gn of the field effect transistors FETp, FETn in a configuration formed in one unit on the single substrate SUB.

Here, since the field effect type transistors FETp, FETn applicable to this embodiment shown in FIG. 10 have an equivalent element structure to the transistor array (refer to FIG. 5) described in the above second embodiment, a detailed explanation is omitted. Furthermore, since the photosensors PS also have an equivalent element structure to the transistor array (refer to FIG. 8) described in the above third embodiment, explanation is abbreviated.

The photosensors PS applicable to the transistor array related to the embodiment, as shown in FIG. 10, have a configuration of the bottom gate electrode BGx, the insulating layer 44, the semiconductor layer 51, the block insulating layer 54, the impurity layer 57, 58, the source electrode 52, the drain electrode 53, the insulating layer 45, the top gate electrode TGx and the insulating layer 46. The bottom gate electrode BGx (second gate electrode) is fabricated in the same formation layer as the gate electrode Gp, Gn provided for the above P-channel type field effect transistors FETp and the N-channel type field effect transistors FETn in a laminated structure on the surface side of the substrate SUB. The semiconductor layer 51 (channel region) composed of amorphous silicon is formed over this bottom gate electrode BGx via the same insulating layer 44 (lower gate insulating film). The source electrode 52 and the drain electrode 53 are formed over the impurity layer 57, 58 (ohmic contact layer) composed of n+ silicon implanted on both sides of the block insulating layer 54 (stopper film) which is fabricated over this semiconductor layer 51. The top gate electrode TGx (first gate electrode) is formed over the above semiconductor layer 51 and the block insulating layer 54, as well as the source electrode 52 and the drain electrode 53 via the same insulating layer 45 (upper insulating layer). The insulating layer 46 is laminated over the top gate electrode TGx.

Additionally, in this embodiment the electrode layer 24p, 24n provided in the field effect transistors FETp, FETn, for example, connects with each of the impurity layer 22p, 22n via contact holes created by boring into the insulating layer 43~45 from the upper surface of the insulating layer 46 laminated over the top gate electrode TGx of the above-stated photosensors PS. Lastly, the insulating layer 47 (protective insulating film) is laminated over the insulating layer 46 including the electrode layer 24p, 24n.

(Manufacturing Method)

Next, the manufacturing method of the transistor array having the element structure described above will be explained with reference to the drawings.

FIGS. 11A~D are process cross-sectional diagrams showing the transistor array manufacturing method having the element structure related to the fourth embodiment.

Additionally, with regard to processes equivalent to the above-mentioned field effect transistors FETp, FETn and the photosensors PS, further detailed explanation is abbreviated or omitted. Also, in the following description the annotations of the "$1^{st}$ process" through the "$8^{th}$ process" are used for convenience in the explanation and are not directly related to the actual manufacturing process.

Initially, like the manufacturing method in the $1^{st}$ through $4^{th}$ processes (FIGS. 2A~D) described in the above first embodiment, the polysilicon semiconductor layer 21p and the impurity layer 22p composed of p+ silicon, as well as the polysilicon semiconductor layer 21n, the impurity layer 22n composed of n+ silicon and the impurity layer 23n composed of n− silicon are fabricated in the formation areas of the field effect transistors FETp, FETn in the left area of the drawings over the insulating layer 41, 42 in a laminated structure on the entire surface side of the substrate SUB.

Next, in the $5^{th}$ process as shown in FIG. 11A, after forming the insulating layer 43 on the entire surface side of the substrate SUB, the gate electrode Gp, Gn in the formation areas (generally, over the above-stated semiconductor layer 21p, 21n) of the field effect transistors FETp, FETn together with the bottom gate electrode BGx in the formation areas of each of the photosensors PS are simultaneously fabricated in the same process with metal film having a light block effect such as aluminum alloy, chromium alloy, etc.

Subsequently, in the $6^{th}$ process as shown in FIG. 11B, like the $6^{th}$ through $8^{th}$ processes described in the above second embodiment, the semiconductor layer 51 and the block insulating layer 54 along with the impurity layer 57, 58 as an ohmic contact layer are formed into predetermined shapes via the insulating layer 44 (lower gate insulating film) over the gate electrode Gp, Gn and the bottom gate electrode BGx. Furthermore, the laminated structure of the source electrode 52 and the drain electrode 53 (equivalent to the above-mentioned source electrode 12 and the drain electrode 13) is fabricated which extends over the impurity layer 57, 58.

Then, in the $7^{th}$ process as shown in FIG. 11C, a laminated structure of the insulating layer 45 (upper gate insulating layer) is fabricated on the entire surface side of the substrate SUB, and furthermore the top gate electrode TGx composed of a transparent electrode layer is formed to correspond with the above-mentioned semiconductor layer 51 (channel region).

Next, in the $8^{th}$ process as shown in FIG. 11D, after accomplishing the laminated structure of the insulating layer 46 on the surface side of the substrate SUB including the top gate electrode TGx, each of the insulating layer 43~45 are bored from the upper surface of this insulating layer 46 and the electrode wiring 24p, 24n (source and drain electrodes) is formed which reaches to the impurity layer 22p and 22n of the field effect transistors FETp, FETn.

In this manner, a functional circuit which contains at least a plurality of the field effect transistors FETp, FETn (low-temperature thin-film transistors) is formed in the left area of the drawings and a plurality of photosensors PS containing what is termed as a double-gate thin-film transistor (amorphous silicon thin-film transistor) is formed in the right area of the drawings.

Lastly, the transistor array having the element structure as shown in FIG. 10 is completed by forming a laminated structure of the insulating layer 47 (protective insulating film) on the entire surface side of the substrate SUB.

Consequently, according to the transistor array which has such an element structure and manufacturing method like the above second embodiment, since the configuration is formed in the same layer as applied to at least the conductor layer portion (gate electrode Gp, Gn and the bottom gate electrode BGx) of the field effect transistors FETp, FETn and the photosensors PS, this conductor layer can be simultaneously fabricated in the same process (shared process) and said to have the characteristic effect of shortening the manufacturing process and achieving reduction in the production costs.

Furthermore, in the transistor array element structure related to the above first through fourth embodiments, although examples of the field effect transistors using a polysilicon semiconductor layer and either the field effect transistors or the photosensors using an amorphous silicon semiconductor layer formed in one unit on a single substrate are described, the present invention is not restricted to this. For example as described below, it is also possible to have a configuration formed with the field effect transistors using a polysilicon semiconductor layer intermingled among both the field effect transistors and the photosensors using an amorphous silicon layer on a single substrate.

Fifth Embodiment

Next, the transistor array element structure related to the present invention and the fifth embodiment of its manufacturing method will be briefly explained with reference to the drawings.

Figure 12:
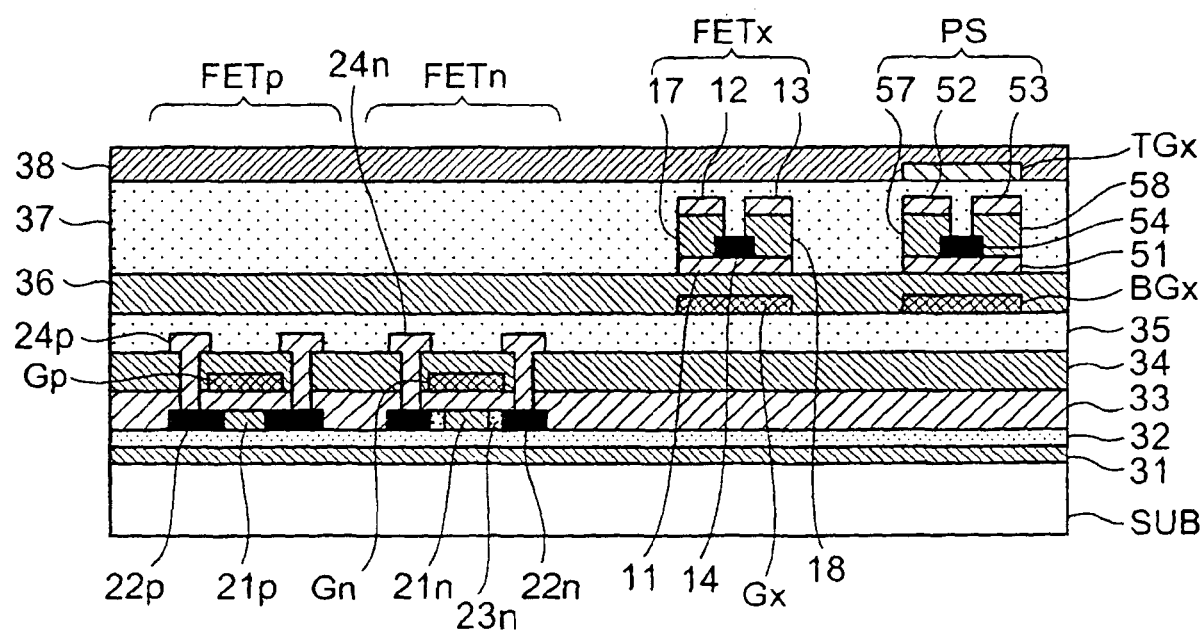
FIG. 12 is an outline cross-sectional diagram showing the fifth embodiment of the transistor array element structure related to the present invention.

FIG. 12 is an outline cross-sectional diagram showing the fifth embodiment of the transistor array element structure related to the present invention.

Here, with respect to any configuration equivalent to the above fourth embodiment, further detailed explanations are abbreviated or omitted. In the embodiment shown in FIG. 12, the field effect transistors FETp, FETn using the polysilicon semiconductor layer 21p, 21n along with both of the field effect transistors FETx using an amorphous silicon layer 11 and the photosensors PS using the amorphous silicon semiconductor layer 51 are formed in one unit on the single substrate SUB. Also, like the above first and third embodiments the field effect transistors FETp, FETn have a configuration formed independently of the field effect transistors FETx and the photosensors PS without mutually sharing a conductor layer, yet are intermingled on the single substrate SUB.

Here, since the field effect transistors FETp, FETn and the photosensors PS applicable to this embodiment have an element structure equivalent to the configuration in the transistor array (refer FIG. 8) described in the above third embodiment, further detailed explanations are omitted. Also, since field effect transistors FETx have an element structure equivalent to the configuration in the transistor array (refer to FIG. 1) in the above first embodiment, further explanation is abbreviated.

(Manufacturing Method)

Next, the manufacturing method of the transistor array having the element structure described above will be explained with reference to the drawings.

FIGS. 13A~D are process cross-sectional diagrams showing the transistor array manufacturing method having the element structure related to the fifth embodiment.

Additionally, with regard to processes equivalent to the above-mentioned field effect transistors FETp, FETn and the photosensors PS, further detailed explanation is abbreviated or omitted. Also, in the following description the annotations of the "1$^{st}$ process" through the "11$^{th}$ process" are used for convenience in the explanation and are not directly related to the actual manufacturing process.

Initially, like the manufacturing method in the 1$^{st}$ through 7$^{th}$ processes (FIGS. 2A~D and FIGS. 3A~C) described in the above first embodiment, a plurality of the field effect transistors FETp, FETn (low-temperature polysilicon thin-film transistors) using a polysilicon layer are formed in the left area of the drawings over the insulating layer 31, 32 in a laminated structure on the entire surface of the substrate SUB.

Figure 13A:
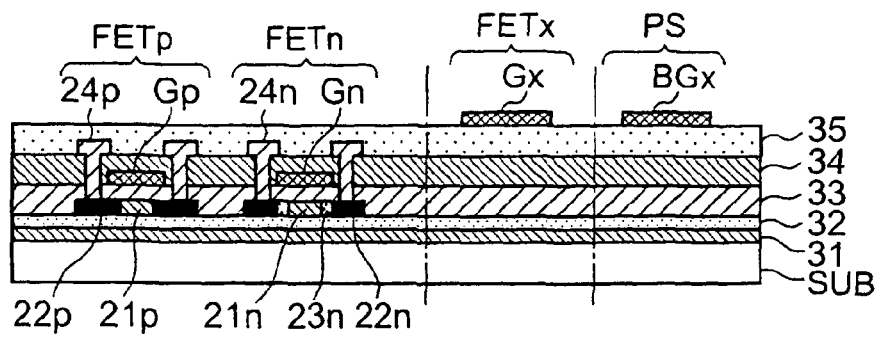
FIGS. 13A–D are process cross-sectional diagrams showing the transistor array manufacturing method having the element structure related to the fifth embodiment.

Next, in the 8$^{th}$ process as shown in FIG. 13A for example, after forming the insulating layer 35 composed of Silicon Nitride (SiN) which covers the above-mentioned electrode wiring 24p, 24n on the entire surface side of the substrate SUB using a plasma CVD method, etc., and furthermore a laminated structure of metal film which has a light blocking effect such as aluminum alloy or chromium alloy, etc., is deposited using a sputtering technique or an evaporation technique. Then, the bottom gate electrode BGx and the gate electrode Gx are fabricated in the formation areas for each of the photosensors PS and the field effect transistors FETx by patterning this metal film into predetermined electrode shapes using a photoresist mask.

Figure 13B:
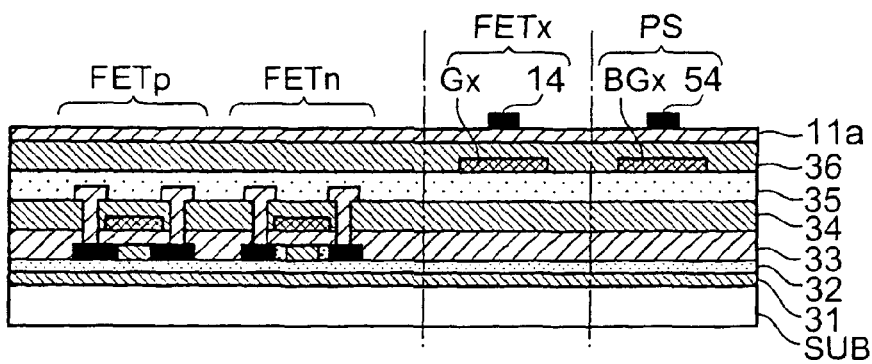

Subsequently, in the 9$^{th}$ process as shown in FIG. 13B for example, after forming the insulating layer 36 (lower gate insulating film) composed of silicon nitride over the areas including at least the above-mentioned bottom gate electrode BGx and the gate electrode Gx using a plasma CVD method, etc., furthermore a laminated structure is sequentially formed of the amorphous silicon film 11a and the insulating layer composed of silicon nitride. Then, the insulating layer composed of silicon nitride is patterned using a photoresist mask and the block insulating layer 14, 54 (stopper film) is implanted over the amorphous silicon film 11a corresponding to the formation areas of the bottom gate electrode BGx and gate electrode Gx. Furthermore, like the above 1$^{th}$ process the amorphous silicon film 11a is accomplished at a temperature condition (second temperature condition) of generally about 300 degrees Celsius (572 degrees Fahrenheit).

Here, the block insulating layer 14, 54 is to protect the channel region (semiconductor layer 11, 51 described later) composed of the amorphous silicon film 11a from being damaged in subsequent processes. Additionally, the semiconductor layer 11, 51 (channel region) composed of amorphous silicon film 11a is formed by a process described later. Since the interface state of the insulating layer (namely, the above-mentioned block insulating layer 14, 54) in contact with the semiconductor layer 11, 51 exerts a significant effect on the element characteristics of the photosensors PS (double-gate photosensors) and the field effect transistors FETx, preferably the semiconductor layer 11, 51 (amorphous silicon film 11a) and the block insulating layer 14, 54 are consecutively formed within a vacuum to prevent interface deterioration.

Figure 13C:
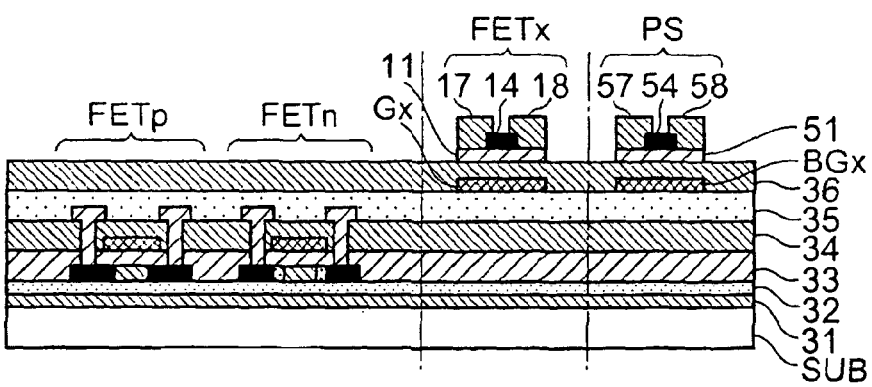

Next, in the 10$^{th}$ process as shown in FIG. 13C, after forming the amorphous silicon film using a plasma CVD method, etc. over the areas including the amorphous silicon film 11a and implanting an impurity layer composed of n+ silicon by doping N-type impurity ions such as Phosphorous (P) ions, etc. on this amorphous silicon film, the impurity layer and the amorphous silicon film 11a are patterned using a photoresist mask to correspond with the formation areas (generally, the formation areas of the bottom gate electrode BGx mentioned above) of the photosensors PS and the formation areas (generally, the formation areas of the gate electrode Gx mentioned above) of the field effect transistors FETx. Then, the impurity layer 17, 18 composed of n+ silicon as an ohmic contact layer is fabricated on the semiconductor layer 11 in formation areas of the field effect transistors FETx and implanted on both sides of the block insulating layer 14 over this semiconductor layer 11. Also, the impurity layer 57, 58 composed of n+ silicon as an ohmic contact layer is fabricated on the semiconductor layer 51 in formation areas of the photosensors PS and implanted on both sides of the block insulating layer 54 over this semiconductor layer 51.

The impurity layer 17, 18 and 57, 58 provide an excellent electrical connection (ohmic connection) through the source electrode 12 and the drain electrode 13 in addition to the semiconductor layer 11, and an equal electrical connection (ohmic connection) of the source electrode 52 and the drain electrode 53 in addition to the semiconductor layer 51 described later. Moreover, the impurity layer 17, 18 and 57, 58 are implanted in order to prevent excessive leakage current in a reversed electric field. Furthermore, the amorphous silicon film for fabricating the impurity layer 17, 18 and 57, 58 is also accomplished at a temperature condition of generally about 300 degrees Celsius (572 degrees Fahrenheit) like the above $1^{st}$ process previously described.

Figure 13D:
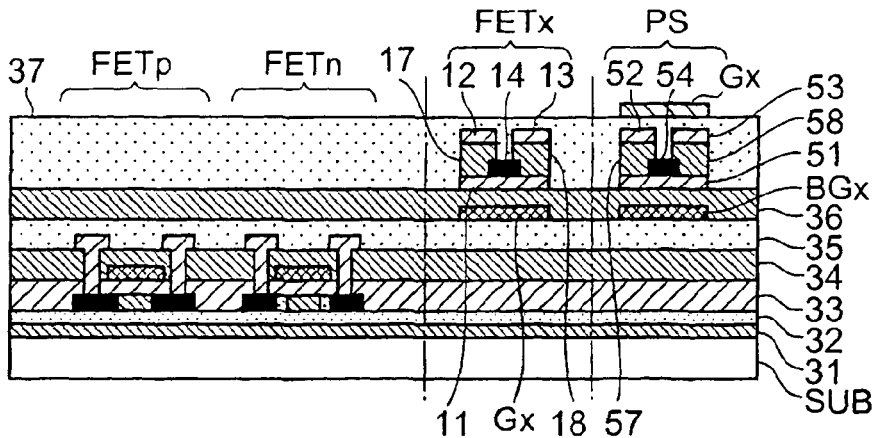

Subsequently, in the $11^{th}$ process as shown in FIG. 13D, a laminated structure of metal film such as aluminum alloy, chromium alloy, etc. is fabricated using a deposition method such as a sputtering technique, an evaporation technique, etc. over the areas at least including the above-stated impurity layer 17, 18 and 57, 58 using a sputtering technique or an evaporation technique. Then, the source electrode 12 and the drain electrode 13 of the field effect transistors FETx are formed as well as the source electrode 52 and drain electrode 53 of the photosensors PS are formed which are laminated and extend at least over the above-stated impurity layer 17, 18 and 57, 58 respectively by patterning this metal film into predetermined electrode shapes using a photoresist mask.

Then, after a laminated structure of the insulating layer 37 (upper gate insulating layer) composed of Silicon Nitride (SiN) is fabricated using a plasma CVD method on the entire surface side of the substrate SUB and furthermore the transparent electrode layer composed of tin oxide film, Indium Oxide (ITO) film, etc. is deposited using an evaporation technique, etc., the top gate electrode TGx of the photosensors PS is fabricated by patterning to correspond with the above-described semiconductor layer 51 (channel region) using a photoresist mask.

Next, the transistor array having the element structure as shown in FIG. 12 is completed by forming a laminated structure of the insulating layer 38 (protective insulating film) composed of Silicon Nitride (SiN) using a plasma CVD method, etc. at least on the entire surface side of the substrate SUB.

According to the transistor array having such a configuration, since it can be formed in one unit on a single substrate and excellently maintain the element characteristics of the pixels that have each of the transistors and the transistor structure which constitute a pixel array (photosensor array, etc.) as shown in an example application and the driver circuits (top gate driver, bottom gate driver, source driver, etc.) which are peripheral circuits to be mentioned later, a more compact size and thin-shaped design is realizable. Furthermore, while aiming for a reduction in production costs, improvement in the production yield by simplification of the manufacturing process or a reduction in the number of components (devices) for such as an image processor, etc. which comprises this pixel array is attainable.

Sixth Embodiment

Next, the transistor array element structure related to the present invention and the sixth embodiment of its manufacturing method will be briefly explained with reference to the drawings.

Figure 14:
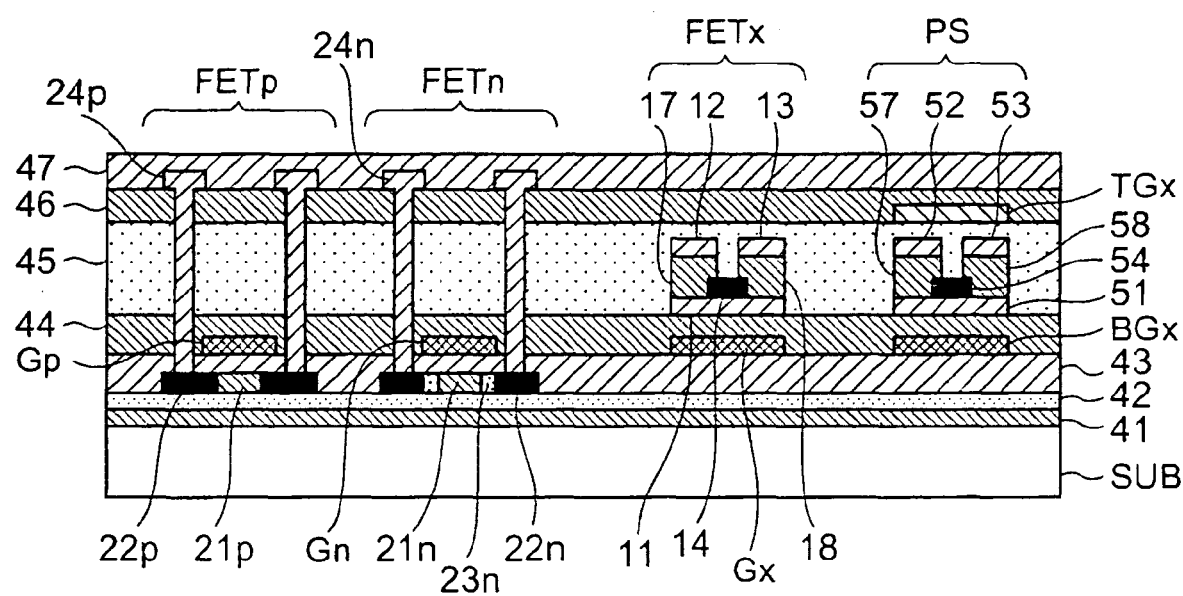
FIG. 14 is an outline cross-sectional diagram showing the sixth embodiment of the transistor array element structure related to the present invention.

FIG. 14 is an outline cross-sectional diagram showing the sixth embodiment of the transistor array element structure related to the present invention.

Here, with respect to any configuration equivalent to the above first through fourth embodiments, further detailed explanations are abbreviated or omitted. In the embodiment shown in FIG. 14, the field effect transistors FETp, FETn use the polysilicon semiconductor layer 21p, 21n as well as the field effect transistors use the amorphous silicon semiconductor layer 11 and the photosensors PS use the amorphous silicon layer 51 respectively which are formed in one unit on the single substrate SUB. Furthermore, like the second and fourth embodiments mentioned above, the field effect transistors FETp, FETn as well as the field effect transistors FETx and the photosensors PS share a portion of a conductor layer (the gate electrode and the bottom gate electrode) and have a configuration formed intermingled on the single substrate SUB.

Here, since the field effect transistors FETp, FETn and the photosensors PS applicable to this embodiment have an element structure equivalent to the configuration in the transistor array (refer FIG. 10) described in the above fourth embodiment, further detailed explanations are omitted. Also, since field effect transistors FETx have an element structure equivalent to the configuration in the transistor array (refer to FIG. 5) in the above second embodiment, further explanation is also abbreviated.

(Manufacturing Method)

Next, the manufacturing method of the image processor having the element structure described above will be explained with reference to the drawings.

FIGS. 15A~C and FIGS. 16A~B are process cross-sectional diagrams showing an image processor manufacturing method related to the element structure.

Additionally, with regard to processes equivalent to the above-mentioned first manufacturing method, further detailed explanations are abbreviated or omitted. Additionally, in the following description the annotations of the "$1^{st}$ process" through the "$9^{th}$ process" are used for convenience in the explanation and there may be optional supplemental processes in the interim. Also, there can be a modification to other processes where substitution is possible which are not directly related to the actual manufacturing process.

Initially, like the manufacturing method in the $1^{st}$ through $4^{th}$ processes (FIGS. 2A~D) described in the above first embodiment, the semiconductor layer 21p composed of polysilicon and the impurity layer 22p composed of p+ silicon, as well as the semiconductor layer 21n composed of polysilicon, the impurity layer 22n composed of n+ silicon and the impurity layer 23n composed of n– silicon are fabricated in the formation areas of each of the field effect transistors FETp, FETn in the left area of the drawings over the insulating layer 41, 42 in a laminated structure on the entire surface side of the substrate SUB.

Figure 15A:
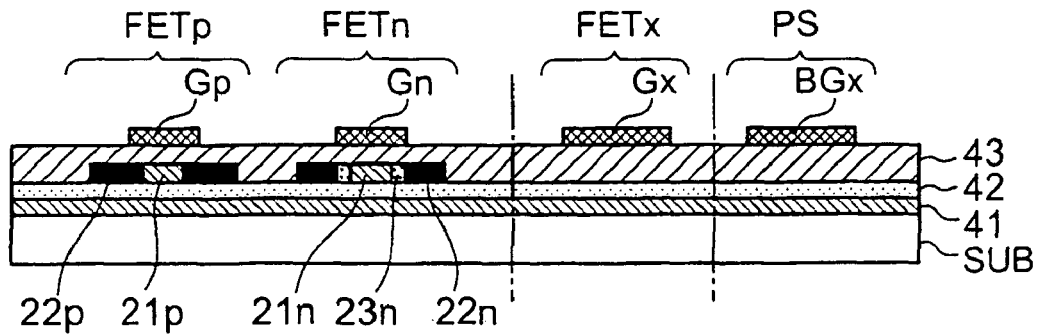
FIGS. 15A–C and FIGS. 16A–B are process cross-sectional diagrams showing an image processor manufacturing method related to the element structure.

Next, in the $5^{th}$ process as shown in FIG. 15A, after fabricating the insulating layer 43 (gate insulating film) composed of Silicon Oxide (SiO$_2$) using a plasma CVD method, etc. over the areas including at least the above-described semiconductor layer 21p with the impurity layer 22p as well as the semiconductor layer 21n with the impurity layer 23n and the impurity layer 22n, furthermore a laminated structure of metal film which has a light blocking effect such as aluminum alloy, chromium alloy, etc. is fabricated using a deposition method such as a sputtering technique, an evaporation technique, etc. Then, the gate electrode Gp and Gn for the field effect transistors FETp, FETn as well as the bottom gate BGx of the photosensors PS and the gate electrode Gx for the field effect transistors FETx are simultaneously fabricated in the same process by patterning this metal film into predetermined electrode shapes using a photoresist mask.

Figure 15B:
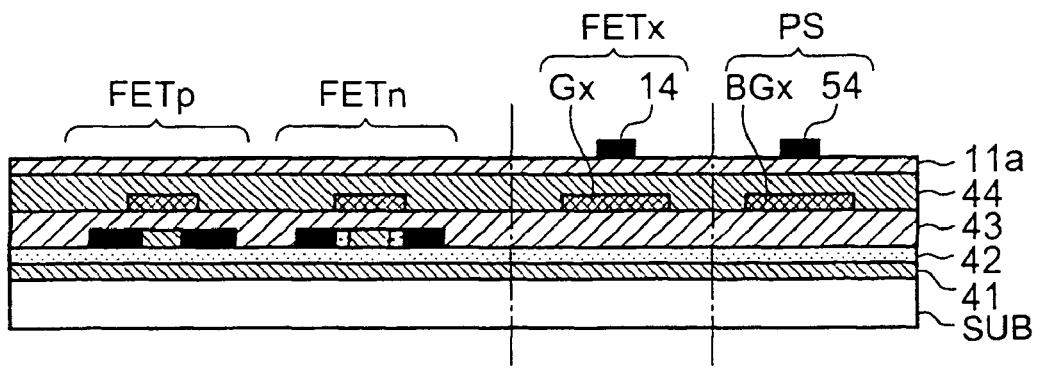

Next, in the 6$^{th}$ process as shown in FIG. 15B, after sequentially forming a laminated structure of the insulating layer 44 (lower gate insulating film) and the amorphous silicon film 11a using a plasma CVD method over the areas including at least the above-described gate electrode Gp, Gn, Gx and the bottom gate electrode BGx, the block insulating layers 14, 54 (stopper film) are implanted over the amorphous silicon film 11a to correspond with the formation areas the top gate electrode BGx and gate electrode Gx.

Figure 15C:
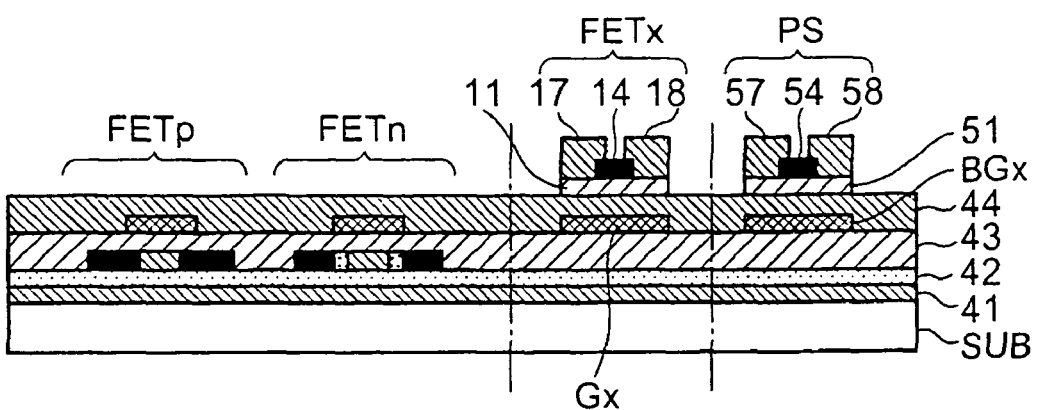

Subsequently, in the 7$^{th}$ process as shown in FIG. 15C, after forming at least the amorphous silicon film using a plasma CVD method, etc. over the areas including the amorphous silicon film 11a and the block insulating layer 14 as well as implanting an impurity layer composed of n+ silicon by doping N-type impurity ions on this amorphous silicon film, the impurity layer and the amorphous silicon film 11a are patterned using a photoresist mask to correspond with the formation areas (generally, the formation areas of the gate electrode Gx mentioned above) of the field effect transistors FETx and the formation areas (generally, the formation areas of the bottom gate electrode BGx) of the photosensors PS. Next, the semiconductor layer 11 and the impurity layer 17, 18 composed of n+ silicon as well as the semiconductor layer 51 and the impurity layer 57, 58 composed of n+ silicon are formed.

Figure 16A:
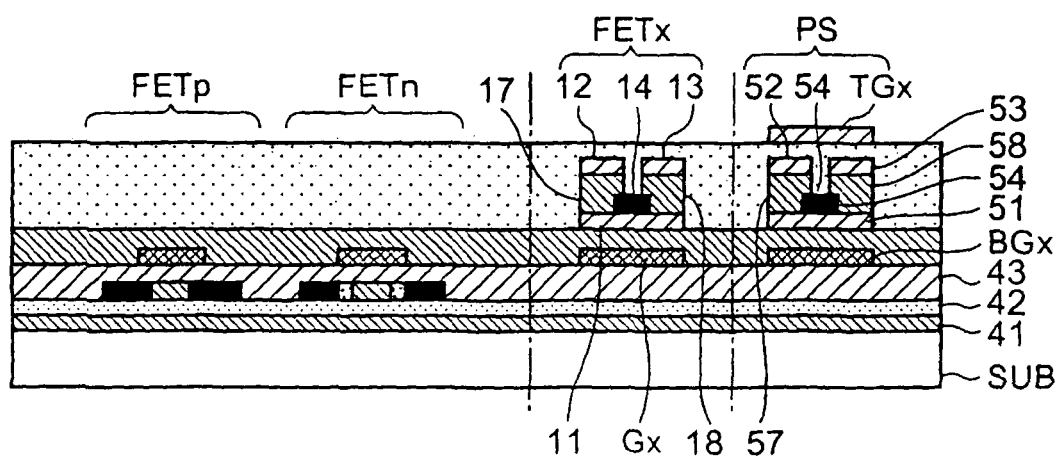

Next, in the 8$^{th}$ process as shown in FIG. 16A, after fabricating a laminated structure of metal film over at least the impurity layer 17, 18 and 57, 58, this metal film is patterned into predetermined electrode shapes. The source electrode 12 and the drain electrode 13 of the field effect transistors FETx as well as the source electrode 52 and drain electrode 53 of the photosensors PS are implanted.

Subsequently, after fabricating a laminated structure of the insulating layer 45 (upper gate insulating layer) on the entire surface side of the substrate SUB, transparent electrode layers are formed composed of tin oxide film, Indium Oxide (ITO) film, etc. by patterning to correspond with the above-described semiconductor layer 11 (channel region) and the top gate electrode TGx.

Figure 16B:
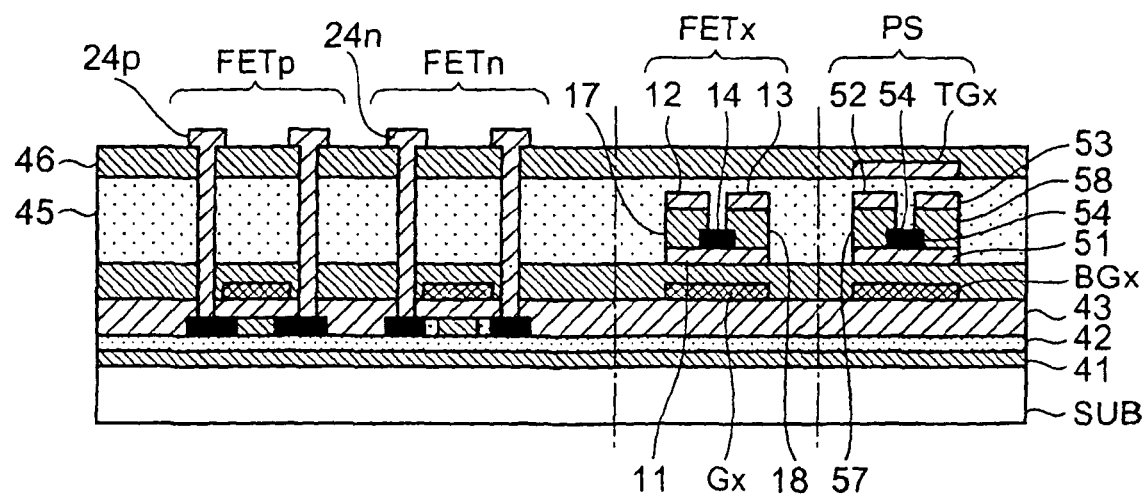

Then, in the 9$^{th}$ process as shown in FIG. 16B, after forming the insulating layer 46 on the entire surface side of the substrate SUB, contact holes are bored in at least each insulating layer 45, 44, 43 from the upper surface of this insulating layer 46 which reach the impurity layer 22p, 22n of the field effect transistors FETp, FETn and then metal film is embedded in the inner section of these contact holes. Further, the electrode wiring 24p, 24n is implanted which functions as the source and drain electrodes for the field effect transistors FETp, FETn by patterning this metal film into predetermined electrode shapes.

Lastly, the transistor array having the element structure as shown in FIG. 14 is completed by forming a laminated structure of the insulating layer 47 (protective insulating film) on the entire surface side of the substrate SUB.

Accordingly, like the above-described fifth embodiment, the transistor array having such a configuration can be formed in one unit on a single substrate and excellently maintain the element characteristics of the pixels that have each of the transistors and the transistor structure which constitute a pixel array (photosensor array, etc.) as shown in an example application and driver circuits (top gate driver, bottom gate driver, source driver, etc.) which are peripheral circuits, can realize a more compact size and thin-shaped design. In particular, since the configuration is formed in the same layer as applied to at least the conductor layer portion (the gate electrode Gp, Gn, Gx and the bottom gate electrode BGx) of the field effect transistors FETp, FETn as well as the field effect transistors FETx and the photosensors PS, this conductor layer can be simultaneously fabricated in the same process (shared process), thus shortening the manufacturing process and a reduction in the production costs can be achieved.

In the element structure of the transistor array related to the above-described first through sixth embodiments, the field effect transistors FETp, FETn as well as the field effect transistors FETx and the photosensors PS which are formed in one unit on the substrate SUB may have a configuration electrically connected to one another by a plurality of interlayer connection wiring as shown below.

Figure 17:
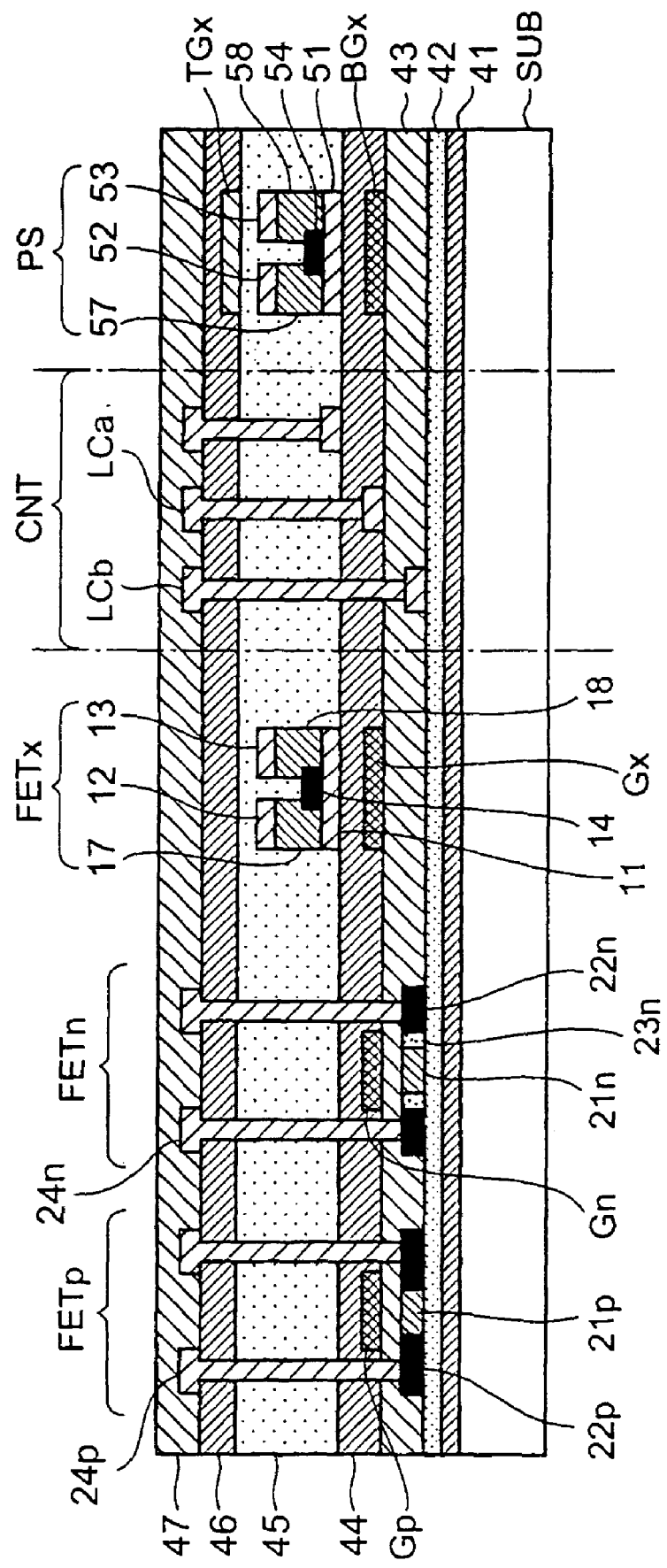
FIG. 17 is an outline cross-sectional diagram showing an example configuration of the interlayer connection wiring applicable to the transistor array related to the present invention.

FIG. 17 is an outline cross-sectional diagram showing an example configuration of the interlayer connection wiring which connects the field effect transistors and the photosensors applicable to each embodiment of the transistor array related to the present invention.

The interlayer wiring layers related to each embodiment, as shown in FIG. 17 for example, the contact areas CNT (wiring connection areas) are provided for a plurality of interlayer connection wiring for the purpose of electrically connecting one another of the various interlayer between areas which form a functional circuit containing the field effect transistors FETp, FETn on the substrate SUB and areas which form a photosensor array containing a plurality of the photosensors PS. As for the contact areas CNT, the contact wiring LCa (interlayer connection wiring) which electrically connects a functional circuit composed of the above-stated field effect transistors and a photosensor array besides the internal wiring LCb (interlayer connection wiring) which electrically connects the functional circuit inner sections with the field effect transistors FETp, FETn, FETx are provided.

In this case, either of the contact wiring LCa or the internal wiring LCb may be mutually shared with the contact wiring LCa and the internal wiring LCb and can have a configuration which reduces the amount of interlayer connection wiring. Furthermore, this makes it possible to simultaneously fabricate the contact wiring LCa and the internal wiring LCb for example in the same process as the electrode layer 24p, 24n (source and drain electrodes) contained in the field effect transistors FETp, FETn.

Moreover, although FIG. 17 shows an example of the contact areas CNT set to the element structure of the transistor array shown in FIG. 14 which form the interlayer connections (the contact wiring LCa and the internal wiring LCb), the present invention is not limited to this. Needless to say, the interlayer connection wiring provided in the contact areas CNT can be formed in optional areas of the transistor array element structure of each embodiment described above.

First Example Application

Next, the first example application of the transistor array related to the present invention stated above will be explained in detail with reference to the drawings. Here, the case of a transistor array related to the above embodiments as applied to an image processor (image reader/image scanner) will be explained.

First, the entire configuration of the image processor which can apply the transistor array related to the present invention will be explained.

Figure 18:
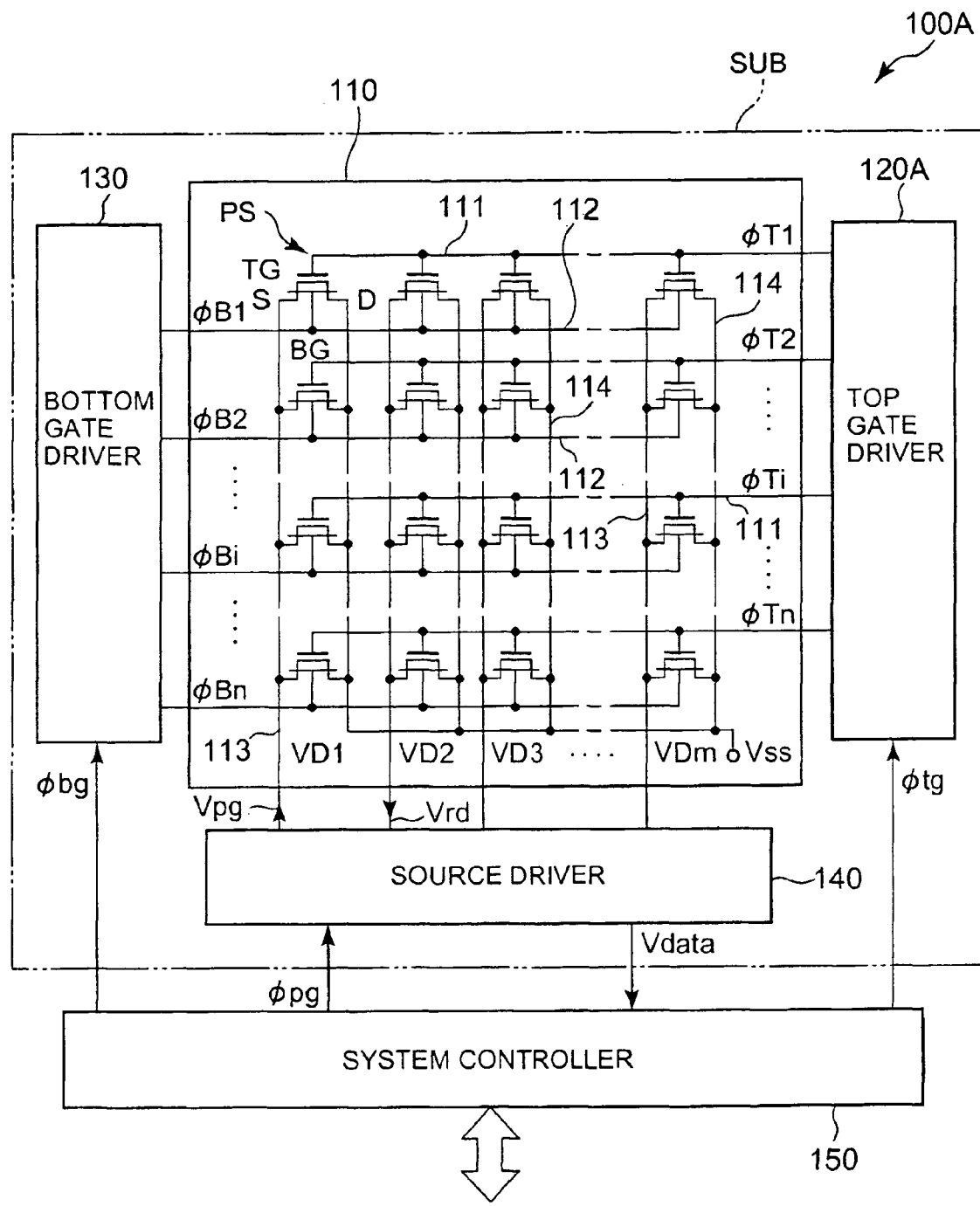
FIG. 18 is an entire outline configuration diagram showing the first example case of applying the transistor array to the image processor related to the present invention.

FIG. 18 is an entire outline configuration diagram showing the first example case of applying the transistor array to the image processor related to the present invention.

Referring to FIG. 18, an image processor 100A related to the example application, in summary, has a configuration comprising a photosensor array 110, a top gate driver 120A, a bottom gate driver 130, a source driver 140 and a system controller 150. The photosensor array 110 (pixel array) performs a two-dimensional array (for example, a matrix form arranged in n rows×m columns), for instance, of a plurality of the photosensors PS (reading pixels: equivalent to the photosensor PS described in the above third through sixth embodiments). The top gate driver 120A (driver circuit, first scanning driver circuit) is connected to the top gate lines 111 by which the connection extends in the row writing direction to the top gate terminals TG (equivalent to the above top gate electrode TGx) of each of the photosensors PS and applies sequential scanning signals ØTi (reset pulses described later: i=optional natural numbers; i=1, 2, ... n) to each of the top gate lines 111 (scanning lines). The bottom gate driver 130 (driver circuit, second scanning driver circuit) is connected to the bottom gate lines 112 by which the connection extends in the row writing direction to the bottom gate terminals BG (equivalent to the above bottom gate electrode BGx) of each of the photosensors PS and applies sequential scanning signals ØBi (read-out pulses described later) to each of the bottom gate lines 112. The source driver 140 (driver circuit, signal driver circuit) is connected to the source lines (data lines) by which the connection extends in the column writing direction to the source terminals S (equivalent to the above source electrode 52) of each of the photosensors PS, during which a precharge voltage Vpg is applied to each of the photosensors PS via the source lines 113, reads-out the source line voltages VDj (=data voltage Vrd: j=optional natural numbers; j=1, 2, ... m) corresponding to the carriers stored in each of the photosensors PS. The system controller 150 comprises at least the functional capability for exchanging image data (a read data signal Vdata) acquired between an external function section to perform predetermined transactions by processing, collation, etc. of the image data and a storage section via the source driver 140, during which various control signals Øtg, Øbg, Øpg respectively are supplied to the above-stated top gate driver 120A, bottom gate driver 130 and source driver 140 for controlling the read operation of an imaged object by the photosensor array 110.

Additionally, in the photosensor array 110, the drain lines 114 (common lines) relative to the drain terminals D (equivalent to the drain electrode 53) of each of the photosensors PS are connected in common to predetermined low voltage Vss (for example, ground potential).

Hereinafter, each configuration will be explained in detail.
(Photosensors)

The photosensors PS situated in the photosensor array 110 have specifically a double-gate thin-film transistor structure using an amorphous silicon semiconductor layer like the element structure shown in each of the above third through sixth embodiments. Here, in the element structure shown in each embodiment, the insulating layer 38, 47 forms a laminated structure on the uppermost layer which is a protective coat for preserving the photosensors PS and the upper surface constitutes a detection surface on which an imaged object is directly placed.

Next, the drive control method of the photosensor array mentioned above will be briefly explained with reference to the drawings.

Figure 19:
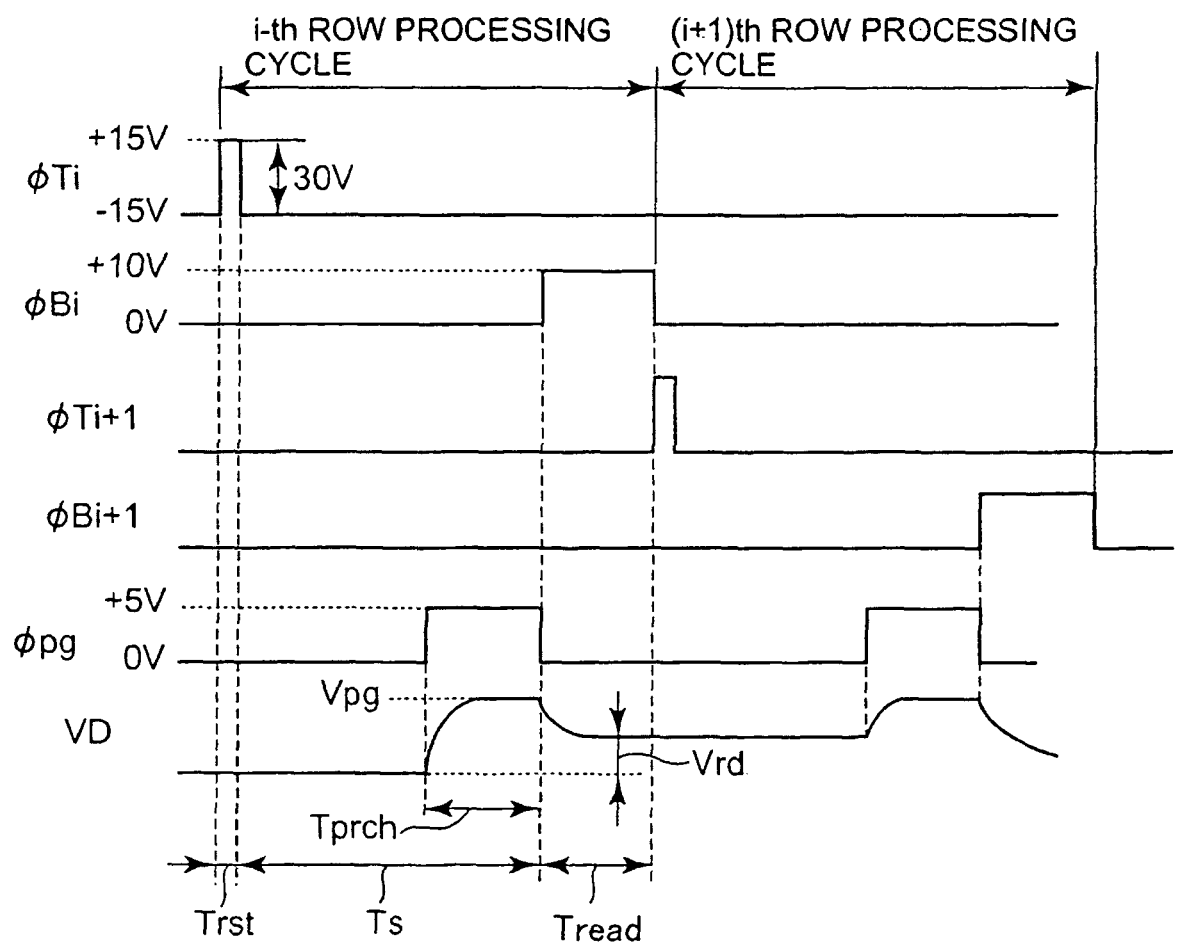
FIG. 19 is a timing diagram showing the fundamental drive control method in the photosensor array mentioned above.

FIG. 19 is a timing diagram showing the fundamental drive control method in the photosensor array mentioned above. Here, the case of reading a fingerprint relative to the drive control method of the photosensor array will be explained.

Figure 20:
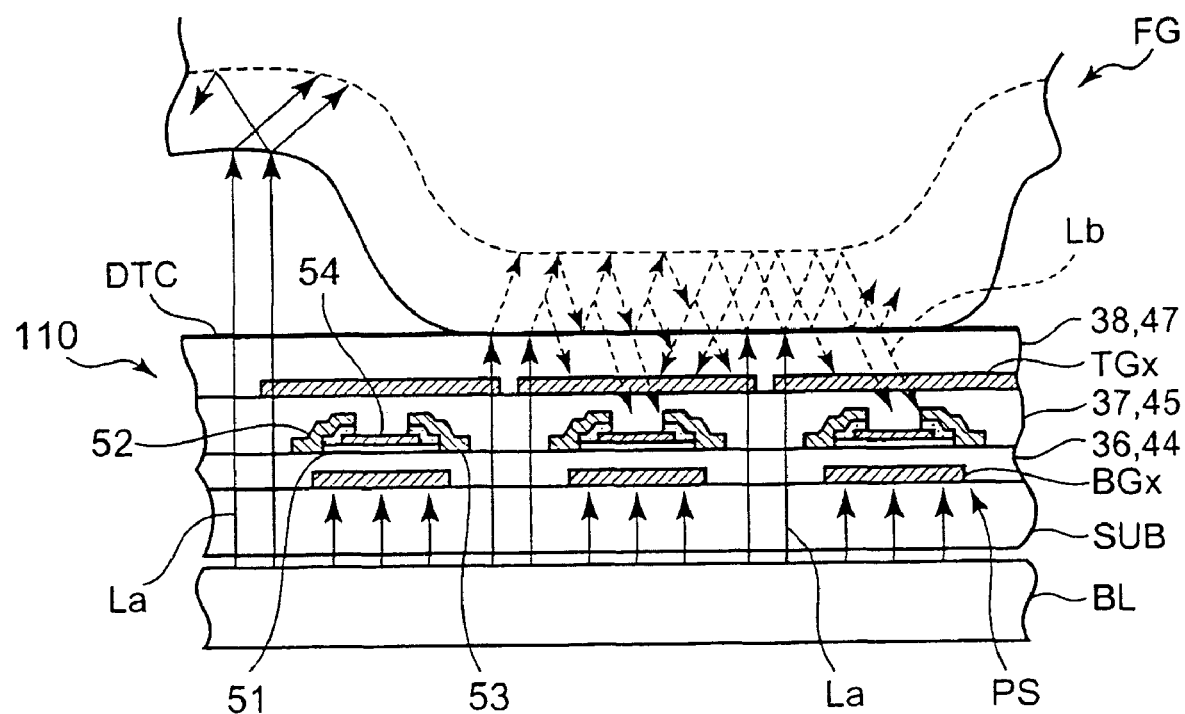
FIG. 20 is a main cross-sectional diagram in the case of applying the image processor to a fingerprint reader related to the example application.

FIG. 20 is a main cross-sectional diagram in the case of applying the image processor related to the example application to a fingerprint reader.

Referring to FIG. 20, a portion of the hatching showing the cross-sectional part of the photosensor array is omitted for convenience of explanation.

As shown in FIG. 19, the basic drive control of the above-mentioned photosensor array is actualized by establishing a reset period Trst, a charge storage period Ta, a precharge period Tprch and a read-out period Tread as a predetermined processing operation period (processing cycle).

First as shown in FIG. 19 set to the reset period Trst, a reset pulse ØTi (for example, high-level top gate voltage (=reset pulse voltage Vtg=+15V) is applied to the top gate terminals TG in the photosensors PS for the i-th rows via the top gate lines 111 by the top gate driver 120A and a reset operation (initialization operation) which releases the carriers (electron-holes) stored in the semiconductor layer 51 is executed.

Next, in the charge storage period Ta by applying a low-level bias voltage ØTi (for example, top gate voltage Vtg=−15V) to the top gate terminals TG by the top gate driver 120A, the above-stated reset operation is terminated and a charge storage operation is (carrier accumulation operation) commenced.

Here, in the charge storage period Ta as shown in FIG. 20, irradiated light La is irradiated toward an object FG (for example, a finger) placed firmly on a detection surface DTC (upper surface of the photosensor array 110) from a backlight BL (light source) formed underneath the transparent substrate SUB in which the photosensors PS are formed, the reflected light Lb crosses the top gate electrode TGx composed of a transparent electrode layer and enters into the semiconductor layer 51. Accordingly, in proportion to the quantity of photo-excitation light which entered into the semiconductor layer 51 during the charge storage period Ta, an electron-hole (known as an exciton) is induced in the incidence effective area (carrier generation region) of the semiconductor layer 51 and the electron-hole is stored near the interface (the boundary of the channel region) of the semiconductor layer 51 and the block insulating layer 54.

Subsequently, set to the precharge period Tprch, precharge pulses (for example, precharge voltage Vpg=+5V) are applied to the source terminals S and a precharge operation stores an electric charge in the source electrode 12 via the source lines 113 based on a precharge signals Øpg by the source driver 140 in parallel to the above-stated charge storage period Ta.

Next, set to the read-out period Tread, after elapsing the above-stated precharge period Tprch, by applying a read-out pulse ØBi (for example, high-level bottom gate voltage Vbg=+10V (=read-out pulse voltage)) to the bottom gate terminals BG via the bottom gate lines 112 by the bottom gate driver 130, a read-out operation is executed which reads the source line voltage VD (data voltage Vrd; voltage signal) corresponding to the carriers (electron-holes) stored in the channel region in the charge storage period Ta by the source driver 140.

Here, there is a source line voltage VD (data voltage Vrd) change tendency in an applied period (read-out period) of the read-out pulses ÅBi in which the data voltage Vrd shows a tendency to decline sharply when there are many stored carriers (bright condition) in the charge storage period Ta, and conversely shows a tendency to decline gradually when there are few stored carriers (dark condition). For example, the luminosity data (brightness and darkness information) corresponding to the light volume which enters the photosensors PS, namely the shade pattern of an object, is detectable by detecting the data voltage Vrd after a predetermined elapsed time period from the beginning of the read-out period Tread.

Then, in this manner by repeating the equivalent operation process relative to each of the rows (i, i+1, . . . ) of the photosensor array 110 stated above and executing a series of luminosity detection operations relative to specified rows (i-th rows) as one cycle, a photosensor system using the photosensors PS can be operated as a monochrome type of image processor (fingerprint reader) which reads a two-dimensional image of an object (for example, a fingerprint pattern) as luminosity data.

Furthermore, although the example application illustrates a configuration comprising photosensors having a double-gate thin-film transistor structure as a photosensor array, the present invention is not restricted to this. A photosensor array which executes a two-dimensional array of a well-known phototransistor, photodiode, etc. may be applied.

(Top Gate Driver/Bottom Gate Driver)

Figure 21:
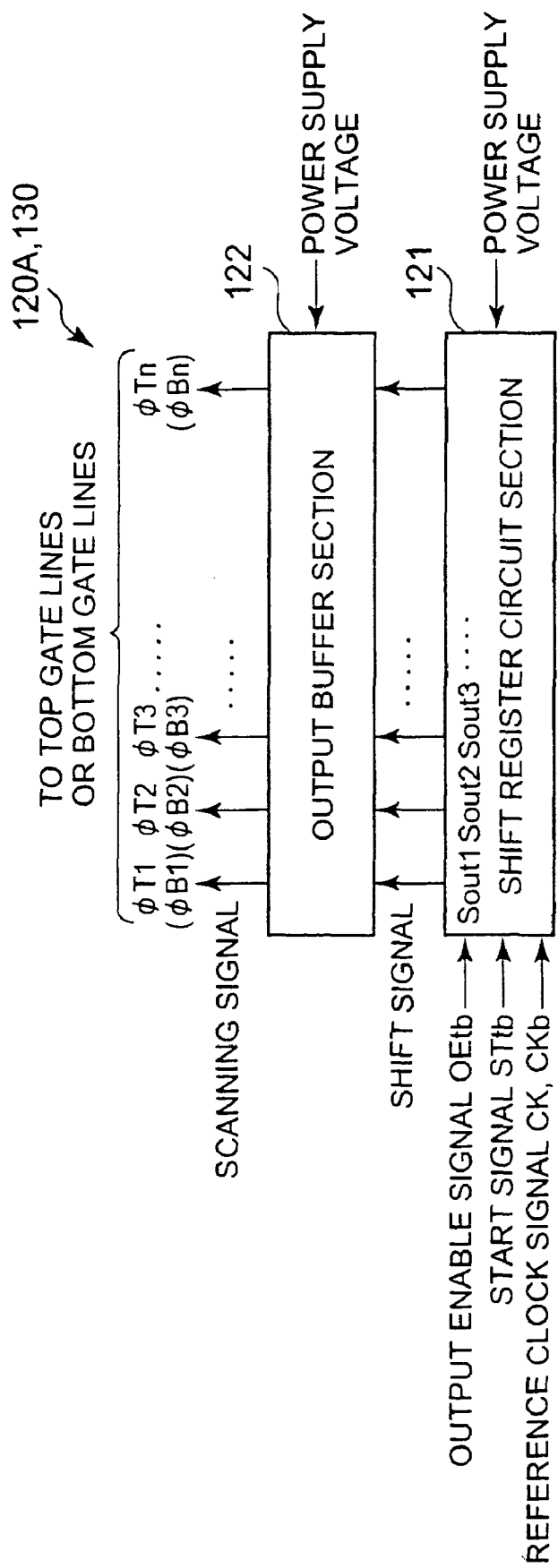
FIG. 21 is a schematic block diagram showing the first example configuration of a top gate driver and a bottom gate driver applicable to the image processor related to the example application.

FIG. 21 is a schematic block diagram showing the first example configuration of a top gate driver and a bottom gate driver applicable to the image processor related to the example application.

Figure 22:
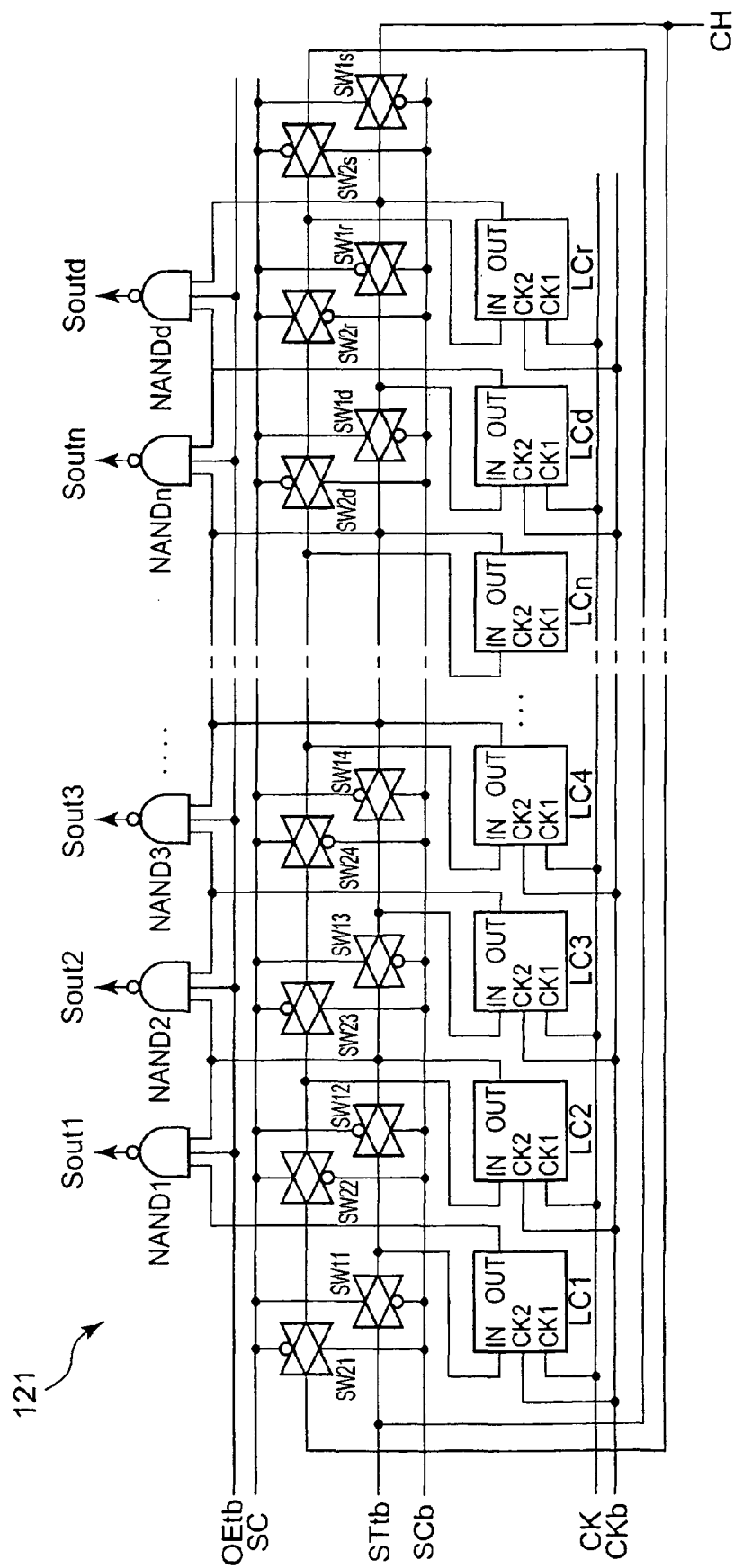
FIG. 22 is a circuit configuration diagram showing an example of a shift register circuit section applicable to the top gate driver or the bottom gate driver related to the example configuration.

FIG. 22 is a circuit configuration diagram showing one example of a shift register circuit section applicable to the top gate driver or the bottom gate driver related to the example configuration.

FIGS. 23A~D are circuit configuration diagrams of a logic element applied to the shift register circuit section and an output buffer section related to the example configuration.

Referring to FIG. 21, the top gate driver 120A and the bottom gate driver 130 configuration comprises at least a shift register circuit section 121 and an output buffer section 122. The shift register circuit section 121 outputs shift signals Sout1, Sout2, . . . Soutn, Soutd (logic signals; timing signal) corresponding to each of the top gate lines 111 or bottom gate lines 112 while sequentially shifting the start signal based on a start signal STtb composed of control signals Øtg or Øbg, two phases of a reference clock signal CK, CKb, and an output enable signal OEtb, etc. supplied from the system controller 150 mentioned above. The output buffer section 122 (output circuit section) amplifies the shift signals Sout1, Sout2, . . . Soutn, Soutd which are sequentially outputted from the shift register circuit section 121 at a predetermined signal level as scanning signals (reset pulses ØTi or read-out pulses ØBi stated above in FIG. 19) which are then applied to each of the top gate lines 111 or the bottom gate lines 112.

The shift register circuit section 121, as shown in FIG. 22, comprises a configuration of a multistage latch circuit group, an analog switch group and an output logical circuit group. The multistage latch circuit group (latch circuits LC1, LC2, . . . LCd, LCr) sequentially shifts to the following stage upon the start signal STtb inputted at predetermined timing based on the reference clock signal CK, CKb and set corresponding to the number (that line number +1) of the top gate lines 111 or bottom gate lines 112. The analog switch group (analog switches SW11, SW12, . . . SW1d, SW1r, SW1s and SW21, SW22, . . . SW2d, SW2r, SW2s) changes the shift direction upon input of the start signal STtb to the latch circuit group based on a shift direction setpoint signal SC, SCb supplied from the system controller 150. The output logic circuit group (3-Input NAND circuits NAND1, NAND2, . . . NANDn, NANDd) controls the extraction of the shift signal from each of the latch circuits LC1, LC2, . . . . LCd, LCr and outputs to the output buffer section 122 based on the output enable signal OEtb.

Here, the reference clock signal CK and CKb supplied to the shift register circuit section 121 from the system controller 150 are clock signals mutually composed of reversed phase. Also, the shift direction setpoint signals SC and SCb are control signals mutually composed of reversed phase.

Figure 23A:
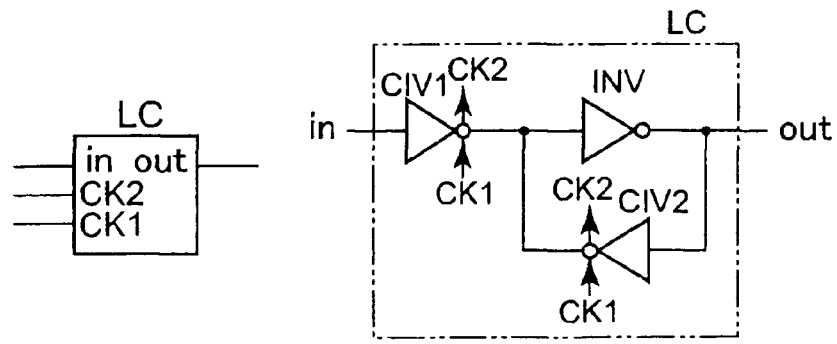
FIGS. 23A—D are circuit configuration diagrams of a logic element applied to the shift register circuit section and an output buffer section related to the example configuration.
Figure 23B:
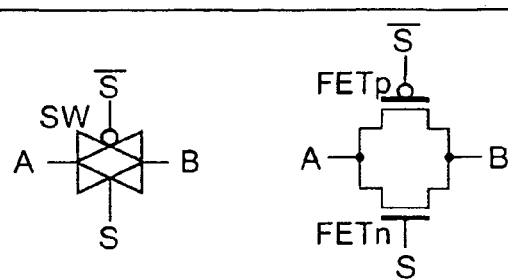

Additionally, the latch circuits LC (LC1~LCr) in FIG. 22 applied to the shift register circuit section 121, for instance in reference to FIG. 23A, a logic circuit using a well-known inverter INV and clocked inverters CIV1, CIV2 can be employed. Also, in reference to FIG. 23B, the analog switch SW (SW11~SW1s, SW21~SW2s) can be applied to the circuit configurations in which the field effect transistors FETp, FETn are connected in parallel as illustrated in each of the above-mentioned embodiments.

Figure 23C:
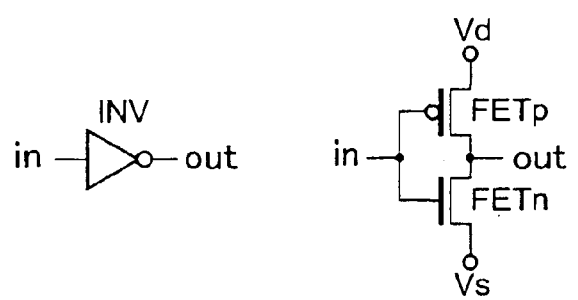
Figure 23D:
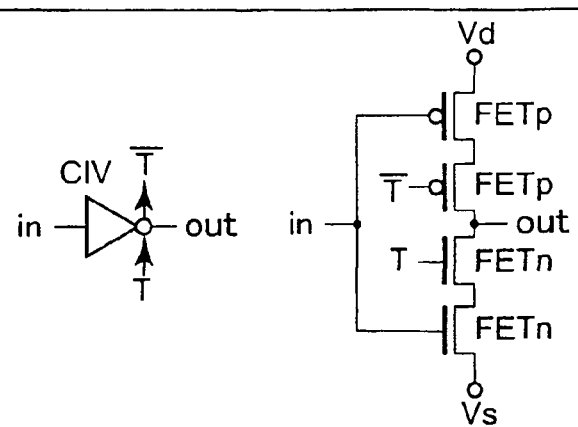

Furthermore, as for the inverter and the clocked inverters CIV (CIV1, CIV2) shown in FIG. 23A and in reference to each other as shown in FIGS. 23C~23D, a circuit configuration in which the above-mentioned field effect transistors FETp, FETn are connected in series is applicable. Moreover, a configuration connected with a common knowledge circuit formation in which the above-stated field effect transistors FETp, FETn together with each of the 3-Input NAND circuits NANDi (NAND1, NAND2, . . . NANDn, NANDd) of the output logic circuit group is applicable.

In addition, the output buffer 122 formed on the output side of the shift register circuit section 121, for example, the inverter INV shown in FIG. 23C can be applied to a circuit configuration connected in series to the odd-numbered stages. Amplification processing is performed while performing reversal processing of the logic signals individually outputted from the shift register circuit section 121 described later so that a predetermined signal level is applied to each of the top gate lines 111 or the bottom gate lines 112.

In the top gate driver 120A or the bottom gate driver 130 having such a configuration, initially if a high-level shift direction setpoint signal SC and a low-level shift direction setpoint signal SCb are supplied to the shift register circuit section 121 from the system controller 150, as the analog switches SW11, SW22, SW13, SW14 . . . SW1d, SW1r, SW1s perform an "ON" operation among the analog switch group each of the latch circuits LC1, LC2, . . . LCd, LCr are connected in a forward direction. Specifically, as the start signal STtb is inputted into the input contact in the latch circuit LC1, each of the latch circuits LC1, LC2, . . . LCd, LCr are set to a connected state sequentially in series so that the output contact out of the latch circuits LCi (LC1, LC2, . . . LCd, LCr) for the i-th stage are connected to the input contact in of the latch circuits LC(i+1) (LC2, LC3, . . . LCd, LCr) of the following stage.

Accordingly, as the start signal STtb is supplied as the control signals Øtg or Øbg from the system controller 150 which sequentially shifts in succession each of the latch circuits LC1, LC2, . . . . LCd, LCr at predetermined timing based on the reference clock signal CK, CKb, the shift signals Souti outputted from the latch circuits LCi (LC1, LC2, . . . LCn, LCd) for the i-th stage are inputted into the $1^{st}$ input contact of the 3-Input NAND circuits NAND1 (NAND1, NAND2, . . . NANDn, NANDd: NANDd=dummy) for the i-th stage. Also, the shift signals Sout(i+1) outputted from the latch circuits LC(i+1) (LC2, LC3, . . . LCd, LCr) for the (i+1)-th stage are inputted into the $3^{rd}$ input contact to the 3-Input NAND circuits NANDi (NAND1, NAND2, . . . NANDn, NANDd) for the i-th stage.

Here, each of the shift signals Souti and Sout(i+1) outputted from the latch circuits LCi and LC(i+1) for the i-th stage and the (i+1)-th stage are high-level. When a high-level of the output enable signal OEtb is supplied from the system controller 150 and inputted into the $2^{nd}$ input contact of the 3-Input NAND circuits NANDi (NAND1, NAND2, . . .

NANDn, NANDd) for the i-th stage, low-level logic signals Souti (Sout1, Sout2, . . . Soutn, Soutd) are outputted to the output buffer section 122 from the 3-Input NAND circuits NANDi and a high-level scanning signal (reset pulses ØTi or read-out pulses ØBi mentioned above) which has a predetermined signal level is outputted to the top gate lines 111 or the bottom gate lines 112 for the i-th rows via this output buffer section 122. In this manner, a sequential scanning signal will be applied in a forward direction from the $1^{st}$ row to the last row of the top gate lines 111 or the bottom gate lines 112.

Conversely, if a low-level shift direction setpoint signal SC and a high-level shift direction setpoint signal SCb are supplied to the shift register circuit section 121 from the system controller 150, as the analog switches SW21, SW12, SW23 . . . SW2d, SW1r, SW2s perform an "ON" operation among the analog switch group and each of the latch circuit LC1, LC2, . . . LCd, LCr are connected in a reverse direction. Specifically, as the start signal STtb is inputted into the input contact in of the latch circuit LCr, each of the latch circuits LCr, LCd, . . . LC2, LC1 are set to a connected state sequentially in series so that the output contact out of the latch circuits LC(i+1) (LC2, LC3, . . . LCd, LCr) for the (i+1)-th stage are connected to the input contact in of the latch circuits LCi (LC1, LC2, . . . LCn, LCd) of the following stage.

Accordingly, as the start signal STtb is supplied from the system controller 150 which sequentially shifts in succession each of the latch circuits LCr, LCd. LC2, LC1 at predetermined timing based on the reference clock signal CK, CKb, the shift signals Sout(i+1) outputted from the latch circuits LC(i+1) (LCr, LCd, . . . LC3, LC2) for the (i+1)-th stage are inputted into the $3^{rd}$ input of the 3-Input NAND circuits NANDi (NANd, NANDn, . . . NAND2, NAND1) for the i-th stage. Also, the shift signals Souti outputted from the latch circuits LCi (LCr, LCd, . . . LC2, LC1) for the i-th stage are inputted into the $1^{st}$ input contact of the 3-Input NAND circuits NANDi (NANd, NANDn, . . . NAND2, NAND1) for the i-th stage.

Here, each of the shift signals Souti and Sout(i+1) outputted from the latch circuits LCi and LC(i+1) for the i-th stage and the (i+1)-th stage are high-level. When a high-level output enable signal OEtb is inputted into the $2^{nd}$ input contact of the 3-Input NAND circuits NANDi (NAN 1, NAND2, . . . NANDn, NANDd) for the i-th stage, low-level logic signals Souti (Sout1, Sout2, . . . Soutn, Soutd) are outputted to the output buffer section 122 from the 3-Input NAND circuits NANDi and high-level scanning signals which have a predetermined signal level are outputted to the top gate lines 111 or the bottom gate lines 112 for the i-th rows. In this manner, a sequential scanning signal (reset pulses ØTi or read-out pulses ØBi) will be applied in a reverse direction from the $1^{st}$ row to the last row of the top gate lines 111 or the bottom gate lines 112.

Consequently, the image processor 100A as shown in FIG. 22 is based on the principle which applies the top gate driver 120A and the bottom gate driver 130 comprising the shift register circuit section 121 with a simplified control method that changes the signal level of the shift direction setpoint signal SC outputted from the system controller 150. As a result, a reverse setting of the image reading direction of an object (the line scanning direction for executing an image reading operation) placed on the photosensor array 110 (the detection surface DTC) can be executed randomly, which is a system that is user-friendly and has greater flexibility can be produced.

Furthermore, in the shift register circuit section 121 illustrated in the embodiment, although the circuit configuration explained is controllable (reversible) and has the capability to change the shift direction in a latch circuit group based on the shift direction setpoint signal outputted from the system controller 150, the present invention is not restricted to this. It is needless to say that you may apply a shift register circuit section (for example, the shift register circuit section 141; refer to FIG. 26 which is applied to a source driver described later) which carries out a shifting operation only in a well-known one direction.

(Source Driver)

Figure 24:
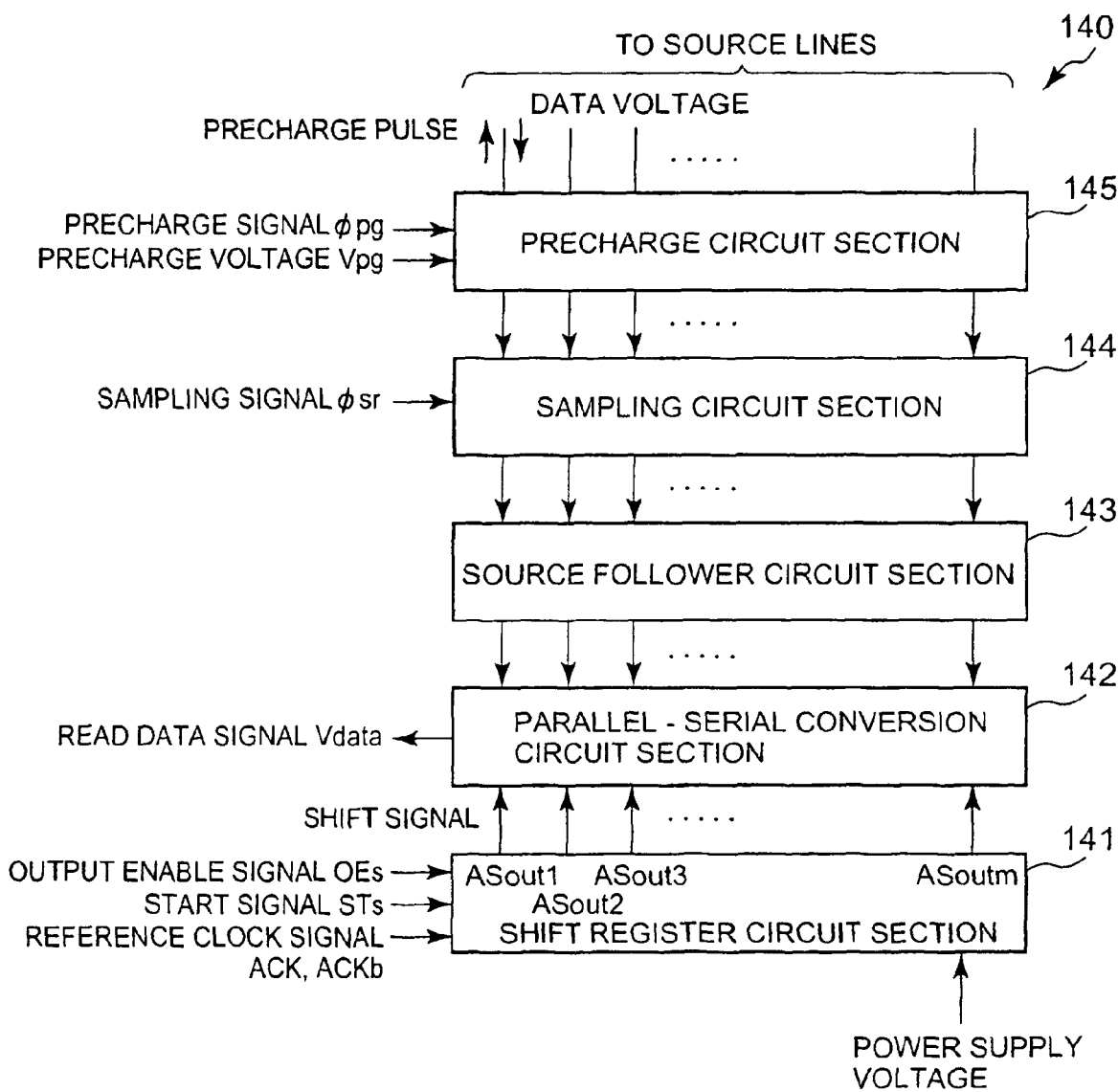
FIG. 24 is a schematic block diagram showing the first example configuration of a source driver applicable to the image processor related to the example application.

FIG. 24 is a schematic block diagram showing the first example configuration of a source driver applicable to the image processor related to the example application.

Figure 25:
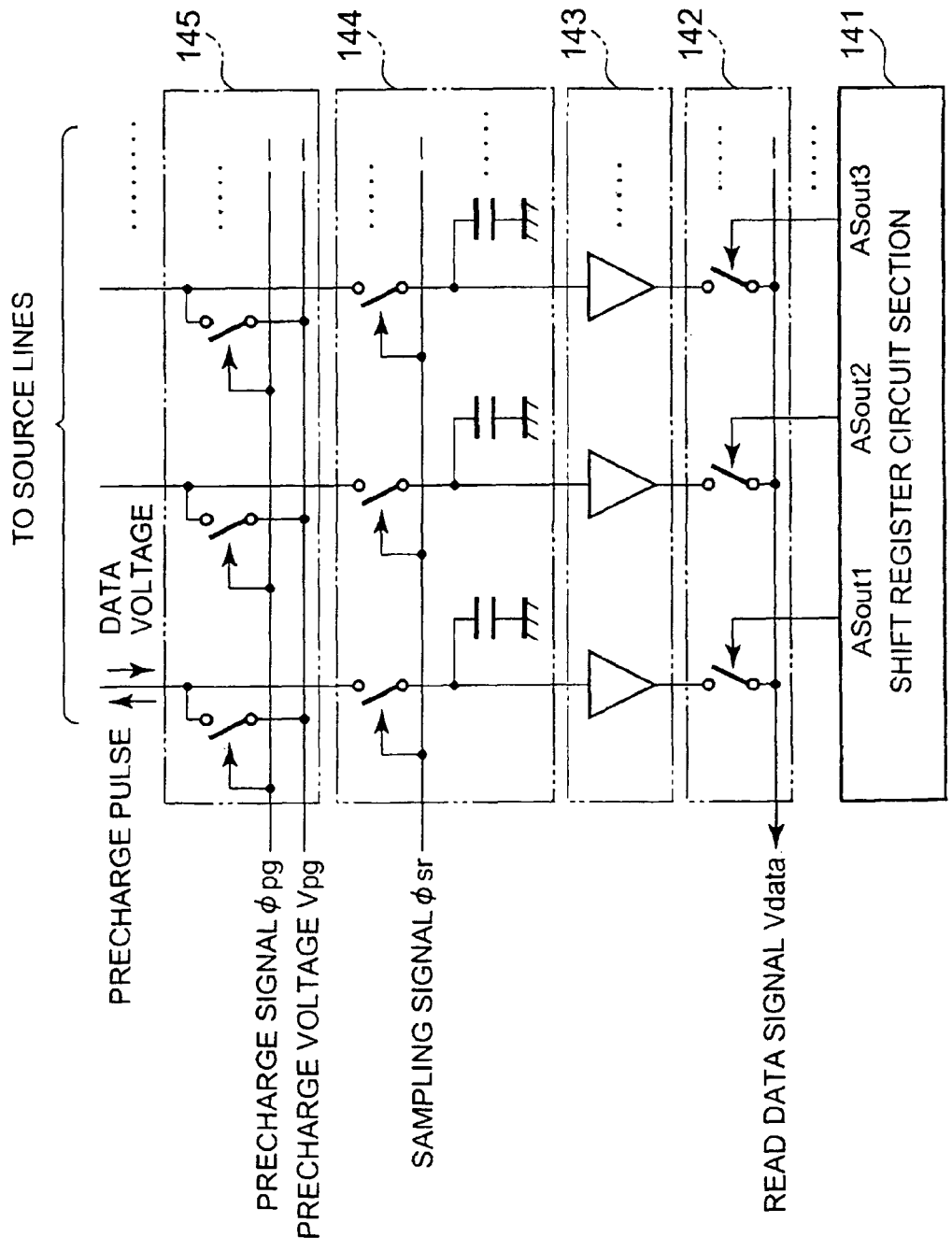
FIG. 25 is a circuit conceptual diagram for explaining the functions of the source driver related to the example configuration.

FIG. 25 is a circuit conceptual diagram for explaining the functions of the source driver related to the example configuration.

Figure 26:
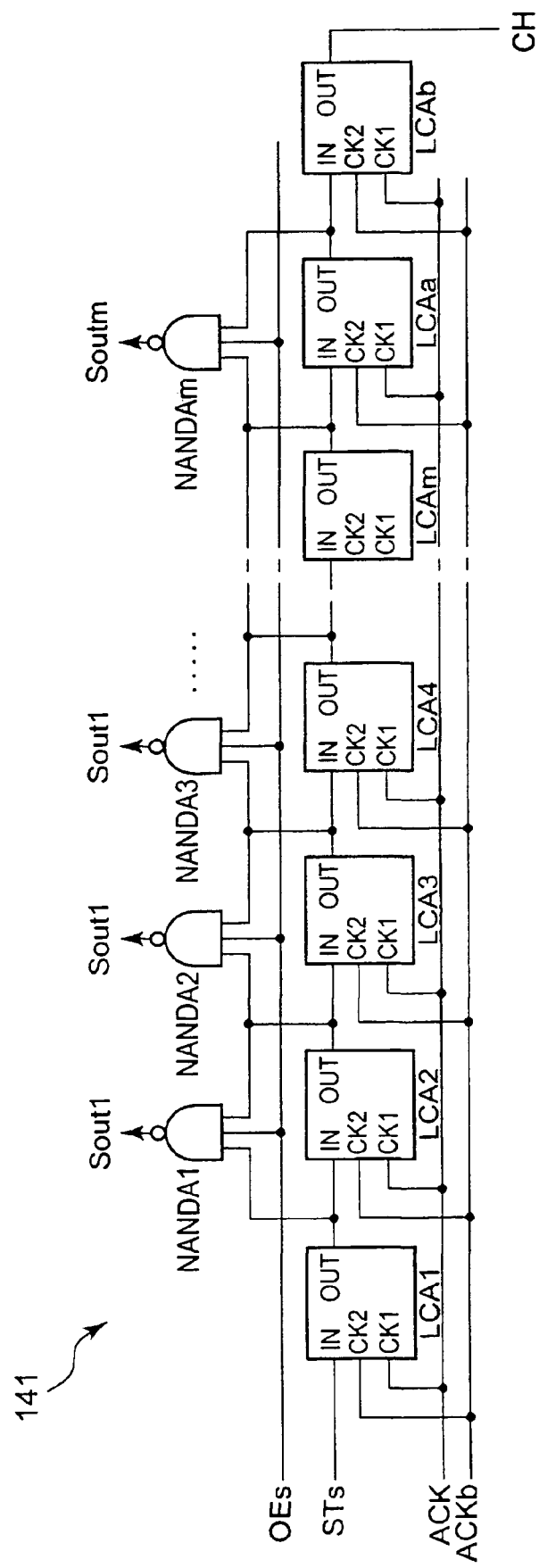
FIG. 26 is a circuit configuration diagram showing an example of the shift register circuit section applicable to the source driver related to the example configuration.

FIG. 26 is a circuit configuration diagram showing one example of the shift register circuit section applicable to the source driver related to the example configuration.

Figure 27:
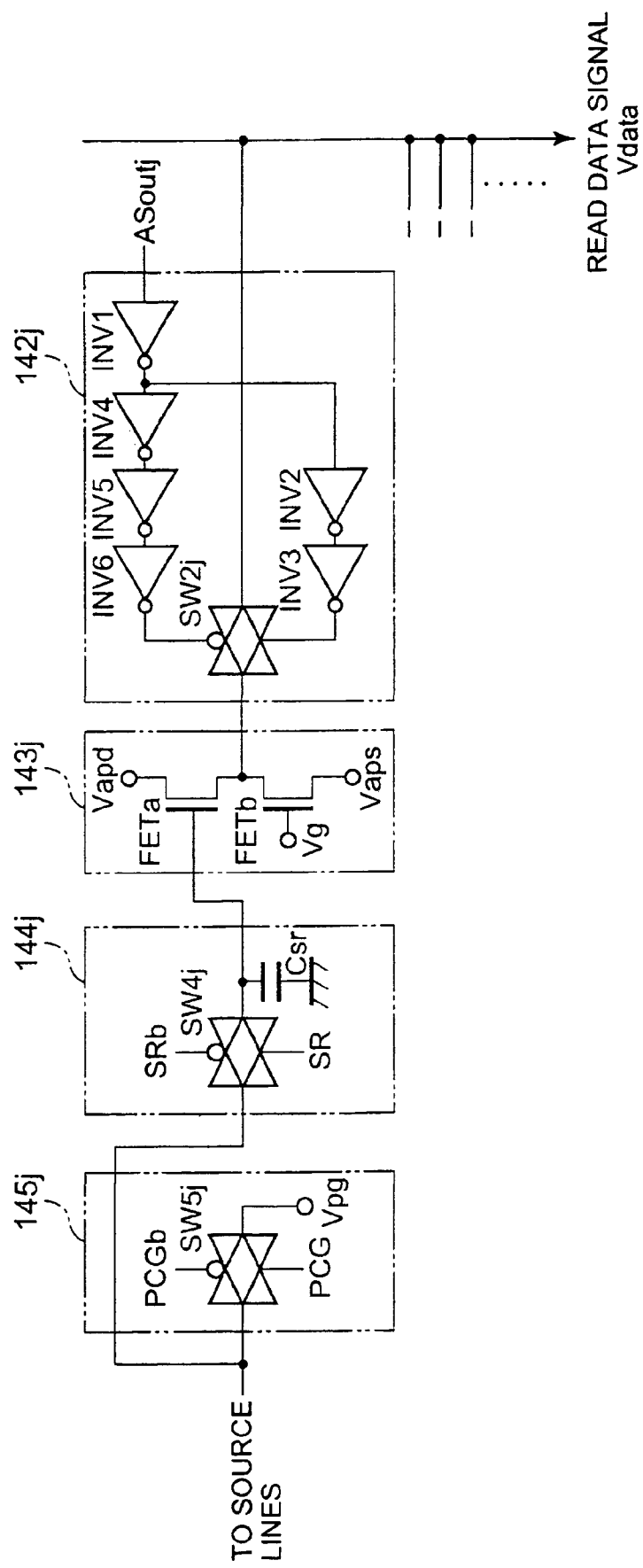
FIG. 27 is a circuit configuration diagram showing an example of a precharge circuit section, a sampling circuit section, a source follower circuit section and a parallel-serial conversion circuit section applicable to the source driver related to the example configuration.

FIG. 27 is a circuit configuration diagram showing an example of a precharge circuit section, a sampling circuit section, a source follower circuit section and a parallel-serial conversion circuit section applicable to the source driver related to the example configuration.

Referring now to FIG. 24 and FIG. 25, a source driver 140 in regard to the first example configuration has a structure comprising at least a shift register circuit section 141, a precharge circuit section 145, a sampling circuit section 144, a source follower circuit section 143 and a parallel-serial conversion circuit section 142. The shift register circuit section 141 outputs the shift signals ASout1, Asout2, . . . ASoutm (logic signals; timing signal) corresponding to each the source lines 113 while sequentially shifting a start signal based on the control signals (a start signal STs, two phases of a reference clock signal ACK, ACKb, an output enable signal OEs, etc.) supplied from the system controller 150. The precharge circuit section 145 (precharge control section) comprises a switch group which simultaneously applies predetermined precharge pulses (the precharge voltage Vpg) to each of the source lines 113 at timing based on the precharge signals Øpg in the precharge period mentioned above. The sampling circuit section 144 (voltage storage section) comprises a switch group which reads in parallel the source line voltage VD (data voltage Vrd) corresponding to the carriers stored in each of the photosensors PS (reading pixels) via each of the source lines 113 and a capacitative element group which holds this source line voltage VD. The source follower circuit section 143 comprises an amplifier group which amplifies the source line voltage VD maintained in the above-mentioned capacitative element group at a predetermined signal level. The parallel-serial conversion circuit section 142 (signal conversion section) comprises a switch group which serially extracts the data voltage outputted from the source follower circuit section 143 and transforms into a serial signal which is outputted as the read data signal Vdata at timing based on the shift signals ASout1, Asout2, . . . ASoutm sequentially outputted from the above-mentioned shift register circuit section 141.

The shift register circuit section 141, as shown in FIG. 26 for example, has a configuration comprising a multistage latch circuit group and an output logic circuit group. The multistage latch circuit group (latch circuits LCA1, LCA2, . . . LCAa, LCAb) sequentially shifts to the following stage upon the start signal STs inputted at predetermined timing based on the reference clock signal ACK, ACKb and set corresponding to the number (that line number +2) of the source lines 113. The output logic circuit group (3-Input NAND circuits NANDA1, NANDA2, . . . NANDAm) controls the extraction of the shift signal from each of the latch circuits LCA1, LCA2, . . . LCAa, LCAb) and outputs to the parallel-serial conversion circuit section 142 based on the output enable signal OEs.

Here, as the latch circuit group and the output logic circuit group have a configuration equivalent (refer to FIG. 22, FIG. 23) to the latch circuit group and the output logic circuit group comprising the shift register circuit section 121 applicable to each other of the top gate driver 120A or the bottom gate driver 130, explanation concerning the detailed circuit configuration is omitted.

In the shift register circuit section 141, as the start signal STs is inputted into the input contact in the latch circuits LCA1 from the system controller 150 and as the start signal STs shifts in succession each of the latch circuits LCA1, LCA2, . . . LCAa, LCAb at predetermined timing based on the reference clock signal ACK, ACKb, the shift signals outputted from the latch circuits LCAj (LCA1, LCA2, . . . LCAm) for the j-th stage are input into the $1^{st}$ input contact of the 3-Input NAND circuits NANDAi (NANDA1, NANDA2, . . . NANDAm) for the j-th stage. Also, the shift signals outputted from the latch circuits LCA(j+1) (LCA2, LCA3, . . . LCAa) for the (j+1)-th stage are inputted into the $3^{rd}$ input contact of the 3-Input NAND circuits NANDAj (NANDA1, NAND A2, . . . NANDAm) for the (j+1)-th stage.

Here, each of the shift signals outputted from the latch circuits LCAj and LCA(j+1) for the j-th stage and the (j+1)-th stage are high-level. When a high-level output enable signal OEs is inputted into the $2^{nd}$ input contact of the 3-Input NAND circuits NANDAj (NANDA1, NANDA2, . . . NANDAm) for the j-th stage, low-level logic signals Soutj (ASout1, Asou2, . . . ASoutm) are outputted to the parallel-serial conversion circuit section 142 from the 3-Input NAND circuits NANDAj. Thereby, the source line voltage VD (data voltage Vrd) will be extracted in time-shared sequences from the 15 row to the last row of the source lines 113, transformed into a serial signal and outputted as the read data signal Vdata.

Furthermore, the precharge circuit section 145, the sampling circuit section 144, the source follower circuit section 143 and the parallel-serial conversion circuit section 142 have a circuit configuration for example as shown in FIG. 27 corresponding to each of the source lines 113.

Specifically, the precharge circuit section 145 (145j) provided in the source lines 113 for the j-th rows comprises an analog switch SW5j which performs "ON/OFF" operations at timing in which a high-level precharge signals Øpg is supplied and outputs the precharge voltage Vpg as precharge pulses to the source lines 113 based on the precharge signals Øpg (non-inverted signal PCG and inverted signal PCGb; non-reversal processing and reversal processing) supplied from the system controller 150.

Moreover, referring to FIG. 27, the sampling circuit section 144 (144j) comprises an analog switch SW4j and a condenser CSr. The analog switch SW4j performs "ON/OFF" operations based on the sampling signals Øsr (non-inverted signal SR and inverted signal SRb) supplied from the system controller 150. The condenser CSr (capacitor) is connected on one end to the output contact of the analog switch SW4j and the other end is connected to ground potential. Thus, at timing in which a high-level sampling signal Øsr is supplied, the source line voltage VD corresponding to the carriers stored in the photosensors PS is taken in via the source lines 113 and held as the voltage component in the condenser CSr.

Next, as shown in FIG. 27, the source follower circuit section 143 (143j) has a circuit configuration of the field effect transistors FETa, FETb connected in series between the high voltage Vapd and the low voltage Vaps. The signal level is amplified by a predetermined amplification factor and generated corresponding to the voltage component (source line voltage VD) held in the condenser Csr set in the above-mentioned sampling circuit section 144j.

Referring to FIG. 27, the parallel-serial conversion circuit section 142 (142j) comprises an inverter group INV1~INV3, an inverter group INV1, INV4~INV6 and an analog switch SW2j. The inverter group INV1~INV3 performs reversal processing of the logic signals ASoutj (shift signal) outputted from the shift register circuit section 141 mentioned above. The inverter group INV1, INV4~INV6 performs non-reversal processing of these logic signals ASoutj. The analog switch SW2j performs an "ON/OFF" operations based on the logic signals ASoutj (non-inverted signals and inverted signals). Thus, at timing in which a low-level of the logic signals ASoutj is supplied, the data voltage outputted from the above-mentioned source follower circuit section 143j is outputted as the read data signal Vdata.

According to the source driver 140 which has such a configuration, based on the sampling signal Øsr supplied from the system controller 150, the source line voltage VD is extracted in batches and held via each of the source lines 113 from the $1^{st}$ row to the last row. Then, based on the logic signals ASoutj sequentially outputted from the shift register circuit section 141, the source line voltage VD is transformed into a serial signal and outputted as the read data signal Vdata.

Next, the second example configuration of the source driver applicable to the image processor related to the example application will be explained.

Figure 28:
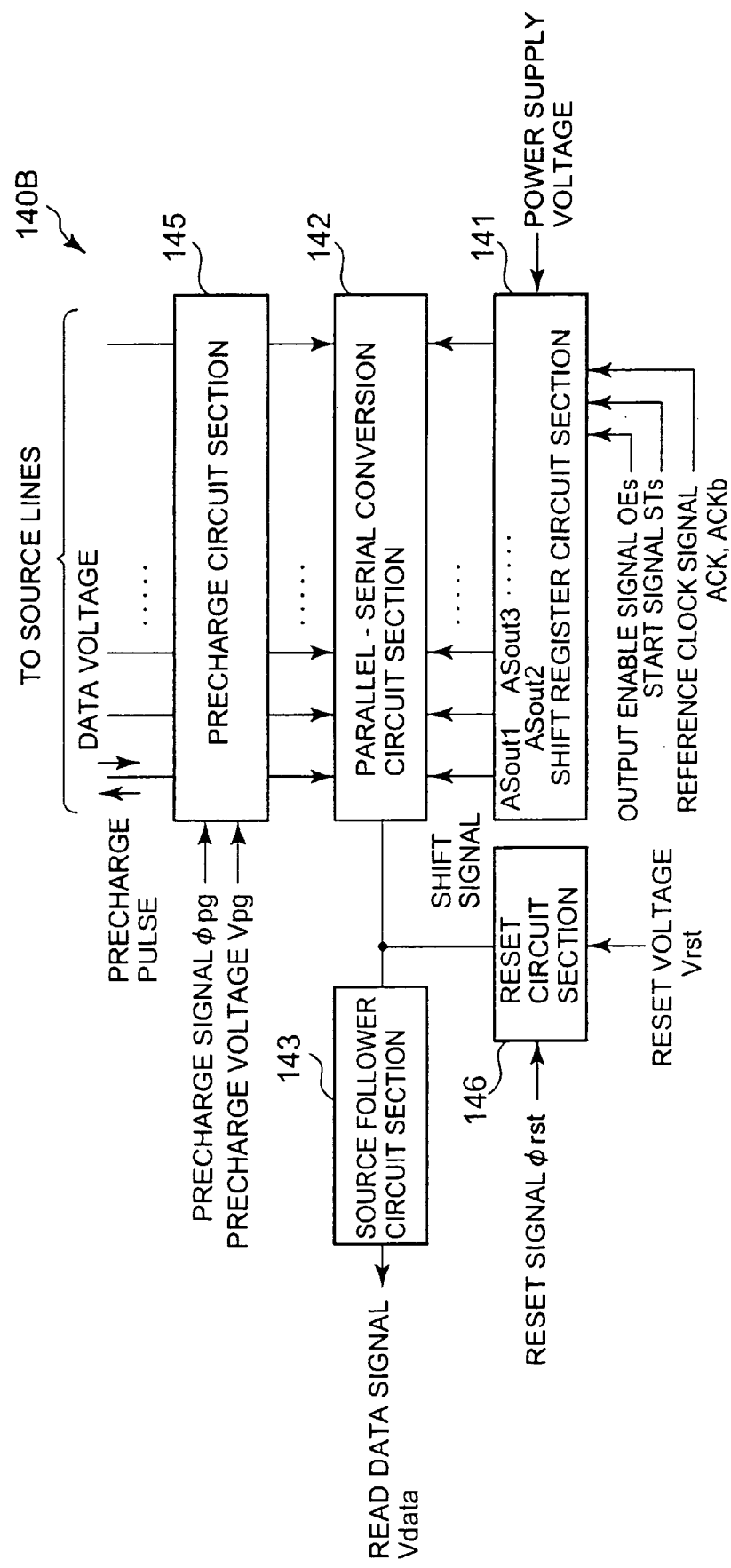
FIG. 28 is a schematic block diagram showing the second example configuration of the source driver applicable to the image processor related to the example application.

FIG. 28 is a schematic block diagram showing the second example configuration of the source driver applicable to the image processor related to the example application.

Figure 29:
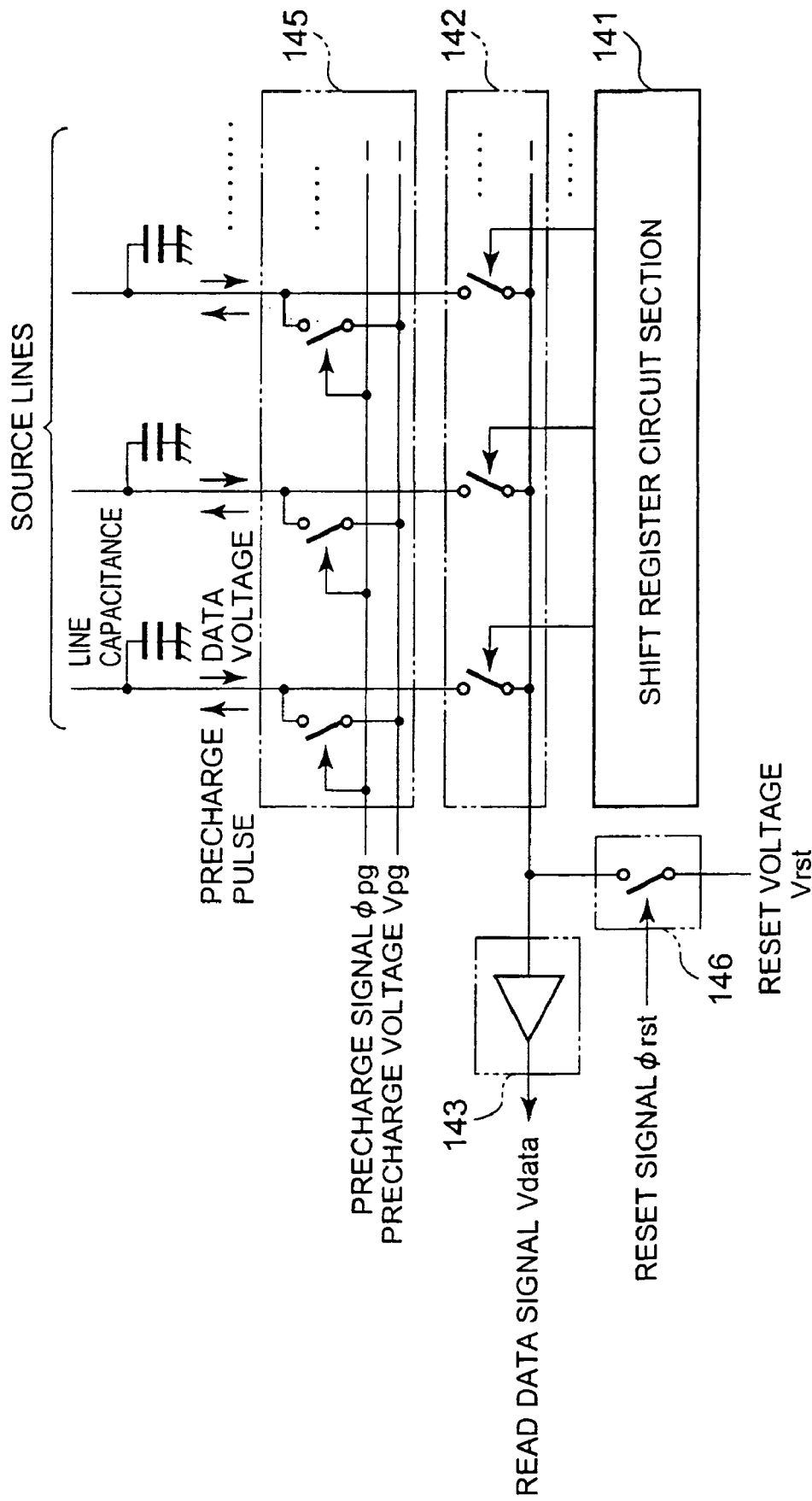
FIG. 29 is a circuit conceptual diagram for explaining the function of the source driver related to the example configuration.

FIG. 29 is a circuit conceptual diagram for explaining the function of the source driver related to the example configuration.

Figure 30:
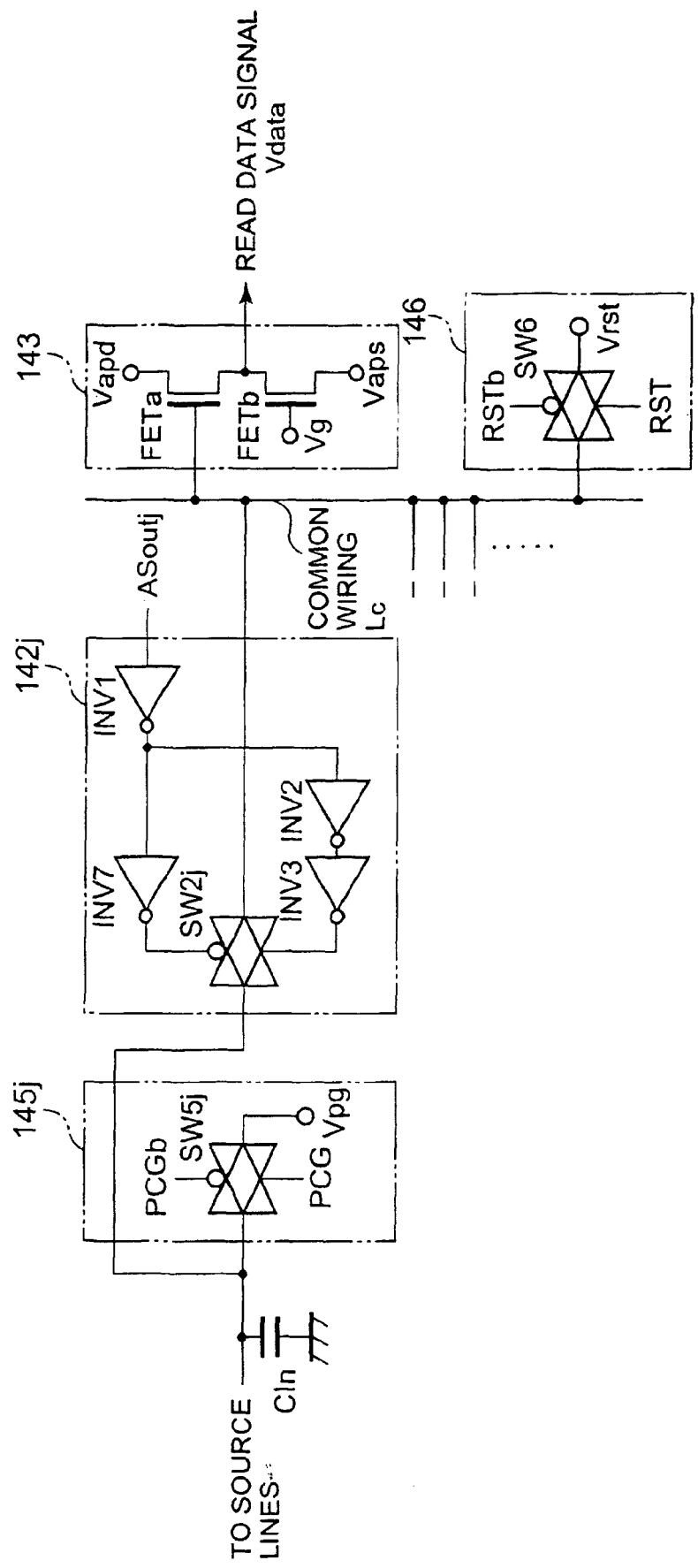
FIG. 30 is a circuit configuration diagram showing an example of the precharge circuit section, the parallel-serial conversion circuit section, the source follower circuit section and a reset circuit section applicable to the source driver related to the example configuration.

FIG. 30 is a circuit configuration diagram showing an example of the precharge circuit section, the parallel-serial conversion circuit section, the source follower circuit section and a reset circuit section applicable to the source driver related to the example configuration.

Here, with respect to any configuration equivalent to the source driver related to the first example configuration described above, the equivalent or same nomenclature is appended and further detailed explanation is abbreviated or omitted.

Referring to FIG. 28 and FIG. 29, the source driver 140B concerning the second example configuration has a configuration comprising a shift register circuit section 141, a precharge circuit section 145, a parallel-serial conversion circuit section 142, a source follower circuit section 143 and a reset circuit section 146. The shift register circuit section 141 and the precharge circuit section 145 (precharge control section) have a configuration equivalent to the source driver 140A related to the first example configuration described above. The parallel-serial conversion circuit section 142 (signal conversion section) comprises a switch group which serially extracts and transforms into a serial signal at timing based on the shift signals ASout1, ASout2, . . . ASoutm (logic signals; timing signal) from the shift register circuit section 141. The source line voltage VD (data voltage Vrd) is held (or parasitic) in the line capacitor (voltage storage portion) formed in each of the source lines 113 corresponding to the carriers and stored in each of the photosensors PS (reading pixels) in the read-out period mentioned above. The source follower circuit section 143 amplifies this serial signal to a predetermined signal level and outputs as the read data signal Vdata. The reset circuit section 146 comprises a switch which resets at predetermined timing (initialization) the signal level of the above-stated serial signal outputted from the parallel-serial conversion circuit section 142.

Here, since the shift register circuit section 141 is equivalent to the circuit configuration shown in the source driver 140A related to the first example configuration, further explanation is omitted.

Additionally, the precharge circuit section 145 and the parallel-serial conversion circuit section 142 also have a circuit configuration as illustrated in the source driver 140A related to the first example configuration corresponding to each of the source lines 113 (refer to FIG. 27) and similarly, for example, the circuit configuration as shown in FIG. 30 is applicable. Furthermore, as for the source follower circuit section 143 and the reset circuit section 146, for example, a configuration comprising each other of only the circuit structure as shown in FIG. 30 is applicable. Specifically, in the precharge circuit section 145 (145j) provided in the source lines 113 for the j-th rows, at timing in which the high-level precharge signals Øpg (the non-inverted signal PCG and the inverted signal PCGb) are supplied, the analog switch SW5j performs an "ON" operation and outputs precharge pulses (precharge voltage Vpg) corresponding to the source lines 113.

Also, in the parallel-serial conversion circuit section 142 (142j), at timing in which a low-level logic signals ASout (shift signals) are supplied from the above-mentioned shift register circuit section 141, the analog switch SW2j performs an "ON" operation by the inverter group INV1~3 and the inverter group INV1, INV7. The source line voltage VD stored in the line capacitor Cln provided in each of the source lines 113 is then extracted and outputted to the source follower circuit section 143.

Besides, the source follower circuit section 143 as shown in FIG. 30 has the same circuit configuration as illustrated in the source driver 140A related to the first example configuration. Namely, the circuit arrangement is connected in series with the field effect transistors FETa, FETb between the high voltage Vapd and the low voltage Vapg. Based on the shift signals ASoutj (logic signals) supplied from the shift register circuit section 141 via the parallel-serial conversion circuit section 142 (142j), the signal level of the source line voltage VD is sequentially inputted and read as a serial signal for each of the source lines, amplified by a predetermined amplification factor and outputted as the read data signal Vdata.

Furthermore, as shown in FIG. 30, the reset circuit section 146 comprises an analog switch SW6 which is electrically connected with a common wiring Lc by which the source line voltage VD is transmitted and sequentially inputted into the source follower circuit section 143 from the parallel-serial conversion circuit section 142 (142j) set corresponding to each of the source lines 113. Based on a reset signals Ørst (non-inverted signal RST and inverted signal RSTb) supplied from the system controller 150, the analog switch SW6 performs an "OFF" operation at timing in which a high-level reset signal Ørst is supplied whereby a reset voltage Vrst is outputted to the common wiring LC and the signal level of the common wiring Lc is initialized.

According to the source driver 140B which has such a configuration and after the read-out period mentioned above, the source line voltage VD (data voltage Vrd) is held in the line capacitor Cln provided in each of the source lines 113. At timing based on the shift signals (logic signals) sequentially outputted from the shift register circuit section 141, the source line voltage VD is sequentially read from the $1^{st}$ row to the last row, transformed into a serial signal and outputted as the read data signal Vdata via the single source follower circuit section 143.

Next, the image processor element structure concerning the example application in relation to the transistor array described in each embodiment mentioned above will be explained.

The photosensor array 110 and each of the driver circuits (top gate driver 120A, bottom gate driver 130 and source driver 140) in the configuration of the image processor related to the example application mentioned above, for example, the element structure and manufacturing method as illustrated in the third and fourth embodiments mentioned above are favorably applicable.

Specifically, on the surface side of a single insulating substrate SUB, the photosensor array 110 is configured with a plurality of the photosensors PS arranged in a matrix form as shown in FIG. 18 which have a double-gate thin-film transistor structure using an amorphous silicon semiconductor layer in substantially the central area of the substrate SUB. The thin-film transistors (field effect transistors FETp, FETn mentioned above) using a low-temperature polysilicon semiconductor layer are in adjacent areas bordering the formation areas of this photosensor array 110 (photosensors PS). The top gate driver 120A, the bottom gate driver 130 or the source driver 140 are connected so as to comprise a predetermined circuit form as shown in FIG. 21~FIG. 27. In addition, the above described photosensor array 110 is configured in one unit.

Furthermore, as for the photosensors PS and driver circuits, at least, the polysilicon semiconductor layer used for the field effect transistors FETp, FETn which constitutes the above-mentioned driver circuits have a structure formed in the lower layer side (substrate SUB side) more inferior to the amorphous silicon semiconductor layer used for the photosensors PS.

Here, the thin-film transistor configuration of the photosensors PS (double-gate type photosensors) and each of the driver circuits may be fabricated in a stand-alone manufacturing process without mutually sharing the electrode formation layer as shown in the third embodiment described above.

As shown in the fourth embodiment, at least a portion of the conductor layer (for example, the bottom gate electrodes and gate electrodes) can be formed in the identical electrode formation layer and can be simultaneously fabricated in the same manufacturing process.

In this manner, by applying the transistor array element structure and the manufacturing method related to the present invention mentioned above to the image processor related to the example application, on a single insulating substrate SUB the field effect transistors which constitute the photosensors PS (double-gate type photosensors) and each of the driver circuits that constitutes the photosensor array 110 can be formed in one unit on the single substrate SUB.

Consequently, even if the image processor related to the example application is applied to a fingerprint reader, etc. whereby an object is directly placed on the detection surface of photosensor array, as the uppermost surface of the photosensor array and these periphery driver circuits are formed evenly, an object firmly placed on the detection surface can be excellently read and recognized. Thus, peripheral circuitry can be situated in one unit adjoined to the photosensor array. Accordingly, an image processor which can favorably interpret an imaged object can be achieved, as well as the device size can be miniaturized.

Based on the element structure and manufacturing method related to the embodiments, at least, the low-temperature polysilicon semiconductor layer used for the field effect transistors FETp, FETn in the configuration of each driver circuit is formed in a lower layer more inferior than the amorphous silicon semiconductor layer configuration of the photosensors PS.

In the sequence of manufacturing processes illustrated in each embodiment stated above, since the processes which fabricate the amorphous silicon semiconductor layer are applied after fabricating the low-temperature polysilicon semiconductor layer, each element characteristic of the field effect transistors FETp, FETn and the photosensors PS (double-gate type photosensors) can be excellently maintained and an image processor with enhanced operating characteristics can be actualized.

In addition, if the element structure shown in the fourth embodiment is applied, wherein the configuration is formed with at least a portion of the conductor layer (the gate electrode and the bottom gate electrode) of the field effect transistors FETp, FETn and the photosensors PS in the same electrode formation layer (shared layer) which constitutes each of the driver circuits, that conductor layer can be simultaneously fabricated in the same process. In this manner, the manufacturing process can be made less complicated, the manufacturing equipment simplified and ultimately result in lowered production costs.

Next, a drive control method suitable for the image processor concerning this first example application will be explained with reference to the drawings.

The drive control method in such an image processor applies the drive control method fundamentally shown in FIG. 19. By sequentially executing a processing cycle which consists of a reset operation→charge storage operation and precharge operation→read-out operation at predetermined timing relative to each row of the photosensor PS clusters and repeating these sequential operation processes relative to each of the rows, the image data for one screen can be read as luminosity data (a object of a two-dimensional image; for example, a fingerprint pattern).

Here, as also shown in the timing diagram of FIG. 19 of the respective voltage levels, for example, the outputted reset pulses ØTi, the precharge pulses Øpg outputted from the source driver 140 and the read-out pulses ØBi generated and outputted by the bottom gate driver 130 are set to have the following voltage ranges. Specifically, as shown in FIG. 8 the photosensors PS have a double-gate thin-film transistor structure which contains the block insulating layer 54 composed of silicon nitride film, etc. between the top gate electrode TGx and the semiconductor layer 51. In order to release the carriers stored in the semiconductor layer 51, the photosensors PS need to be initialized (reset) by applying the reset pulses ØTi at a relatively high voltage amplitude (for example, voltage amplitude of 30V consists of a high-level side of +15V and a low-level side of −15V) to the top gate electrode TGx. Therefore, a measure for applying, etc. a high withstand driver or high voltage drive power supply is required.

In the image processor related to the example application as mentioned previously, the field effect transistors which constitute each circuit section (analog switch, logic circuit, etc.) as applied to the top gate driver 120A, the bottom gate driver 130 and the source driver 140B are made of thin-film transistors using a semiconductor layer which are all composed of low-temperature polysilicon (hereinafter, "low-temperature polysilicon thin-film transistors"). Also, these drivers have a configuration formed in one unit on an insulating substrate containing the photosensor array 110.

As is generally known, low-temperature polysilicon thin-film transistors have a relatively high "ON" current state as well as their electron mobility being relatively high. Although a driver having relatively excellent operating speed is achievable, their withstand voltage is relative low. In this regard, the reset pulses ØTi mentioned above having voltage amplitude of a number of tens of V (volts), thus sustaining that voltage cannot be tolerated and component functional failure may occur.

Consequently, in the embodiments an image reading operation can be executed at relatively excellent operating speed without producing element with stand related failures, etc. even if the driver utilizes low-temperature polysilicon thin-film transistors by applying the following driver control method.

Figure 31:
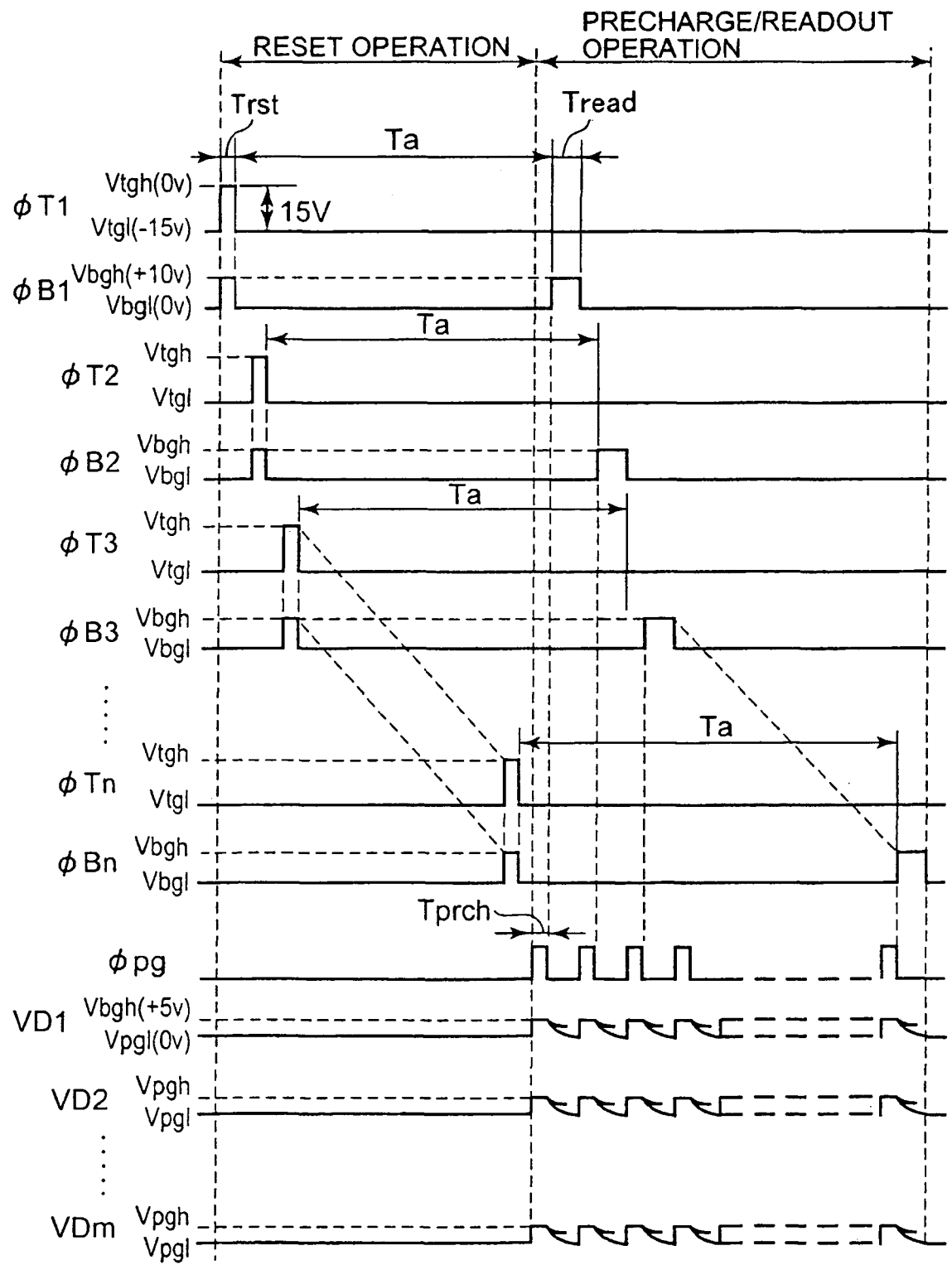
FIG. 31 is a timing diagram showing an example of the drive control method applicable to the image processor related to the example application.

FIG. 31 is a timing diagram showing an example of the drive control method applicable to the image processor related to the example application.

Here, as the drive control method of the image processor (photosensor array), unlike the technique of repeating a sequence of operation processes for each row consisting of a "reset operation→charge storage operation→precharge operation→read-out" stated above, initially a reset operation for each row is sequentially executed. After the charge storage period has elapsed, subsequently the precharge operation is accomplished to the photosensor PS rows and the drive control method for executing the read-out operation will now be described.

The drive control method applicable to the image processor related to the embodiments as shown in FIG. 31, first executes a reset operation (reset period Trst). As the sequential scanning signals ØT1, ØT2, . . . ØTn (reset pulses) are applied to the top gate lines 111 for each row by the top gate driver 120A, the sequential scanning signals ØB1, ØB2, . . . ØBn (reset pulses) are applied to the bottom gate lines 112 for specified rows by the bottom gate driver 130 in accordance with (synchronized) the applied period of the specified sequential scanning signals ØT1, ØT2, . . . ØTn and the photosensor PS clusters for each row are initialized ($1^{st}$ step). Specifically, predetermined sequential scanning signals ØTi and ØBi are simultaneously applied to the top gate terminals TG and the bottom gate terminals BG of the photosensors PG for the same rows.

Here, as for the sequential scanning signals ØT1, ØT2, . . . ØTn for example, the signal level Vtgh for the high-level side is set to 0V and the signal level Vtgl for the low-level side is −15V. Also, as for the sequential scanning signals ØB1, ØB2, . . . ØBn, for example, the signal level Vbgh set for the high-level side is +10V and the signal level Vbgl for the low-level side is 0V.

Thus, in the reset period Trst mentioned above, by synchronously applying a high-level (0V) of the sequential scanning signals ØT1, ØT2, . . . ØTn and a high-level (+10V) of the sequential scanning signals ØB1, ØB2, . . . ØBn to the photosensors PS, an electric potential difference is induced in the photosensors PS semiconductor layer 11. An operation equivalent to an ordinary carrier release operation (specifically, the reset operation shown in FIG. 19) which serves this purpose in the reset operation can be implemented.

Secondly, by discontinuing synchronization of the sequential scanning signals ØT1, ØT2, . . . ØTn and the sequential scanning signals ØB1, ØB2, . . . ØBn, the reset period Trst terminates and the charge storage period Ta for each row commences corresponding to the light volume which enters from the top gate electrode TGx side of the photosensors PS. The carrier (electron-hole) induced is stored in the semiconductor layer 51 (channel region). Here, by the source driver 140 (precharge circuit section 145) as shown in FIG. 15, a charge storage period Ta in parallel with a precharge period Tprch is commenced by sequentially applying the precharge pulses Øpg. Accordingly, the precharge operation is executed ($2^{nd}$ step) which applies the precharge voltage Vpg to the source lines 113 and causes predetermined voltage to be held in the source electrode of the photosensors PS. As for the precharge voltage Vpg, for example, the signal level Vpgh set for the high-level side is +5V and the signal level Vpgl for the low-level side is 0V.

Subsequently, the charge storage period Ta and the precharge period Tprch are terminated. A read-out period Tread commences ($3^{rd}$ step) which applies the sequential scanning signals ØB1, ØB2, . . . ØBn (read-out pulses) for each of the rows by the bottom gate driver 130 relative to the photosensors PS. Furthermore, conversion of the source line voltage VD (data voltage Vrd) corresponding to the carrier (electron-hole) stored in the semiconductor layer 51 of each of the photosensors PS in the charge storage period Ta is read (4' step) via the source lines 113.

Here, the sequential scanning signals ØB1, ØB2, . . . ØBn (read-out pulses) are like the scanning signals (reset pulses) applied in the reset operation mentioned above, for example, the signal level Vbgh set for the high-level side is +10V and the signal level Vbgl for the low-level side is 0V.

In addition, with regard to the detection method of the luminosity data (brightness and darkness information) corresponding to the shade pattern of an object, by detecting the voltage value after a read-out period Tread has elapsed of each source line voltage VD (data voltage Vrd), for example, like the basic control method (refer to FIG. 19) mentioned above, the amount of light which enters into the photosensors PS is transformed into luminosity data (namely, the read data signal Vdata).

In this manner, based on the drive control method applicable to the image processor related to the embodiments, in the reset period Trst with the pulse voltage (sequential scanning signals ØTi and ØBi, especially, forward-bias voltage by the sequential scanning signals ØBi) applied synchronizing with each of the top gate terminals TG and the bottom gate terminals BG, a predetermined electric potential difference can be induced in the semiconductor layer 51 of the photosensors PS. An operation equivalent to the carrier release operation of the mentioned basic drive control method (refer to FIG. 19) in the reset operation can be implemented.

Consequently, an excellent reset operation is feasible by lowering (for example, +15V→0V) the signal level of the pulse voltage (reset pulse voltage Vtg) applied to the top gate terminals TG in comparison with the above-mentioned basic drive control method (refer to FIG. 19) of reducing the voltage amplitude (for example, 30V→15V). Even if it is a case which applies functional devices with relatively low withstand voltage such a slow-temperature polysilicon thin-film transistors, etc. which are constituted in the peripheral circuitry (particularly, the top gate driver 120A) of the photosensor array 110, an image reading operation can be executed with relatively excellent operating speed without producing element withstand failures, etc. Also, the drive power supply of the driver can also be lower voltage.

Accordingly, as the photosensor array and peripheral circuitry (each driver) which constitute an image processor can be formed in one unit on a single insulating substrate in this configuration, the protective circuitry, etc. for preventing withstand failures, etc. is omissible. Furthermore, like in a fingerprint reader in the case where a detectable object is directly placed on the detection surface upon the photosensor array, the present invention has a flush detection surface (photosensor array) and its peripheral circuitry is completely flat. Thus, protrusion of the driver integrated circuit (IC) chips as shown in the conventional prior art is eliminated, as well as an imaged object can be more remarkably read and recognized. Moreover, since the photosensor array can accommodate adjoining peripheral circuitry situated in one unit, the circuit configuration wiring connection structure can be simplified to further miniaturization and a reduction in product cost can be promoted.

In addition, as the photosensor array and the peripheral circuitry are formed in one unit on a single insulating substrate, it is not necessary to separately arrange the driver IC chips for exclusive use corresponding to the technical specifications of the photosensor array. Moreover, the number of components and manufacturing processes can be reduced and accurate functional inspections of the image processor can be conducted easily. Still further, because the high voltage pulse is no longer directly applied to the photosensors, deterioration of the element characteristics of the photosensors, occurrences of faulty insulation between wiring, etc. can be controlled and a more reliable image processor can be produced.

Also, in the embodiment although the technique in which the scanning signal is applied to the top gate terminal synchronizing with the scanning signal applied to the bottom gate terminal in the reset period is explained, the present invention is not limited to this. Briefly, when scanning signals (bias voltage) are applied to the bottom gate terminals during the period in which the scanning signals are applied to the top gate terminals in the reset period, the same effect of the reset operation can be acquired.

In this instance, the decline voltage amplitude reduction effect in the scanning signals is applied to the above-stated top gate terminals so that the pulse width of the scanning signals applied to the bottom gate terminals is limited in comparison with the pulse width of the scanning signals applied to the top gate terminals. An equivalent scanning signal pulse width applied to the top gate terminals and bottom gate terminals is preferred.

Second Example Application

Next, the second example application of the transistor array related to the present invention stated above will be explained in detail with reference to the drawings.

Figure 32:
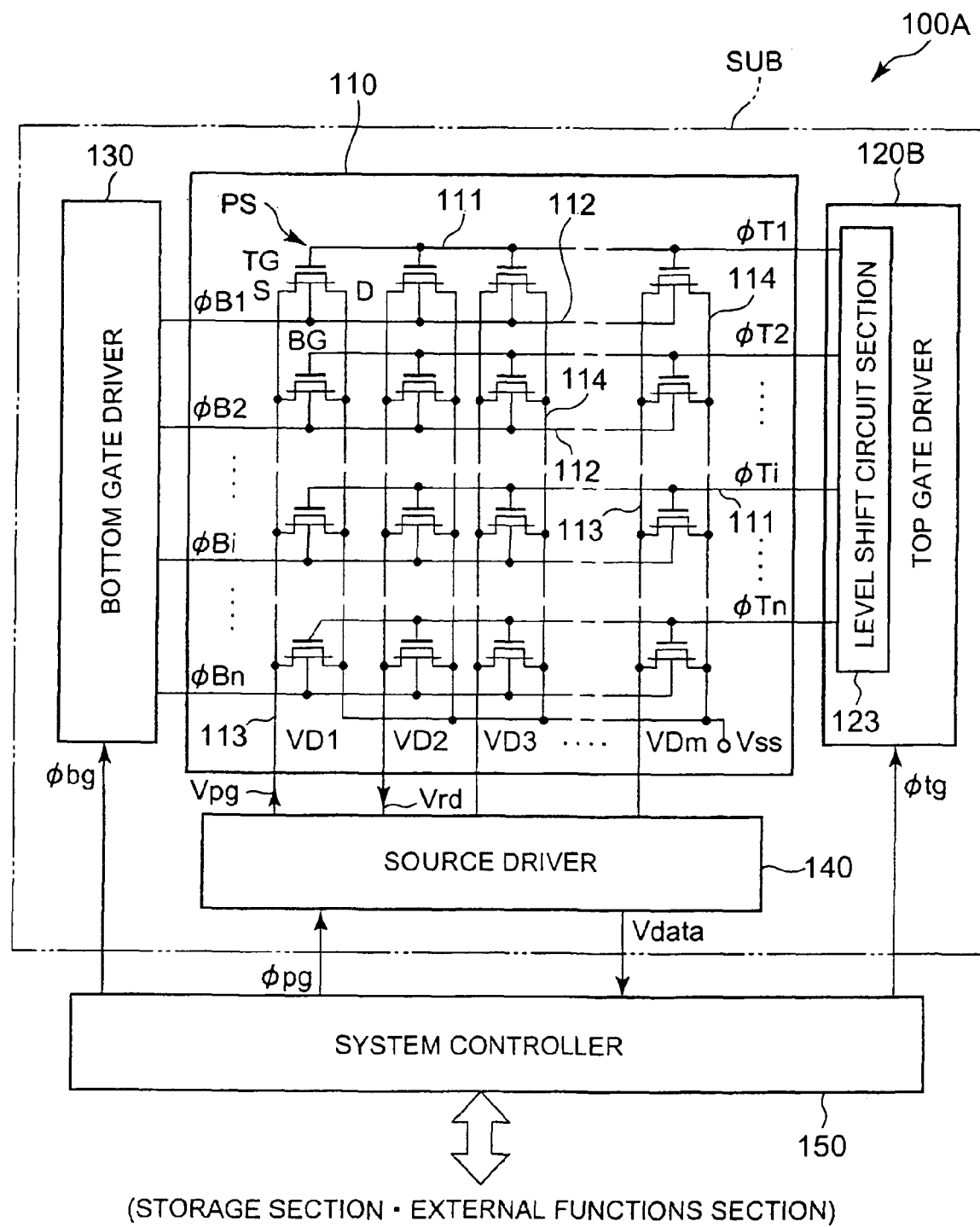
FIG. 32 is an entire outline configuration diagram showing the second example case of applying the transistor array to the image processor related to the present invention.

FIG. 32 is an entire outline configuration diagram showing the second example case of applying the transistor array to the image processor related to the present invention.

Here, with respect to any configuration equivalent to the first example application described above, the equivalent or same nomenclature is appended and further detailed explanation is abbreviated or omitted.

In the first example application mentioned above, the photosensors have double-gate thin-film transistors with driver circuits (a top gate driver, a bottom gate driver and a source driver) formed in adjacent areas of the photosensor array which is a two-dimensional array. Although the case of using a characteristic drive control method applicable in the image processor constituted with polysilicon thin-film transistors having that configuration is described, in the second example application, the top gate driver formed in adjacent areas of the photosensor array comprises an output section (level shift circuit section described later) configured with the application of field effect transistors using a semiconductor layer composed of amorphous silicon (amorphous silicon thin-film transistor). Accordingly, an image reading operation can be executed in the image processor related to the example application using the basic drive control method (FIG. 19) in that condition.

Specifically, an image processor 100B as applied to the example application as shown in FIG. 32, has a configuration comprising the photosensor array 110 which has the same configuration (refer to FIG. 18) as the first example application described above, the bottom gate driver 130 ($2^{nd}$ scanning driver means), the source driver 140 (signal driver means), the system controller 150 and in addition, a top gate driver 120B ($1^{st}$ scanning driver circuit) comprising a level shift circuit section 123 composed of amorphous silicon thin-film transistors with a direct connection to the top gate lines 111.

Then, also in this example application like the first example application, on the surface side of the insulating substrate SUB which is constituted by a single insulating glass substrate, etc., has the element structure of the previously stated embodiments of the photosensor array 110 containing the top gate driver 120B, the bottom gate driver 130, the source driver 140 formed in one unit.

Specifically, the photosensors PS that are arranged in the photosensor array 110 have a double-gate thin-film transistor structure using an amorphous silicon semiconductor layer. On the other hand, each driver circuit of the bottom gate driver 130 and the source driver 140 is configured with low-temperature polysilicon transistors. Furthermore, the top gate driver 120B has a configuration comprising at least the level shift circuit section 123 configured with low-temperature polysilicon transistors. In addition, other than the circuit section of the level shift circuit section 123 in the top gate driver 120B, the configuration may have a configuration of low-temperature polysilicon thin-film transistors or a configuration which includes low-temperature polysilicon thin-film transistors and amorphous silicon thin-film transistors.

In the following, the feature characteristic of the example application of the top gate driver will be explained in detail.

Figure 33:
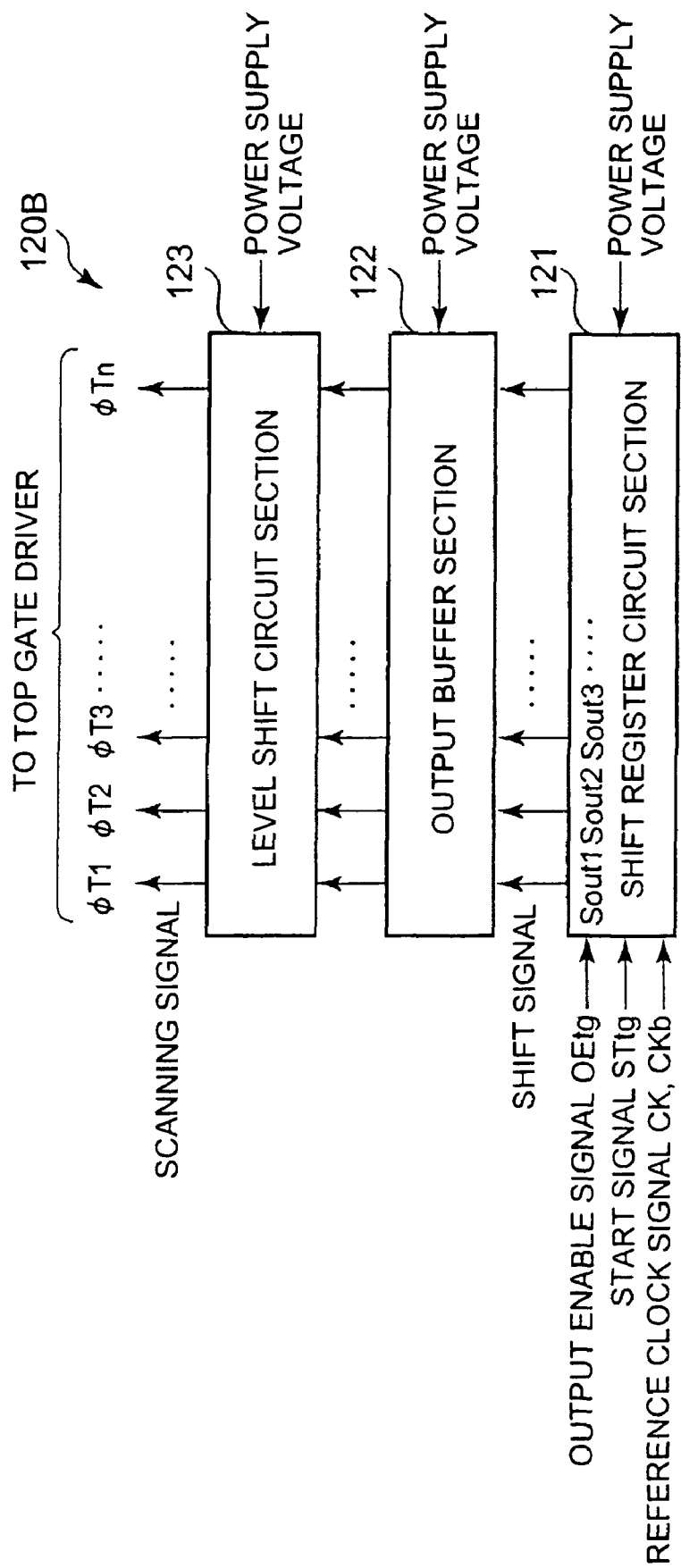
FIG. 33 is a schematic block diagram showing one example configuration of the top gate driver applicable to the image processor related to the example application.

FIG. 33 is a schematic block diagram showing one example configuration of the top gate driver applicable to the image processor related to the example application.

Figure 34:
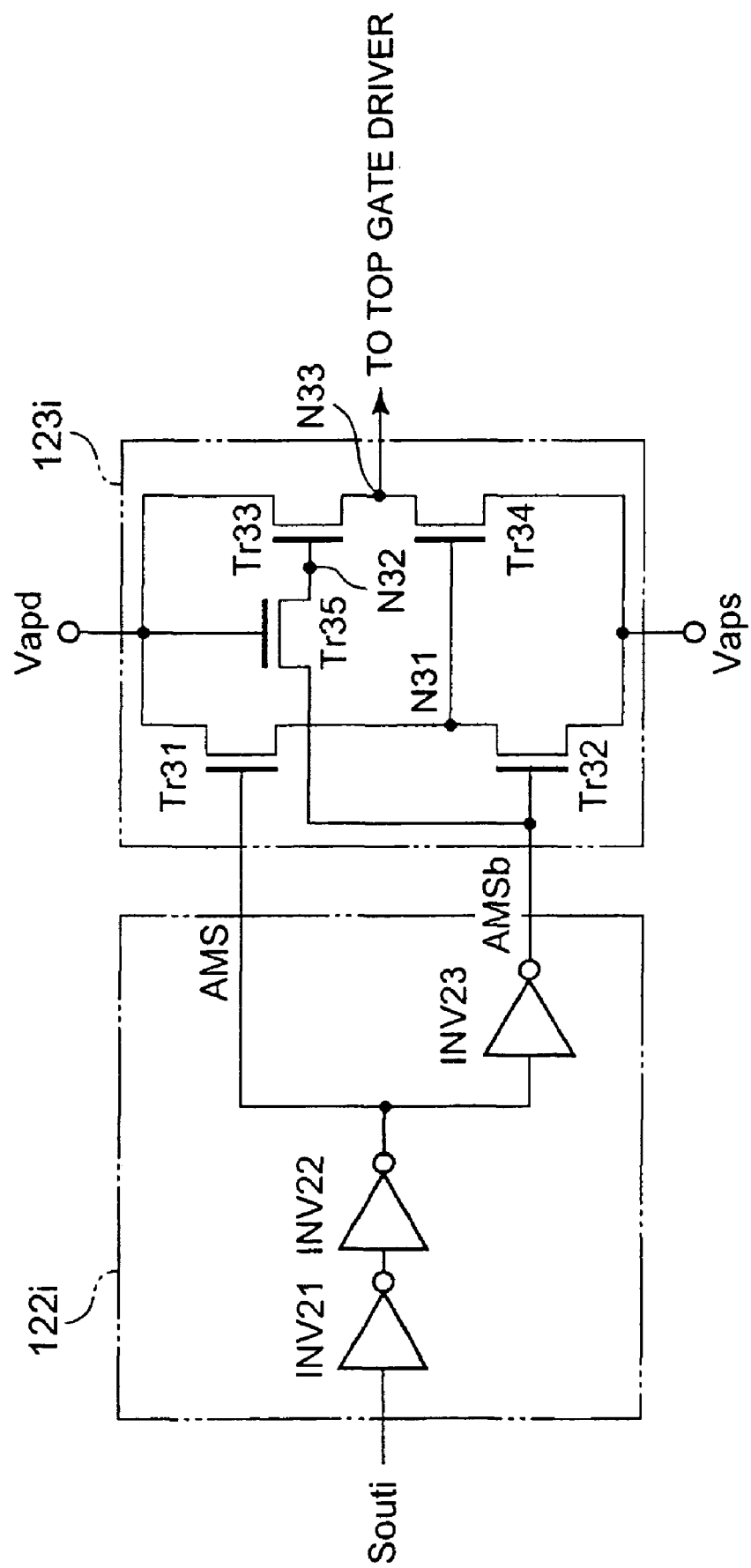
FIG. 34 is a circuit configuration diagram showing one example of the output buffer section and a level shift circuit section applicable to the top gate driver related to the example configuration.

FIG. 34 is a circuit configuration diagram showing one example of the output buffer section and a level shift circuit section applicable to the top gate driver related to the example configuration.

Here, with respect to any configuration equivalent to the first example application described above, the equivalent or same nomenclature is appended and further detailed explanation is abbreviated or omitted.

Referring now to FIG. 33, the top gate driver 120B configuration comprises a shift register circuit section 121, an output buffer section 122 and a level shift circuit section 123. The shift register circuit section 121 has a circuit configuration (refer to FIG. 22) equivalent to the first example stated above. The output buffer section 122 (output circuit section) functions as a previous stage amplifying means which amplifies to a predetermined signal level the shift signals (logic signals; timing signal) sequentially outputted from this shift register circuit section 121. The level shift circuit section 123 (output circuit section) functions as a subsequent stage amplifying means which transforms the amplified signals outputted from the output buffer section 122 into signals which have predetermined voltage amplitude (signal amplification level shift) and applies them to each of the top gate lines as the sequential scanning signals ØT1, ØT2 . . . ØTn (reset pulse).

Here, since the shift register circuit section 121 is equivalent to the circuit configuration shown in the first example application, further explanation is omitted. Also, as shown in FIG. 34 the output buffer section 122 (122i) comprises an inverter group INV21, INV22 and an inverter group INV21~INV23. The inverter group INV21~INV22 performs non-reversal processing of the logic signals Souti (shift signals) outputted from the above-mentioned shift register circuit section 121 corresponding to the top gate lines 111 for each row. The inverter group INV21~INV23 performs reversal processing of the aforesaid logic signals Souti. An amplified signal AMS which constitutes a non-inverted signal (non-reversed) of the logic signals Souti at timing in which a low-level of the logic signals Souti is supplied. An amplified signal AMSb functions as an inverted signal (reversed signal) of the logic signals Souti when generated and outputs to the level shift circuit section 123.

Additionally, the level shift circuit section 123 (123i), as shown in FIG. 34 for example, has a configuration comprising an N-channel type field effect transistor Tr31 (thin-film transistor) (hereinafter denoted as "Nch transistor"), Nch transistor Tr32, Nch transistor Tr35, Nch transistor Tr33, and Nch transistor Tr34. The Nch transistor Tr31 current path (source-drain terminals) is connected between the high voltage Vapd ($1^{st}$ power supply voltage) and a contact N31, along with the amplified signal AMS ($2^{nd}$ input signal) which functions as a non-inverted signal of the logic signals Souti, is applied to the control terminal (gate terminal). The Nch transistor Tr32 current path is connected between the contact N31 and the low voltage Vaps ($2^{nd}$ power supply voltage) along with the amplified signal AMSb which functions as an inverted signal of the logic signals Souti ($1^{st}$ input signal), is applied to the control terminal. The Nch transistor Tr35 current path is connected between a contact (control terminal of Nch transistor Tr32) and a contact N32 to which the amplified signal AMSb is supplied along with the high voltage Vapd applied to the control terminal. The Nch transistor Tr33 current path is connected between the high voltage Vapd and a contact N33 (output contact) along with the control terminal, is connected to the contact N32. The Nch transistor Tr34 current path is connected between with the contact N33 between the low voltage Vaps along with the control terminal connected to the contact N31. Here, in between the contact N32 and the contact N33, the parasitic capacitance (capacitative element; condenser/capacitor) between the gate-source of Nch transistor Tr33 is omitted from the drawing.

Specifically, in the level shift circuit section 123i related to the embodiment, the Nch transistors Tr31 and Tr32 are connected in series between the high voltage Vapd and the low voltage Vaps, as well as the amplified signal AMS from the output buffer section 122i to the Nch Transistor Tr31. Furthermore, the structure of the input stage inverter circuit is configured so that the amplified signal AMSb composed of an inverted signal of the amplified signal AMS can be simultaneously applied to the Nch transistor Tr32. The Nch transistor Tr33 and Nch transistor Tr34 are connected in series between the high voltage Vapd and the low voltage Vaps, as well as the electric potential of the contact N32 to the Nch transistor Tr33. Also, the composition of the output stage inverter group is configured so that the electric potential ($3^{rd}$ input signal which is the output potential of the input stage inverter circuit and composed of an inverted signal of the amplified signal AMSb) of the contact N31 can be simultaneously applied to Nch transistor Tr34.

Here, each of the Nch transistor Tr31~Tr35 are all amorphous silicon thin-film transistors.

Next, the operation of the level shift circuit section for the top gate driver having the above-mentioned configuration will be explained.

FIG. 35 is a simulation result showing conversion of the signal voltage in each terminal and contact of the level shift circuit section related to the example configuration.

Here, in the top gate driver 120B described above, a case is illustrated in which as the power supply voltage is supplied to the level shift circuit section 123 at least is set to the high voltage Vapd of +15V and the low voltage Vaps of −18V. The amplified signals AMS and AMSb having voltage amplitude ($1^{st}$ voltage amplitude) of 0~15V are inputted from the output buffer section 122 (122i) which are then transformed into signals having voltage amplitude ($2^{nd}$ voltage amplitude) of −15V~+15V by the above-stated level shift circuit section 123 (123i) and applied to the top gate lines 111 for the i-th rows as the sequential scanning signals ØTi (reset pulses).

Initially, as for the top gate driver 120B shown in FIG. 33 and FIG. 34, when a low-level of the logic signals Souti is supplied to the output buffer section 122i as shift signals from the shift register circuit section 121, a low-level (=0V) of the amplified signal AMS and a high-level (=+15V) of the amplified signal AMSb are inputted into the input stage inverter circuit of the level shift circuit section 123i. As a result, the Nch transistor Tr32 performs an "ON" operation and the Nch transistor Tr31 performs an "OFF" operation. Accordingly as shown in FIG. 35, though the electric potential Vn31 at the contact N31 composes voltage higher than the low voltage Vaps (=−18V) by way of only the continuity condition of the Nch transistor Tr32 ("ON" resistance), the electric potential is set as a low-level having sufficiently low signal voltage (generally, −13V).

Conversely, when a high-level of the logic signals Souti is supplied from the shift register circuit section 121, a low-level (=0V) of the amplified signal AMSb and a high-level (=+15V) of the amplified signal AMS are inputted into the input stage of the level shift circuit section 123i. As a result, the Nch transistor Tr31 performs an "ON" operation and the Nch transistor Tr32 performs an "OFF" operation. Accordingly, the electric potential Vn31 at the contact N31 is set by way of only the continuity condition of the Nch transistor Tr31 as a high-level having electric potential lower than the high voltage Vapd (=+15V).

Here, as for the circuit characteristics of the amorphous silicon transistors applied to the field effect transistors, since the continuity resistance of the Nch transistor Tr31 connected to the high voltage Vapd side is relatively high and troublesome to set lower, while the electric potential Vn31 at the contact N31 is a high-level as shown in FIG. 35 generally only about +3~+4V can be obtained.

Next, in the output stage inverter circuit, when the output voltage (electric potential Vn31 at the contact N31) of the above-mentioned input stage inverter circuit changes to a high-level (generally, +3~+4V), the Nch transistor Tr34 performs an "ON" operation. The electric potential at the contact N33 (top gate lines 111) by way of only the continuity resistance of the Nch transistor Tr34 is set within the preferred signal level (preferred voltage amplitude of −15~+15V; −15V is minimum voltage side; low-level) which is voltage higher than the voltage Vaps (=−18V).

Here, in the output stage inverter circuit, the amplified signal AMSb applied to the gate terminal (contact N32) of the Nch transistor Tr33 via the Nch transistor Tr35 is an "ON" state constantly with the high voltage Vapd (=+15V). At timing (when the amplified signal AMSb constitutes low-level) during which the electric potential Vn31 at contact N31 constitutes a high-level as shown in FIG. 35, the electric potential Vn32 at the contact N32 is set to a low-level of generally 0V.

Accordingly, the potential difference induced between the contact N32 and the contact N33 is held as the voltage component in the parasitic capacitance (condenser/capacitor) between the gate-source of the Nch transistor Tr33. Also, as for the electric charge held in the parasitic capacitance, since migration is impeded by the continuity resistance of the Nch transistor Tr35, the voltage component corresponding relative to the above-stated potential difference is satisfactorily held in the parasitic capacitance.

On the other hand, when the output voltage (electric potential Vn31 at the contact N31) in the above-mentioned input stage inverter circuit changes to a low-level (generally, −13V), the Nch transistor Tr34 performs an "OFF" operation and a high-level (+15V) of the amplified signal AMSb is applied to the gate terminal (contact N32) of the Nch transistor Tr33 and the Nch transistor Tr33 performs an "ON" operation. The electric potential at the contact N33 (top gate lines 111) by way of only the continuity resistance of the Nch transistor Tr33 is applied at a voltage lower than lower than the voltage Vapd (=+15V).

Here, at the gate terminal (contact N32) of Nch transistor Tr33 with the upswing of the electric potential at the contact N33, as shown in FIG. 35, the voltage (generally, 25~27V) generated (bootstrap phenomenon) by the potential difference corresponding to the voltage component held in the above-stated parasitic capacitance is added to the electric potential of this contact N33. Since Nch transistor Tr33 performs an "ON" operation by way of a saturation state, the sufficiently high signal level (namely, preferred voltage amplitude −15V~+15V; +13~+14V approximately the maximum voltage side; high-level) which approximates the electric potential at the contact N33 (top gate lines 111) high voltage Vapd (=+15V) is acquired.

Thus, the level shift circuit section 123 as applied to the top gate driver 120B related to the example configuration containing two stages of inverter circuits. The signal level of one stage (high-level) applied to the output stage inverter circuit is boosted using a using a bootstrap circuit section (the parasitic capacitance formed between the gate-source of Nch transistor Tr35 and Nch transistor Tr33). Even if it is the case that the high-level side signal level outputted from the input stage inverter circuit is low, the high-level side of the signal level outputted from the output stage inverter circuit can be sufficiently high.

Furthermore, the configuration of the bootstrap circuit section of the level shift circuit section 123 is formed in the top gate driver 120B in the example configuration. Although the case (refer to FIG. 34) of applying a parasitic capacitance between the gate-source of the Nch transistor Tr33 is explained, the present invention is not restricted to this. In addition to this parasitic capacitance, between the above-stated gate-source (between the contact N32 and the contact N33), a configuration which connects even more optional capacitative elements (condensers/capacitors) can be applied. Also, in the level shift circuit section 123, although only the case of applying N-channel type field effect transistors is explained, the present invention is also not limited to this. A configuration of applying P-channel type field effect transistors may be applied.

Next, the element structure of the image processor with reference to the transistor array illustrated in each of the embodiments above related to the example application will be explained.

The photosensor array 110 and each of the driver circuits (top gate driver 120B, bottom gate driver 130, source driver 140) configuration of the image processor related to the example application explained above, for example, the element structure and manufacturing method as shown in the fifth embodiment or sixth embodiment mentioned above are excellently applicable.

Specifically, on the surface side of a single insulating substrate SUB like the first example application described above, the photosensor array 110 configuration has a plurality of the photosensors PS arranged in matrix form having a double-gate type thin-film transistor structure using an amorphous silicon semiconductor layer in substantially the central area of this substrate SUB. This photosensor array 110 (photosensors PS) comprises thin-film transistors (field effect transistors FETp, FETn mentioned above) using a low-temperature polysilicon layer in bordering adjacent areas. The bottom gate driver 130 or the source driver 140 are connected so as to have a predetermined circuit form as shown in FIG. 21~FIG. 29. Particularly in the example application, the thin-film transistors (the field effect transistors FETx mentioned above) using an amorphous silicon layer are formed in adjacent areas which adjoin the above-stated photosensor array 110. The level shift circuit section 123 of the top gate driver 120B is connected so as to have a predetermined circuit form as shown in FIG. 33 and FIG. 34, and furthermore, the thin-film transistors (the field effect transistors FETp, FETn mentioned above) use a low-temperature polysilicon semiconductor layer for the regions which adjoin the level shift circuit section 123. The shift register circuit section 121 of the top gate driver 120B and the output buffer section 122 are connected so as to have a predetermined circuit form as shown in FIG. 22, FIG. 33 and FIG. 34. Also, these photosensor arrays 110 and each of the driver circuits are one another formed in one unit on the above-state substrate SUB.

Also, in such photosensors PS and driver circuits, the polysilicon semiconductor layer used for the field effect transistors FETp, FETn comprises at least the above-mentioned driver circuits (except for the level shift circuit section 123 of the top gate driver 120B) and has a configuration formed in a lower layer side (substrate SUB side) more inferior than the amorphous silicon semiconductor layer used for the photosensors PS and the level shift circuit section 123 of the top gate driver 120B.

Here, the photosensors PS and the level shift circuit section 123 of the top gate driver 120B, the thin-film transistors which comprise each driver circuit (except for the level shift circuit section 123 of the top gate driver 120B) may be formed in an independent manufacturing process without mutually sharing a conductor layer, as shown in the fifth embodiment mentioned above. As shown in the sixth embodiment, at least a portion of the conductor layer (for example, the gate electrode Gx of the field effect transistors FETx applied to the bottom gate electrode BGx and the level shift circuit section 123 of the photosensors PS; and the gate electrode Gp, Gn of the field effect transistors FETp, FETn applied to each driver circuit except the level shift circuit section 123) may be formed in the same conductor layer and simultaneously fabricated in the same manufacturing process.

Thus, by applying the element structure and the manufacturing method of the transistor array related to the present invention described above to the image processor related to the example application, the image processor's operating characteristics of the photosensor array and the driver circuits can be excellently maintained, an image object can favorably be interpreted, the device size can be miniaturized, as well as the number of components and manufacturing processes can be reduced.

Moreover, when the output section of the top gate driver 120B has at least the level shift circuit section 123 is comprised with the application of the field effect transistors (amorphous silicon thin-film transistors) using an amorphous silicon semiconductor layer, and the shift register circuit section 121 or the output buffer section 122 is comprised with the application of the field effect transistors (polysilicon thin-film transistors) using a polysilicon semiconductor layer, since the "ON" current flow in polysilicon thin-film transistors is relatively high and the electron mobility is relatively high, circuit operation such as signal generation, etc. can be performed relatively fast. On the other hand, in the level shift circuit section 123 of the output section, since amorphous silicon thin-film transistors having relatively high withstand voltage characteristics are applied, a scanning signal having relatively high voltage amplitude is satisfactorily generable. In this manner, the proper operating speed can be actualized in the entire top gate driver 120B. Since the scanning signals (reset pulses ØTi mentioned above having voltage amplitude of a number of tens of V (volts)) having an appropriate voltage range can be favorably generated and applied to the top gate lines 111, without producing element failures, the basic drive control method (refer to FIG. 19) mentioned above can be directly applied as it is and an image processor with favorable operating characteristics and high reliability can be produced.

In each example application described above, the photosensor array is composed of a two-dimensional array comprising double-gate type photosensors using an amorphous silicon semiconductor layer and the driver circuits contain only field effect transistors using a low-temperature polysilicon semiconductor layer, or a driver circuit which applies field effect transistors using an amorphous silicon layer only for the output section, and these explained in the image processor is formed in one unit on a single substrate. However, the present invention is not limited like this application to an image processor.

The transistor array related to the present invention may be applied to an image display device (image processor) of common knowledge equipped with the driver circuits (a scanning driver, a data driver, a power supply driver, etc.) controlled to supply a predetermined gradation signal to the display pixels and to display desired image information.

While the present invention has been described with reference to the preferred embodiments, it is intended that the invention be not limited by any of the details of the description therein but includes all the embodiments which fall within the scope of the appended claims.

What is claimed is:

1. A transistor array formed on a single insulating substrate comprising:
   a plurality of layers which are contacted and laminated directly to one another on an insulating layer for semiconductor layer formation provided on an entire surface of the substrate, said plurality of layers including a plurality of semiconductor layers, a plurality of conductor layers, and a plurality of insulating layers;
   wherein the plurality of semiconductor layers include a first semiconductor layer which is composed of polysilicon, and a second semiconductor layer which is composed of amorphous silicon and which is formed above the first semiconductor layer such that the first semiconductor layer is between the substrate and the second semiconductor layer;
   a driver circuit which comprises polysilicon thin-film transistors using the first semiconductor layer and amorphous silicon thin-film transistors using the second semiconductor layer; and
   a pixel array including a plurality of pixels arrayed two-dimensionally on the substrate;
   wherein the driver circuit operates each pixel by a preferred drive state;
   wherein the driver circuit comprises an output circuit section which generates and outputs a drive control signal having a predetermined signal level to the pixels; and
   wherein the output circuit section has a circuit section portion which generates the drive control signal and which includes only the amorphous silicon thin-film transistors as transistors.

* * * * *